US009837521B2

(12) United States Patent
Yamamoto et al.

(10) Patent No.: US 9,837,521 B2
(45) Date of Patent: Dec. 5, 2017

(54) NITRIDE SEMICONDUCTOR DEVICE AND FABRICATION METHOD THEREFOR

(71) Applicant: ROHM CO., LTD., Kyoto-shi, Kyoto (JP)

(72) Inventors: Kenji Yamamoto, Kyoto (JP); Tetsuya Fujiwara, Kyoto (JP); Minoru Akutsu, Kyoto (JP); Ken Nakahara, Kyoto (JP); Norikazu Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 12 days.

(21) Appl. No.: 14/434,674

(22) PCT Filed: Oct. 7, 2013

(86) PCT No.: PCT/JP2013/077233
§ 371 (c)(1),
(2) Date: Apr. 9, 2015

(87) PCT Pub. No.: WO2014/057906
PCT Pub. Date: Apr. 17, 2014

(65) Prior Publication Data
US 2015/0279982 A1  Oct. 1, 2015

(30) Foreign Application Priority Data

Oct. 11, 2012 (JP) .................................. 2012-226256
Dec. 13, 2012 (JP) .................................. 2012-272725

(51) Int. Cl.
*H01L 29/423* (2006.01)
*H01L 29/778* (2006.01)
(Continued)

(52) U.S. Cl.
CPC ...... *H01L 29/7787* (2013.01); *H01L 21/0228* (2013.01); *H01L 21/02241* (2013.01);
(Continued)

(58) Field of Classification Search
CPC ........... H01L 29/4236; H01L 29/42368; H01L 29/7787; H01L 29/42352
See application file for complete search history.

(56) References Cited

U.S. PATENT DOCUMENTS 9,230,799 B2 * 1/2016 Teramoto .......... H01L 21/02164
2004/0183090 A1 * 9/2004 Kitaoka .................. C30B 25/02
257/103
(Continued)

FOREIGN PATENT DOCUMENTS

JP    2007150106 A    6/2007
JP    2008-235740     10/2008
(Continued)

OTHER PUBLICATIONS

International Search Report, dated Nov. 19, 2013; PCT/JP2013/077233 (3 pages).
(Continued)

*Primary Examiner* — Phat X Cao
(74) *Attorney, Agent, or Firm* — Hamre, Schumann, Mueller & Larson, P.C.

(57) ABSTRACT

A nitride semiconductor device includes an electron transit layer (103) that is formed of a nitride semiconductor, an electron supply layer (104) that is formed on the electron transit layer (103), that is formed of a nitride semiconductor whose composition is different from the electron transit layer (103) and that has a recess (109) which reaches the electron transit layer (103) from a surface, a thermal oxide film (111) that is formed on the surface of the electron transit layer (103) exposed within the recess (109), a gate insulating film (110) that is embedded within the recess (109) so as to be in contact with the thermal oxide film (111), a gate electrode (108) that is formed on the gate insulating film (110) and that is opposite to the electron transit layer (103) across the thermal oxide film (111) and the gate insulating
(Continued)

film (110), and a source electrode (106) and a drain electrode (107) that are provided on the electron supply layer (104) at an interval such that the gate electrode (108) intervenes therebetween.

39 Claims, 32 Drawing Sheets

(51) Int. Cl.
    *H01L 29/66*     (2006.01)
    *H01L 29/78*     (2006.01)
    *H01L 21/02*     (2006.01)
    *H01L 21/306*     (2006.01)
    *H01L 21/28*     (2006.01)
    *H01L 29/417*     (2006.01)
    *H01L 21/265*     (2006.01)
    *H01L 21/311*     (2006.01)
    *H01L 29/51*     (2006.01)
    *H01L 29/20*     (2006.01)
(52) U.S. Cl.
    CPC .. *H01L 21/02255* (2013.01); *H01L 21/02694* (2013.01); *H01L 21/2654* (2013.01); *H01L 21/26586* (2013.01); *H01L 21/28264* (2013.01); *H01L 21/30621* (2013.01); *H01L 21/31116* (2013.01); *H01L 29/41725* (2013.01); *H01L 29/41758* (2013.01); *H01L 29/4236* (2013.01); *H01L 29/42316* (2013.01); *H01L 29/42368* (2013.01); *H01L 29/51* (2013.01); *H01L 29/66462* (2013.01); *H01L 29/66522* (2013.01); *H01L 29/78* (2013.01); H01L 29/2003 (2013.01); H01L 29/513 (2013.01); H01L 29/517 (2013.01)

(56) References Cited

U.S. PATENT DOCUMENTS

| | | |
|---|---|---|
| 2011/0316050 A1 | 12/2011 | Bito |
| 2012/0211761 A1 | 8/2012 | Yamada |
| 2013/0292700 A1 | 11/2013 | Teramoto et al. |
| 2014/0084300 A1* | 3/2014 | Okamoto ............ H01L 29/2003 257/76 |

FOREIGN PATENT DOCUMENTS

| | | | |
|---|---|---|---|
| JP | 2008270836 A | 11/2008 | |
| JP | 2010-10584 | 1/2010 | |
| JP | 2010-278333 | 12/2010 | |
| JP | 2011-171440 | 9/2011 | |
| JP | 2011-187643 | 9/2011 | |
| JP | 2012-9594 | 1/2012 | |
| JP | 2012-156245 | 8/2012 | |
| JP | WO 2012/102237 A1 * | 8/2012 | ............ H01L 29/78 |
| JP | 2012-174875 | 9/2012 | |

OTHER PUBLICATIONS

Office Action issued for corresponding Japanese Patent Application No. 2014-540837, dated Jun. 22, 2017, 4 pages.

* cited by examiner

Ids-Vds characteristics.

Transfer characteristics.

3-terminal off-state characteristics.

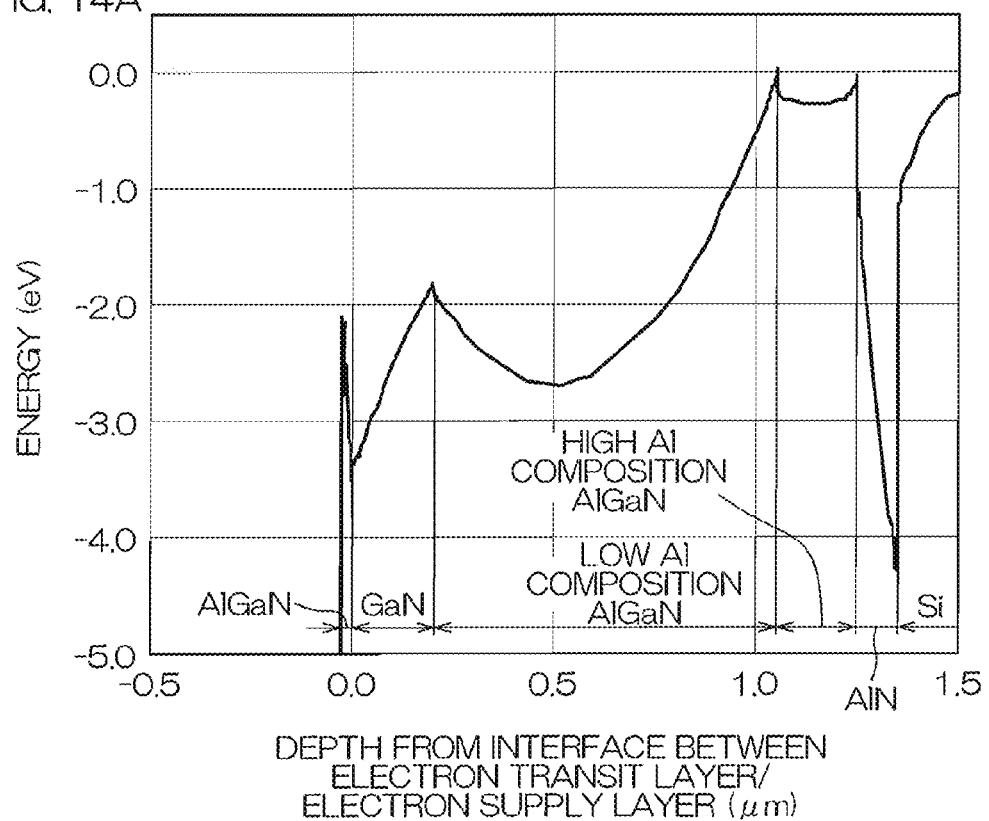

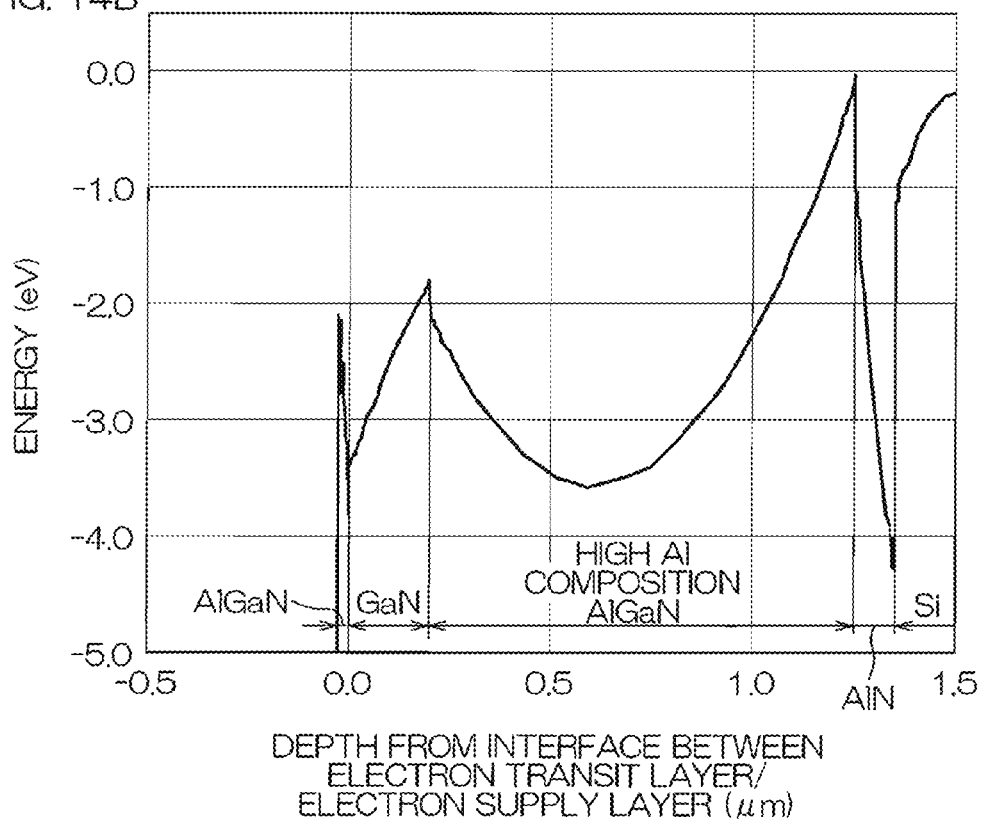

FIG. 15A  0.1 μm THICK GaN
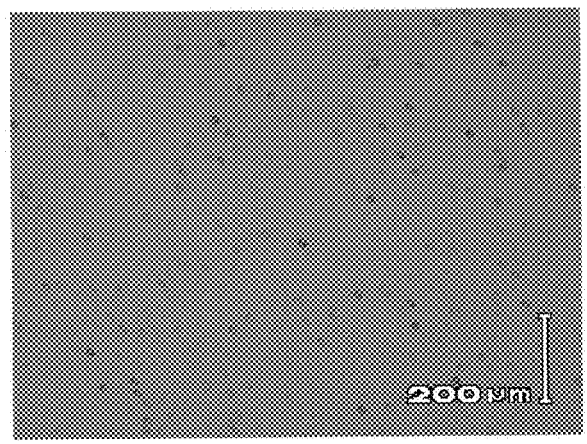
FIG. 15B  0.4 μm THICK GaN
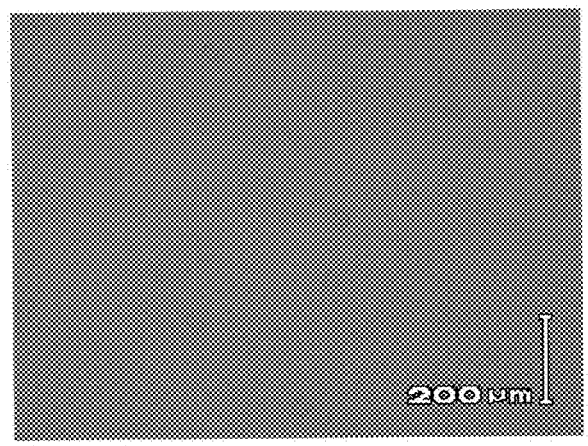
FIG. 15C  1.0 μm THICK GaN
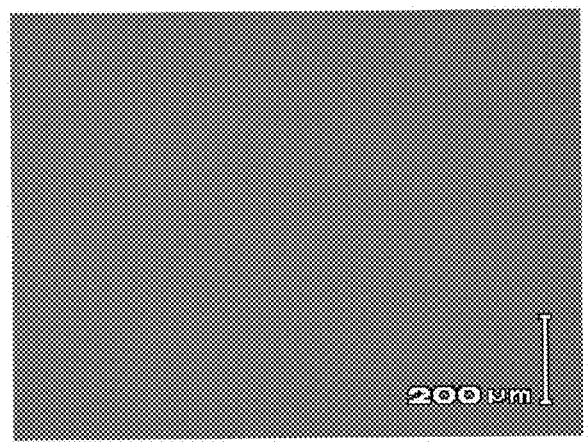

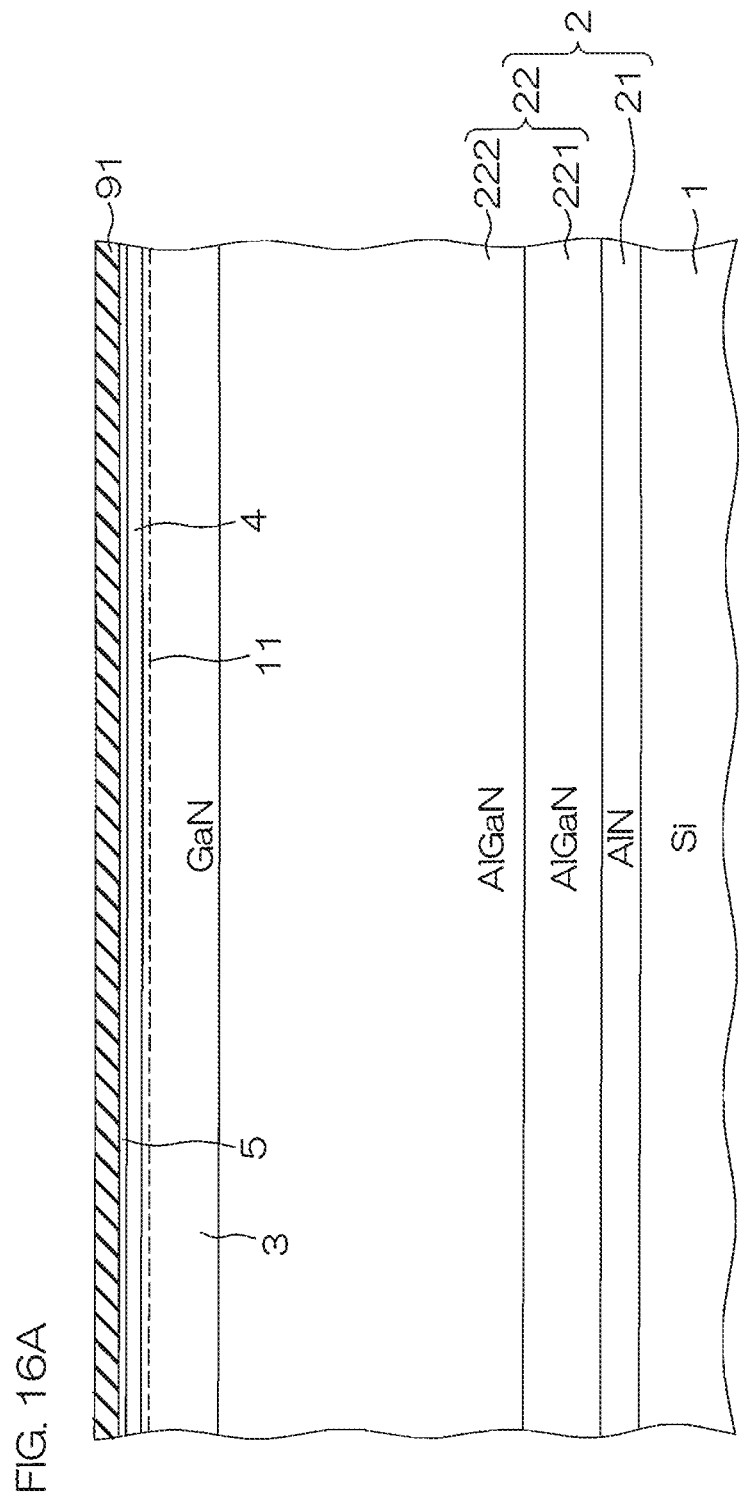

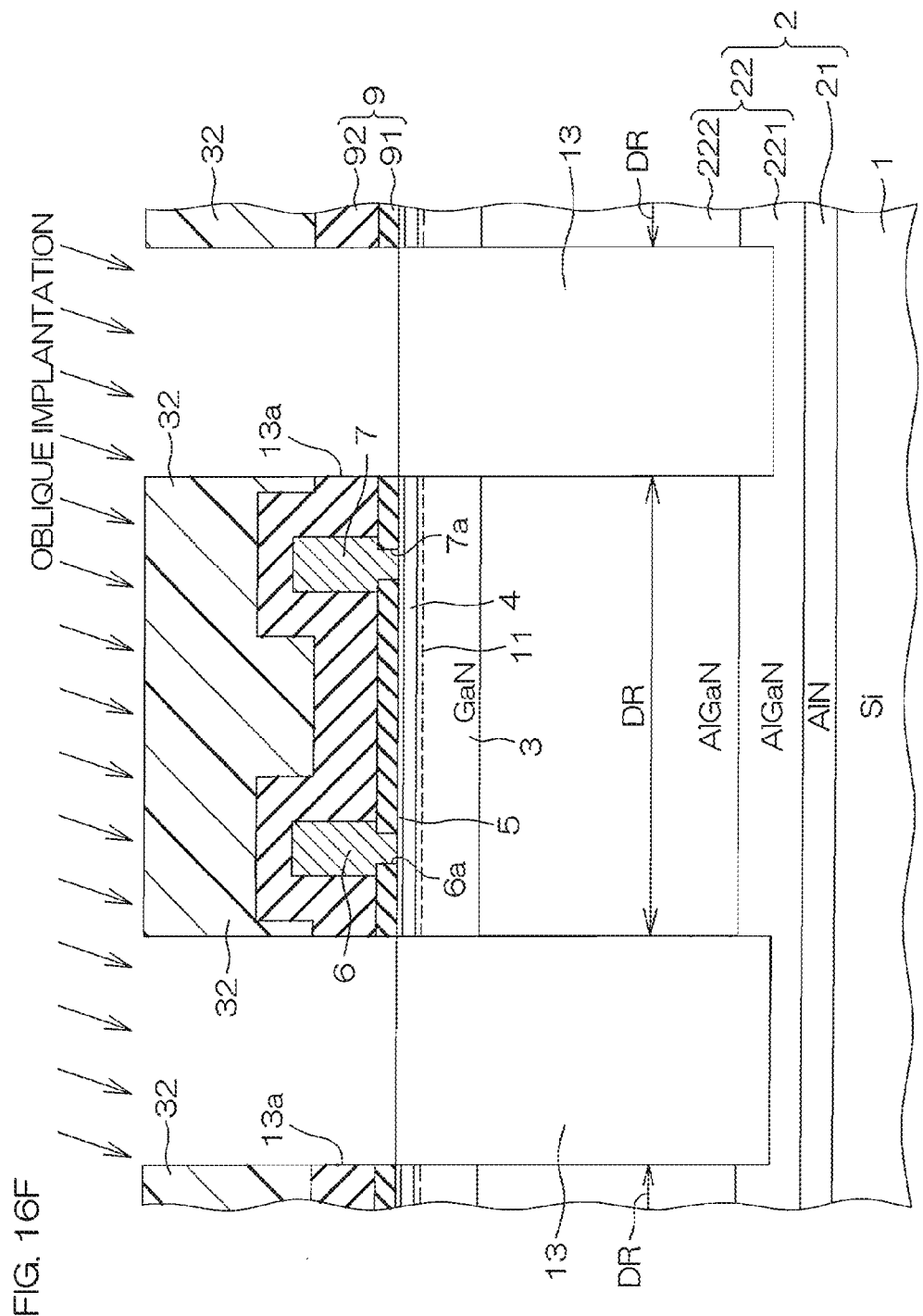

US 9,837,521 B2

NITRIDE SEMICONDUCTOR DEVICE AND FABRICATION METHOD THEREFOR

FIELD OF THE ART

The present invention relates to a semiconductor device formed of a group-III nitride semiconductor (hereinafter also simply referred to as a "nitride semiconductor") and a method of manufacturing the same.

BACKGROUND ART

A group-III nitride semiconductor is a group III-V semiconductor in which nitrogen is used as a group-V element. Representative examples of the nitride semiconductor include aluminum nitride (AlN), gallium nitride (GaN) and indium nitride (InN). In general, the nitride semiconductor can be represented as $Al_xIn_yGa_{1-x-y}N$ ($0 \leq X \leq 1$, $0 \leq Y \leq 1$, $0 \leq X+Y \leq 1$).

A HEMT (high-electron-mobility transistor) using such a nitride semiconductor is proposed. A HEMT includes, for example, an electron transit layer that is formed of GaN and an electron supply layer that is epitaxially grown on the electron transit layer and that is formed of AlGaN. A pair of a source electrode and a drain electrode are formed so as to be in contact with the electron supply layer, and a gate electrode is arranged therebetween. The gate electrode is joined to the electron supply layer with a Schottky junction or is arranged so as to be opposite to the electron supply layer across an insulating film. Due to polarization caused by the lattice mismatch between GaN and AlGaN, within the electron transit layer, in a position a few angstroms inward from an interface between the electron transit layer and the electron supply layer, a two-dimensional electron gas is formed. The two-dimensional electron gas is used as a channel, and thus a connection is made between the source and the drain. When a control voltage is applied to the gate electrode to interrupt the two-dimensional electron gas, an interruption occurs between the source and the drain. Since in a state where the control voltage is not applied to the gate electrode, electrical continuity is established between the source and the drain, the device functions as a normally on-type device.

Since the device using the nitride semiconductor has features such as a high-voltage resistance, a high-temperature operation, a high-current density, high-speed switching and a low on-resistance, the application to power devices is being examined.

However, since the device needs to be a normally off-type device which interrupts a current at the time of zero bias for an application for a power device, the HEMT described above cannot be applied to the power device.

A structure for realizing a normally off-type nitride semiconductor HEMT is proposed in, for example, Patent Document 1.

On the other hand, Patent Document 2 discloses a GaN-based semiconductor device that is produced as follows: a plurality of GaN-based HEMTs (high-electron-mobility transistors) are formed on a silicon substrate and the electrodes of the GaN-based HEMTs are coupled to each other by multilayer wiring. On the silicon substrate, a buffer layer and a semiconductor operation layer are formed. The semiconductor operation layer is separated into a plurality of semiconductor operation layer regions by an insulating region formed by ion implantation.

PRIOR ART DOCUMENT

Patent Document

Patent Document 1: Japanese Patent Application Publication No. 2011-171440
Patent Document 2: Japanese Patent Application Publication No. 2008-235740

SUMMARY OF THE INVENTION

According to a first aspect of the present invention, there is provided a nitride semiconductor device including: an electron transit layer that is formed of a nitride semiconductor; an electron supply layer that is formed on the electron transit layer, that is formed of a nitride semiconductor whose composition is different from the electron transit layer, and that has a recess which reaches the electron transit layer from a surface; a thermal oxide film that is formed on a surface of the electron transit layer exposed within the recess; a gate insulating film that is embedded within the recess so as to be in contact with the thermal oxide film; a gate electrode that is formed on the gate insulating film, and that is opposite to the electron transit layer across the thermal oxide film and the gate insulating film; and a source electrode and a drain electrode that are provided on the electron supply layer at an interval such that the gate electrode intervenes therebetween. The nitride semiconductor device has a normally off-type HEMT structure, and excellent device properties.

According to a second aspect of the present invention, there is provided a nitride semiconductor device including: a substrate; an electron transit layer that is formed on the substrate, and that is formed of a nitride semiconductor; an electron supply layer that is formed on the electron transit layer, and that is formed of a nitride semiconductor whose composition is different from the electron transit layer; an AlGaN buffer layer that intervenes between the substrate and the electron transit layer, and that includes a high aluminum composition region whose aluminum composition is relatively high and a low aluminum composition region whose aluminum composition is lower than the high aluminum composition region and which is arranged in a region close to the electron transit layer as compared with the high aluminum composition region; and an element separation layer that is formed with a region whose resistance is increased by causing a crystal defect through ion implantation and that passes through the electron supply layer and the electron transit layer to reach the AlGaN buffer layer. With the nitride semiconductor device, it is possible to effectively reduce the leak current.

The objects, features and effects of the present invention described above or further other objects, features and effects will be further clarified by the following description of preferred embodiments with reference to the accompanying drawings.

BRIEF DESCRIPTION OF THE DRAWINGS

FIG. 14A is a band diagram showing energy levels at individual parts in the direction of the thickness of the nitride semiconductor device.

FIG. 14B is a similar band diagram on the structure of the comparative example where an AlGaN buffer layer is formed with only an AlGaN layer of high aluminum composition.

FIGS. 15A, 15B and 15C are optical micrographs of the surface of a GaN layer epitaxially grown to various thicknesses.

FIG. 16A is a cross-sectional view showing a step of manufacturing the nitride semiconductor device.

FIG. 16F is a cross-sectional view showing a step subsequent to FIG. 16E.

MODES FOR CARRYING OUT THE INVENTION

Figure 1:
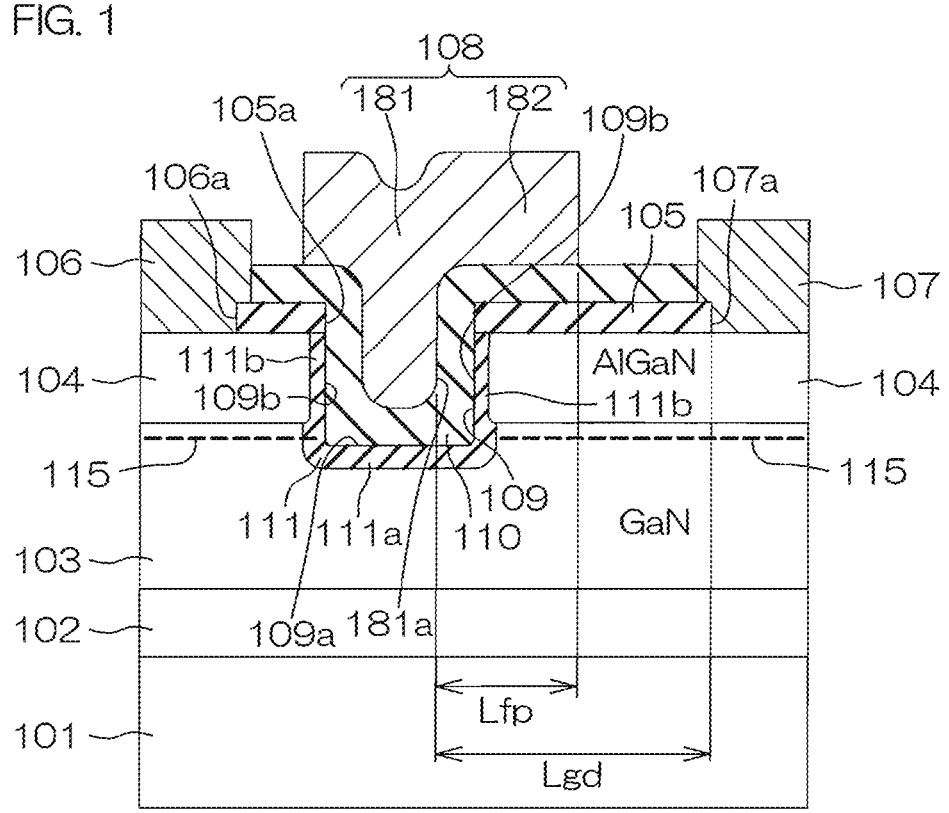
FIG. 1 is a schematic cross-sectional view for illustrating the configuration of a nitride semiconductor device according to a preferred embodiment of the present invention.

The features of a semiconductor device according to a first preferred embodiment of the present invention are as follows.

A1. This preferred embodiment provides a nitride semiconductor device including: an electron transit layer that is formed of a nitride semiconductor; an electron supply layer that is formed on the electron transit layer, that is formed of a nitride semiconductor whose composition is different from the electron transit layer, and that has a recess which reaches the electron transit layer from a surface; a thermal oxide film that is formed on a surface of the electron transit layer exposed within the recess; a gate insulating film that is embedded within the recess so as to be in contact with the thermal oxide film; a gate electrode that is formed on the gate insulating film, and that is opposite to the electron transit layer across the thermal oxide film, and the gate insulating film and a source electrode and a drain electrode that are provided on the electron supply layer at an interval such that the gate electrode intervenes therebetween.

In this configuration, on the electron transit layer, the electron supply layer whose composition is different is formed to form a heterojunction. Hence, within the electron transit layer in the vicinity of the interface between the electron transit layer and the electron supply layer, the two-dimensional electron gas is formed, and the HEMT utilizing the two-dimensional electron gas as a channel is formed. In the electron supply layer, a recess (convex portion) reaching, from its surface, the electron transit layer is formed. Hence, at the bottom portion of the recess, the heterojunction is interrupted, and the two-dimensional electron gas is interrupted accordingly. On the other hand, the gate insulating film is embedded within the recess, and across the gate insulating film, the gate electrode is opposite to the electron transit layer. Then, the source electrode and the drain electrode are arranged at an interval with the gate electrode intervening therebetween. Since the two-dimensional electron gas is interrupted in the vicinity of the bottom portion of the recess, at the time of zero bias when no bias is applied to the gate electrode, an interruption is made between the source and the drain. Hence, a normally off-type device is achieved. On the other hand, when an appropriate on-voltage (specifically, a positive bias) is applied to the gate electrode, since a channel is formed by electrons attracted to the vicinity of the recess, the two-dimensional electron gases on both sides of the gate electrode are connected, with the result that electrical continuity is established between the source and the drain.

In this preferred embodiment, on the surface of the electron transit layer exposed within the recess, the thermal oxide film is formed, and the gate insulating film is in contact with the thermal oxide film. The thermal oxide film is formed by thermally oxidizing the bottom portion of the recess. In the process of the thermal oxidization, the damage on the surface of the electron transit layer exposed at the bottom portion of the recess is removed. More specifically, when the recess reaching the electron transit layer is formed by etching (for example, dry etching), the surface of the electron transit layer is damaged (etching damage). This damage causes a decrease in electron mobility and deteriorates the device properties. However, in the configuration of this preferred embodiment, in the process of forming the thermal oxide film on the surface of the electron transit layer, the damage is cured. More specifically, the thermal oxide film is formed from the damaged surface toward the inside of the electron transit layer, and consequently, the interface between the thermal oxide film and the electron transit layer is located in a region which is not damaged. Then, since a channel is formed on the interface that is not damaged, the electron mobility in the channel becomes an original or inherent value of the nitride semiconductor forming the electron transit layer.

As described above, the recess formed in the electron supply layer is made to reach the electron transit layer, and thus it is possible to reliably achieve a normally off-type, and it is possible to provide the nitride semiconductor device of the HEMT structure where the electron mobility is high in the channel.

Patent Document 1 discloses a structure in which the thickness of the electron supply layer is reduced immediately below the gate electrode. However, it is difficult to accurately control the thickness of the electron supply layer by etching, and it is impossible to completely remove the electron supply layer immediately below the gate electrode. Hence, since the channel produced by polarization caused by the lattice mismatch between the electron supply layer and the electron transit layer cannot be completely removed, in actuality, a normally off-type device is not achieved. In order to achieve a normally off-type device, etching from the electron supply layer is performed beyond the interface between the electron supply layer and the electron transit layer, and thus the interface between the electron supply layer and the electron transit layer is damaged, with the result that the electron mobility is significantly reduced and the device properties are significantly deteriorated.

In this preferred embodiment, the combination of the electron supply layer/electron transit layer may be any one of AlGaN layer/GaN layer, AlGaN layer/AlGaN layer (where Al composition is different), AlInN layer/AlGaN layer, AlInN layer/GaN layer, AlN layer/GaN layer and AlN layer/AlGaN layer. More generally, the electron supply layer may include Al and N in its composition. The electron transit layer may include Ga and N in its composition, and the composition (in particular, Al composition) is different from the electron supply layer. The electron supply layer and the electron transit layer are different in composition (in particular, Al composition), and thus a lattice mismatch occurs therebetween, with the result that a two-dimensional electron gas caused by polarization is produced within the electron transit layer near the interface.

A2. The thermal oxide film may contain Ga and O. When the electron supply layer has a composition including Ga, the thermal oxide film has a composition including Ga and O.

A3. In the thermal oxide film, the oxygen concentration in the film may have a gradient with respect to the direction of thickness of the film. When the thermal oxide film is formed in an atmosphere of oxygen by thermal processing, the oxygen concentration in the thermal oxide film has a gradient with respect to the direction of thickness of the film.

A4. The oxygen concentration in the thermal oxide film may be maximum in an interface with the gate insulating film, and may be decreased toward the electron transit layer.

A5. The maximum oxygen concentration in the thermal oxide film may be $10^{20}$ cm$^{-3}$ or less.

A6. The film thickness of the thermal oxide film may be less than the film thickness of the gate insulating film. In this way, the gate insulating film can have a necessary film thickness.

A7. The film thickness of the gate insulating film may be approximately twice as much as the film thickness of the thermal oxide film.

A8. The film thickness of the thermal oxide film may be 1 to 100 nm.

A9. The thermal oxide film may include a first part that is formed on the surface of the electron transit layer exposed within the recess and a second part formed on a surface of the electron supply layer exposed within the recess, and the first part may be different from the second part in film thickness. Within the recess, the thermal oxide film may be continuously formed from the surface of the electron transit layer to the surface of the electron supply layer. In this case, since the electron transit layer and the electron supply layer are different in composition, the growth rate when the thermal oxide film is grown on the surface is different. Hence, the thermal oxide film has different film thicknesses in the first part formed on the surface of the electron transit layer and the second part formed on the surface of the electron supply layer.

A10. According to this preferred embodiment, there is provided a nitride semiconductor device including: an electron transit layer that is formed of a nitride semiconductor; an electron supply layer that is formed on the electron transit layer, that is formed of a nitride semiconductor whose composition is different from the electron transit layer, and that has a recess which reaches the electron transit layer from a surface; a gate insulating film that is embedded within the recess; a gate electrode that is formed on the gate insulating film, and that is opposite to the electron transit layer across the gate insulating film and a source electrode; and a drain electrode that are provided on the electron supply layer at an interval such that the gate electrode intervenes therebetween, where the concentration of each of B, Cl and Si in a surface of the gate insulating film on an opposite side to the gate electrode is $10^{20}$ cm$^{-3}$ or less.

In this configuration, on the electron transit layer, the electron supply layer whose composition is different is formed to form a heterojunction. Hence, within the electron transit layer in the vicinity of the interface between the electron transit layer and the electron supply layer, the two-dimensional electron gas is formed, and the HEMT utilizing the two-dimensional electron gas as a channel is formed. In the electron supply layer, a recess reaching, from its surface, the electron transit layer is formed. Hence, at the bottom portion of the recess, the heterojunction is interrupted, and the two-dimensional electron gas is interrupted accordingly. On the other hand, the gate insulating film is embedded within the recess, and the gate electrode is opposite the electron transit layer across the gate insulating film. The source electrode and the drain electrode are arranged at an interval so as to sandwich the gate electrode. Since the two-dimensional electron gas is interrupted in the vicinity of the bottom portion of the recess, at the time of zero bias when no bias is applied to the gate electrode, an interruption is made between the source and the drain. Hence, a normally off-type device is achieved. On the other hand, when an appropriate on-voltage (specifically, a positive bias) is applied to the gate electrode, since a channel is formed by electrons attracted to the vicinity of the recess, the two-dimensional electron gases on both sides of the gate electrode are connected, with the result that electrical continuity is established between the source and the drain.

In this preferred embodiment, each of the concentrations of B, Cl and Si in the surface of the gate insulating film on the opposite side to the gate electrode is $10^{20}$ cm$^{-3}$ or less. When in the electron supply layer, the recess is formed by dry etching (for example, plasma etching), as the etching gas, a gas (for example, $BCl_3$ or $SiCl_4$) including at least one of B, Cl and Si is used. In this case, when after the etching, thermal oxidization processing (for example, at 900° C. or more in an atmosphere of oxygen) is performed on the electron transit layer exposed within the recess, B, Cl and Si included in the etching gas react with oxygen and are scattered, with the result that the concentration of B, Cl and Si left on the surface is $10^{20}$ cm$^{-3}$ or less. In other words, after the etching, thermal oxidization is performed on the surface of the electron transit layer within the recess, and consequently, the concentration of B, Cl and Si in the surface of the gate insulating film on the opposite side to the gate electrode is $10^{20}$ cm$^{-3}$ or less. This is said to be a trace that selective thermal oxidization processing is performed on the exposed surface of the electron transit layer.

In the process of the thermal oxidization, the damage on the surface of the electron transit layer exposed at the bottom portion of the recess is cured. More specifically, when the recess reaching the electron transit layer is formed by etching (for example, dry etching), the surface of the electron transit layer is damaged (etching damage). This damage causes a decrease in electron mobility and deteriorates the device properties. However, in the configuration of this preferred embodiment, in the process of thermally oxidizing the surface of the electron transit layer, the damage is removed. More specifically, the thermal oxide film is formed from the damaged surface toward the inside of the electron transit layer, and consequently, the interface between the thermal oxide film and the electron transit layer is located in a region which is not damaged. Then, since a channel is formed on the interface that is not damaged, the electron mobility in the channel becomes an original value of the nitride semiconductor forming the electron transit layer.

As described above, the recess formed in the electron supply layer is made to reach the electron transit layer, and thus it is possible to reliably achieve a normally off-type, and it is possible to provide the nitride semiconductor device of the HEMT structure where the electron mobility is high in the channel.

As in the case of the preferred embodiment of A1, the combination of the electron supply layer/electron transit layer may be any one of AlGaN layer/GaN layer, AlGaN layer/AlGaN layer (where Al composition is different), AlInN layer/AlGaN layer, AlInN layer/GaN layer, AlN layer/GaN layer and AlN layer/AlGaN layer. More generally, the electron supply layer may contain Al and N in its composition. The electron transit layer may contain Ga and N in its composition, and the composition (in particular, Al composition) is different from the electron supply layer. The electron supply layer and the electron transit layer are different in composition (in particular, Al composition), and thus a lattice mismatch occurs therebetween, with the result that a two-dimensional electron gas caused by polarization is produced within the electron transit layer near the interface.

A11. The relative permittivity of the gate insulating film is preferably higher than the relative permittivity of the electron supply layer. In this way, it is possible to generate a sufficient electric field to induce a channel by applying a bias to the gate electrode.

A12. The gate insulating film is preferably an insulating film that is formed by an ALD method. Since it is possible to control the film thickness of the gate insulating film at the atomic level by the ALD (Atomic Layer Deposition) method, it is possible to provide a nitride semiconductor device in which the device properties are accurately controlled.

A13. The gate insulating film may be formed of $Al_2O_3$. Since $Al_2O_3$ is an insulating film that can be formed by the ALD method, it is possible to provide a nitride semiconductor device in which the device properties are accurately controlled by using $Al_2O_3$ to form the gate insulating film.

A14. At a lowermost part of the recess, approximately half of the film thickness of the gate insulating film may be located on the side of the electron transit layer with respect to an interface between the electron transit layer and the electron supply layer. In this configuration, the bottom portion of the recess is made to reliably reach the electron transit layer, and thus it is possible to achieve a normally off-type device.

A15. The film thickness of the gate insulating film may be 5 to 50 nm. In this way, it is possible to acquire sufficient voltage resistance between the gate and the source while reducing the on-resistance. In other words, when the gate insulating film is excessively thin, the voltage resistance is insufficient whereas when the gate insulating film is excessively thick, the on-resistance is increased.

A16. The film thickness of the electron transit layer is preferably 5 to 2000 nm. When the thickness of the electron transit layer exceeds 2000 nm, a crack is more likely to be produced. When the thickness of the electron transit layer is less than 50 nm, the mobility is lowered. By contrast, when the thickness of the electron transit layer is reduced, the threshold value (the lowest voltage that needs to be applied to the gate electrode to establish electrical continuity between the source and the drain) can be increased, and a circuit design for driving the device is easily performed. In other words, when the thickness of the electron transit layer is increased to enhance the mobility, the threshold value is lowered, and thus a circuit design becomes difficult. In this preferred embodiment, the surface of the electron transit layer is thermally oxidized, and thus its surface is prevented from being converted into an n-type, with the result that it is possible to increase the threshold value. Hence, while the thickness of the electron transit layer is relatively increased to acquire a high electron mobility, it is possible to provide a device having a high threshold value.

A17. The electron transit layer may be formed of GaN, and the electron supply layer may be formed of AlGaN.

A18. According to this preferred embodiment, there is provided a method of manufacturing a nitride semiconductor device, the method including: a step of forming an electron transit layer that is formed of a nitride semiconductor; a step of forming, on the electron transit layer, an electron supply layer that is formed of a nitride semiconductor whose composition is different from the electron transit layer; a step of forming a recess by etching the electron supply layer until the electron transit layer is exposed; a step of thermally oxidizing a surface of the electron transit layer exposed at the recess; a step of forming a gate insulating film by embedding an insulating material within the recess; a step of forming a gate electrode that is opposite to the electron transit layer across the gate insulating film within the recess; and a step of forming a source electrode and a drain electrode that are in contact with the electron supply layer in a position spaced apart within the gate electrode intervening therebetween.

In this method, a structure where the gate electrode is opposite to the electron transit layer via the gate insulating film embedded within the recess formed in the electron supply layer is provided, and thus it is possible to manufacture a nitride semiconductor device having a normally off-type HEMT structure. Since after the recess is formed by etching, the surface of the electron transit layer exposed within the recess is thermally oxidized, the damage on the surface of the electron transit layer by etching is removed. In this way, since the electron mobility in the channel region immediately below the recess becomes an original or inherent value of the nitride semiconductor forming the electron transit layer, it is possible to realize excellent device properties.

A19. In the thermally oxidizing step, a thermal oxide film may be formed on the surface of the electron transit layer exposed within the recess.

A20. In the thermally oxidizing step, a thermal oxide film may be formed on surfaces of the electron transit layer and the electron supply layer exposed within the recess.

A21. The thermal oxide layer may contain Ga or O. When the electron transit layer has a composition including Ga, the thermal oxide film contains Ga and O.

A22. The etching that forms the recess may be dry etching using an etching agent including at least one type of element of B, Cl and Si.

A23. The concentrations of B, Cl and Si in the surface of the gate insulating film on the side of the electron transit layer are preferably $10^{20}$ cm$^{-3}$ or less. Since B, Cl and Si included in an etching agent react with oxygen at the time of thermal oxidization and are scattered, their concentrations left on the surface of the gate insulating film on the side of the electron transit layer are not high, and are $10^{20}$ cm$^{-3}$ or less.

A 24. The step of forming the gate insulating film is preferably a step of forming the insulating material by an ALD method. In this way, since it is possible to control the film thickness of the gate insulating film at the atomic level, it is possible to accurately control the device properties of the nitride semiconductor device.

A25. The insulating material may be $Al_2O_3$. Since $Al_2O_3$ can be formed by the ALD method, it is possible to accurately control the device properties of the nitride semiconductor device.

This preferred embodiment will be described in detail below with reference to the accompanying drawings.

Figure 2:
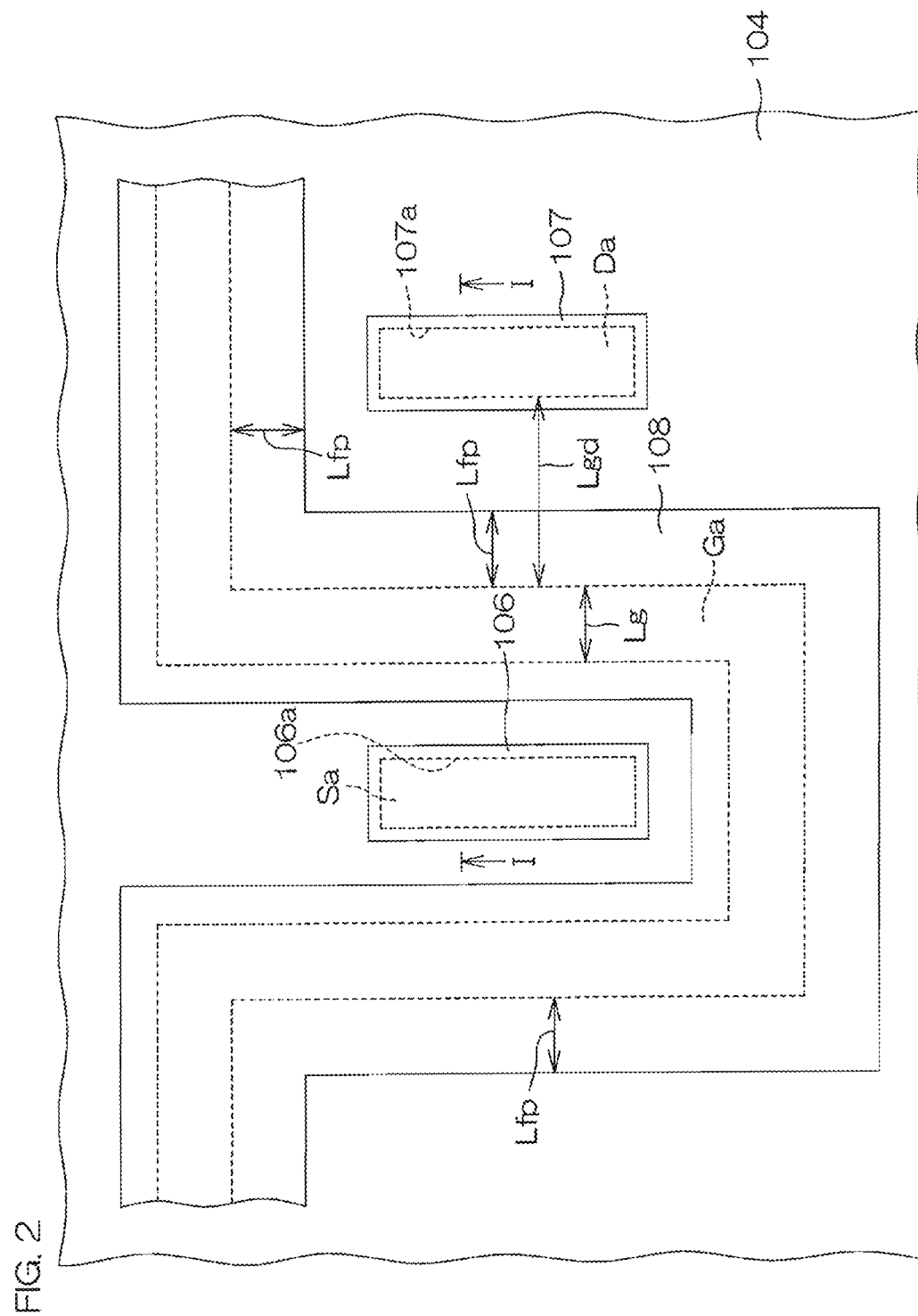
FIG. 2 is a plan view of the nitride semiconductor device.

FIG. 1 is a schematic cross-sectional view for illustrating the configuration of a nitride semiconductor device according to a preferred embodiment of the present invention. FIG. 2 is a plan view of the nitride semiconductor device described above. A cross section taken along line I-I in FIG. 2 is shown in FIG. 1.

This nitride semiconductor device includes a substrate 101 (for example, a silicon substrate), a buffer layer 102 that is formed on the surface of the substrate 101, an electron transit layer 103 that is epitaxially grown on the buffer layer 102 and an electron supply layer 104 that is epitaxially grown on the electron transit layer 103. The nitride semiconductor device further includes a passivation film 105 that covers the surface of the electron supply layer 104, and a source electrode 106 and a drain electrode 107 that pass through contact holes 106a and 107a formed in the passivation film 105 to make ohmic contact with the electron supply layer 104. The source electrode 106 and the drain electrode 107 are arranged at an interval, and a gate electrode 108 is arranged therebetween.

Figure 3:
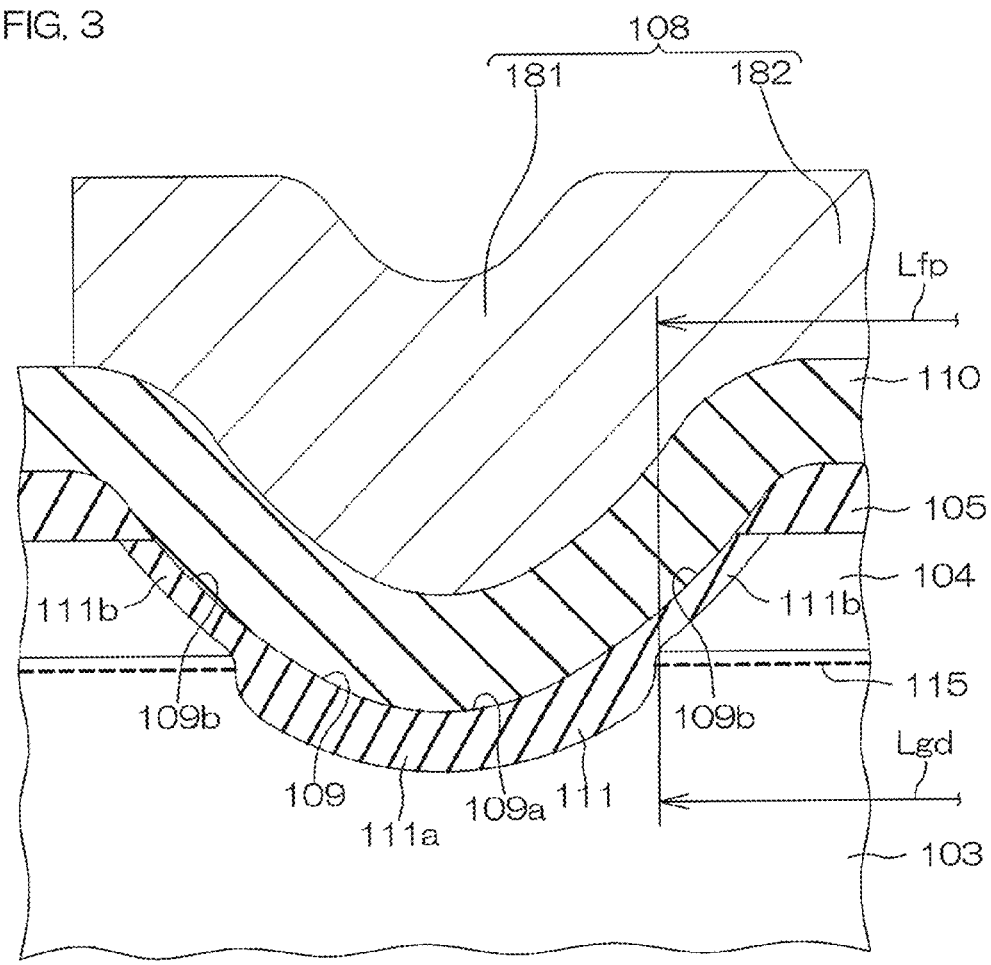
FIG. 3 is an enlarged cross-sectional view showing an example of a structure in the vicinity of a recess in an actual element of the nitride semiconductor device.

In the electron supply layer 104, a recess 109 that is dug from its surface toward the electron transit layer 103 is formed. FIG. 3 shows an enlarged view of an example of a structure in the vicinity of the recess 109 in an actual element. The recess 109 is formed such that its depth reaches the electron transit layer 103. Hence, both the electron transit layer 103 and the electron supply layer 104 are opposite to the inner space of the recess 109. In the inner wall surface of the recess 109, a part on the side of the electron transit layer 103 with respect to the interface between the electron transit layer 103 and the electron supply layer 104 is referred to as a "bottom portion 109a," and a part on the side of the electron supply layer 104 with respect to the interface is referred to as a "side wall portion 109b." The recess 109 passes between the source electrode 106 and the drain electrode 107 and is formed so as to be groove-shaped, and may have, as shown in FIG. 3, a surface whose cross section is formed in the shape of a smoothly recessed dish or a parabola. For example, the lowermost part of the bottom portion 109a of the recess 109 is located on the side of the electron transit layer 103 with respect to the interface between the electron transit layer 103 and the electron supply layer 104. The lowermost part of the bottom portion 109a of the recess 109 may be located on the side of the electron transit layer 103, 10 nm to 100 nm and preferably 10 nm to 20 nm from the interface between the electron transit layer 103 and the electron supply layer 104.

On the bottom portion 109a and the side wall portion 109b of the recess 109, a thermal oxide film 111 is formed. A gate insulating film 110 is laminated on the thermal oxide film 111. At the bottom portion 109a of the recess 109, the gate electrode 108 is opposite to the electron transit layer 310 across the gate insulating film 110 and the thermal oxide film 111. The thermal oxide film 111 continuously extends not only to the bottom portion 109a of the recess 109 but also to the side wall portion 109b, and thus it is possible to reduce a leak pass.

The electron transit layer 103 and the electron supply layer 104 are formed of a group-III nitride semiconductor (hereinafter simply referred to as a "nitride semiconductor") having a different composition. For example, the electron transit layer 103 may be formed with a GaN layer, and its thickness may be 50 to 2000 nm. In this preferred embodiment, the electron supply layer 104 is formed with an $Al_xGa_{1-x}N$ layer (0<x<1), and its thickness may be, for example, about 25 nm.

As described above, the electron transit layer 103 and the electron supply layer 104 are formed of a nitride semiconductor having a different composition to form a heterojunction, and a lattice mismatch occurs therebetween. Due to polarization caused by the heterojunction and the lattice mismatch, in a position (for example, a position of a distance of about a few angstroms from the interface) near the interface between the electron transit layer 103 and the electron supply layer 104, a two-dimensional electron gas 115 caused by the polarization is spread.

On the bottom portion 109a of the recess 109, the thermal oxide film 111 has a film thickness of 1 to 100 nm, preferably 1 to 5 nm and more preferably 1 to 3 nm. The thermal oxide film 111 is formed by thermally oxidizing the surface of the electron transit layer 103, and is thus in contact with the electron transit layer 103. The interface between the thermal oxide film 111 and the electron transit layer 103 is located at a depth on the electron transit layer 103 side with respect to the interface between the electron supply layer 104 and the electron transit layer 103. The thermal oxide film 111 may have a surface part which is located at a depth on the electron transit layer 103 side with respect to the interface between the electron supply layer 104 and the electron transit layer 103 on the bottom portion 109a of the recess 109.

The thermal oxide film 111 includes a bottom portion covering portion 111a (a first part of the thermal oxide film 111) that is formed by thermally oxidizing the electron transit layer 103 exposed at the bottom portion 109a of the recess 109, and a side wall covering portion 111b (a second part of the thermal oxide film 111) that is formed by thermally oxidizing the surface of the electron supply layer 104 exposed at the side wall portion 109b of the recess 109. Since the bottom portion covering portion 111a is a part that is formed by thermally oxidizing the exposed surface of the electron transit layer 103 made of GaN, its composition includes Ga and O. Since the side wall covering portion 111b is a part that is formed by thermally oxidizing the exposed surface of the electron supply layer 104 made of AlGaN, its composition also includes Ga and O. The bottom portion covering portion 111a and the side wall covering portion 111b are formed by a common thermal oxidizing step, and are continuous with each other. Since GaN and AlGaN have a different thermal oxidation rate, the bottom portion covering portion 111a and the side wall covering portion 111b differ in film thickness accordingly. Specifically, the film thickness of the bottom portion covering portion 111a is larger than that of the side wall covering portion 111b. The film thickness of the bottom portion covering portion 111a is 1 to 100 nm, preferably 1 to 5 nm and more preferably 1 to 3 nm. The film thickness of the side wall covering portion 111b is likewise 1 to 100 nm, preferably 1 to 5 nm and more preferably 1 to 3 nm; however, it is smaller than that of the bottom portion covering portion 111a.

In the thermal oxide film 111 formed by thermal oxidization from the exposed surface, an oxygen concentration in the film has a gradient with respect to the direction of the film thickness. More specifically, the oxygen concentration in the thermal oxide film 111 is maximum at the interface with the gate insulating film 110, and is decreased as it approaches toward the electron transit layer 103. The maximum oxygen concentration in the thermal oxide film 111 may be equal to or less than $10^{20}$ cm$^{-3}$.

The gate insulating film 110 is an insulating film whose relative permittivity is higher than that of the electron supply layer 104. The gate insulating film 110 may be an insulating film that is formed by an ALD (Atomic Layer Deposition) method. More specifically, the gate insulating film 110 is formed of, for example, $Al_2O_3$ (aluminum oxide, alumina), and is formed to be thicker than the thermal oxide film 111 (for example, may be thicker than the electron supply layer 104). More specifically, the film thickness of the gate insulating film 110 is preferably 5 to 50 nm (for example, 20 nm). In this way, it is possible to obtain a necessary breakdown voltage (for example, 20 V or more) and to reduce an on-resistance. The film thickness of the gate insulating film 110 may be about twice as large as that of the thermal oxide film 111. In the gate insulating film 110, at the lowermost part of the bottom portion 109a of the recess 109, about half of the film thickness may be located on the side of the electron transit layer 103 with respect to the interface between the electron transit layer 103 and the electron supply layer 104.

In this preferred embodiment, in the surface of the gate insulating film 110 on the opposite side to the gate electrode 108, that is, the interface with the thermal oxide film 111, the concentration of each of B, Cl and Si is equal to or less than $10^{20}$ cm$^{-3}$.

In this preferred embodiment, the gate insulating film 110 is in contact with the thermal oxide film 111 within the recess 109, further extends to the outside of the recess 109 and covers the surface of the outside of the recess 109 of the electron supply layer 104. In this way, the voltage resistance is further enhanced.

The gate electrode 108 is formed so as to be in contact with the gate insulating film 110. The gate electrode 108 may be formed with a multilayer electrode film having a lower layer in contact with the gate insulating film 110 and an upper layer stacked on the lower layer. The lower layer may be formed of Ni or Pt, and the upper layer may be formed of Au or Al. A gate electrode 8 is displaced to a source electrode 6, and thereby has a non-symmetrical structure in which a gate to drain distance (for example, 9 μm) is longer than a gate to source distance (for example, 2 μm). The non-symmetrical structure alleviates a high electric field produced between the gate and the drain to facilitate the enhancement of the voltage resistance. The gate length may be about 1 μm, and the gate width may be about 175 μm.

Furthermore, in this preferred embodiment, the gate electrode 108 includes a gate main body portion 181 that enters an opening 105a formed in the passivation film 105 and that further enters the recess 109, and a field plate portion 182 that is continuous with the gate main body portion 181 and that extends, outside the opening 105a, toward the drain electrode 107 on the passivation film 105. More specifically, the part opposite to the bottom portion 109a of the recess 109 in the direction of the thickness of the electron transit layer 103 is the gate main body portion 181, and the part thereoutside (in particular, the part extending toward the side of the drain electrode 107) is the field plate portion 182. A distance Lfp (for example, about 2.25 μm) from a drain end 181a that is an end portion of the lower end of the gate main body portion 181 on the side of the drain electrode 107 to an end portion of the field plate portion 182 on the side of the drain electrode 107 refers to a field plate length. Specifically, the drain end 181a is defined by the position on the side of the drain electrode 107 where the surface (the interface between the thermal oxide film 111 and the gate insulating film 110) of the recess 109 crosses a plane including the interface between the electron transit layer 103 and the electron supply layer 104.

The field plate length Lfp is preferably equal to or more than one-sixth a distance Lgd (for example, about 9 μm) from the drain end 181a to the drain electrode 107 but equal to or less than half of the distance Lgd. In this way, it is possible to alleviate electric field concentration at the drain end 181a and to prevent the passivation film 105 from being broken due to the electric field between the drain side end of the field plate portion 182 and the drain electrode 107.

The source electrode 106 and the drain electrode 107 are an ohmic electrode that includes, for example, Ti, Al, Mo and Si, and are in ohmic contact with the two-dimensional electron gas 115. The ohmic electrode may be an electrode obtained by forming a multilayer metal film on the electron supply layer 104, patterning the multilayer metal film and then performing sintering processing thereon. The multilayer metal film may be formed by depositing, on the electron supply layer 104, a Ti layer (for example, 200 angstroms in thickness), a first Si layer (for example, 200 angstroms in thickness), an Al layer (for example, 2000 angstroms in thickness), a second Si layer (for example, 200 angstroms in thickness) and a Mo layer (for example, 2000 angstroms in thickness) in this order. In this case, the sintering processing is preferably performed at a temperature at which the Al layer is melted.

The buffer layer 102 may be, for example, an AlGaN layer or may be a layer that has a superlattice structure in which an AlN layer and a GaN layer are repeatedly deposited in layers.

In this nitride semiconductor device, on the electron transit layer 103, the electron supply layer 104 having a composition different from the electron transit layer 103 is formed, and thus the heterojunction is formed. In this way, within the electron transit layer 103 in the vicinity of the interface between the electron transit layer 103 and the electron supply layer 104, the two-dimensional electron gas 115 is formed, and a HEMT that utilizes the two-dimensional electron gas 115 as a channel is formed. The gate electrode 108 is opposite to the electron transit layer 103 across the gate insulating film 110, and the electron supply layer 104 is not present immediately below the gate electrode 108. Hence, immediately below the gate electrode 108, the two-dimensional electron gas 115 resulting from polarization caused by the lattice mismatch between the electron supply layer 104 and the electron transit layer 103 is not formed. Thus, when no bias is applied to the gate electrode 108 (at the time of zero bias), the channel resulting from the two-dimensional electron gas 115 is interrupted immediately below the gate electrode 108. In this way, a normally off-type HEMT is realized. When an appropriate on-voltage (for example, 5 V) is applied to the gate electrode 108, a channel is induced within the electron transit layer 103 immediately below the gate electrode 108, and the two-dimensional electron gases 115 on both sides of the gate electrode 108 are connected. In this way, electrical continuity is established between the source and the drain.

In use, for example, between the source electrode 106 and the drain electrode 107, a predetermined voltage (for example, 200 to 400 V) is applied such that the side of the drain electrode 107 is positive. In this state, an off-voltage (0 V) or an on-voltage (5 V) is applied to the gate electrode 108 with the source electrode 106 being in a reference potential (0 V).

As shown in FIG. 2, in a plan view, the gate electrode 108 is routed such that a junction region (source junction region, a region within the contact hole 106a) Sa between the source electrode 106 and the electron supply layer 104 is separated from a junction region (drain junction region, a region within the contact hole 107a) Da between the drain electrode 107 and the electron supply layer 104. More specifically, a junction region (gate junction region, a region within the opening 105a) Ga between the gate main body portion 181 of the gate electrode 108 and the electron supply layer 104 is formed as a belt-shaped pattern having a constant width that separates the source junction region Sa and the drain junction region Da. More specifically, the source junction region Sa and the drain junction region Da are rectangular regions in which the longitudinal directions thereof are parallel to each other, and are aligned along the lateral direction of the rectangular region. The gate junction region Ga is formed in a zigzag-shape that passes between the source junction region Sa and the drain junction region Da. The gate junction region Ga is arranged so as to pass through a position close to the source junction region Sa as compared with the drain junction region Da. A distance between the gate junction region Ga and an edge of the gate electrode 108 on the side of the drain junction region Da is a field plate length Lfp. The width of the gate junction region Ga is a gate length Lg (for example, about 1 μm).

FIGS. 4A to 4F are schematic cross-sectional views for illustrating an example of a step of manufacturing the nitride semiconductor device, and show cross-sectional structures at a plurality of stages in the manufacturing step. FIGS. 5A to 5C are enlarged cross-sectional views showing an example of structures halfway through the manufacturing step in the vicinity of the recess 109 in an actual element.

Figure 4A:
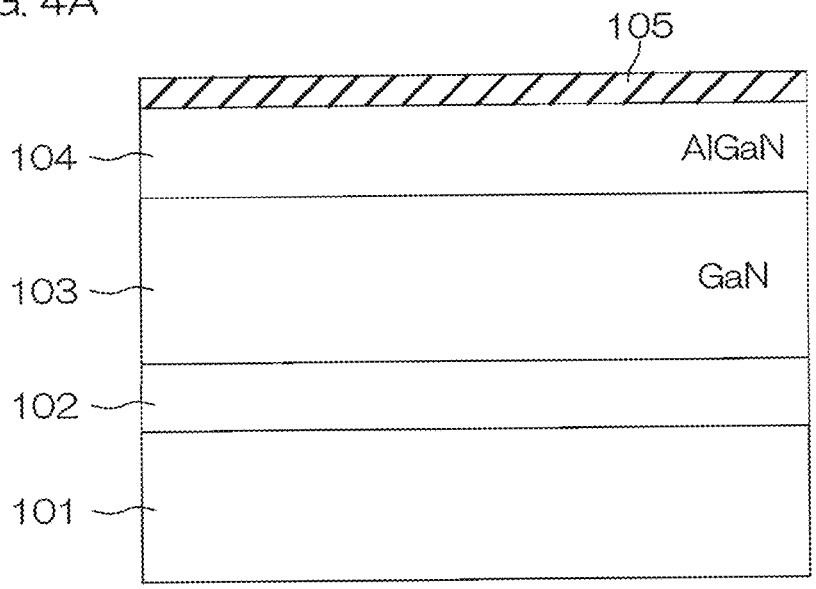
FIG. 4A is a schematic cross-sectional view for illustrating an example of a step of manufacturing the nitride semiconductor device.
Figure 5A:
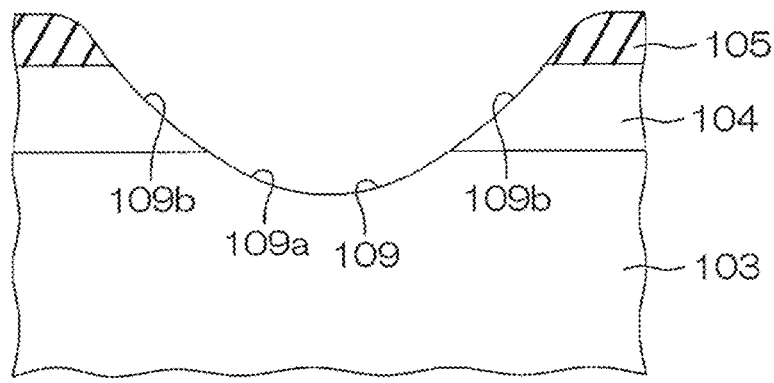
FIGS. 5A to 5C are enlarged cross-sectional views showing structures halfway through the manufacturing step in the vicinity of the recess in the actual element of the nitride semiconductor device.
Figure 5B:
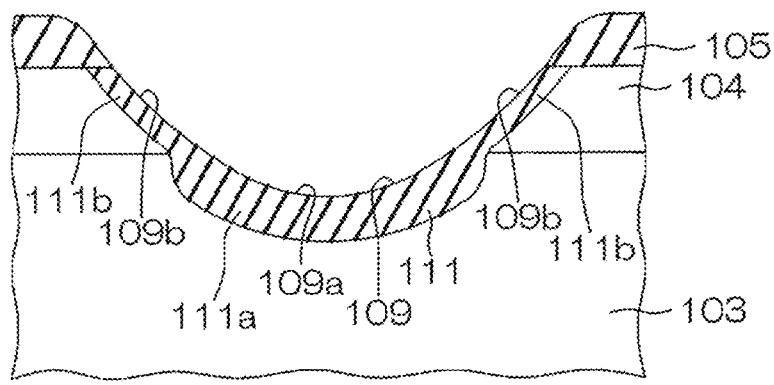
Figure 5C:
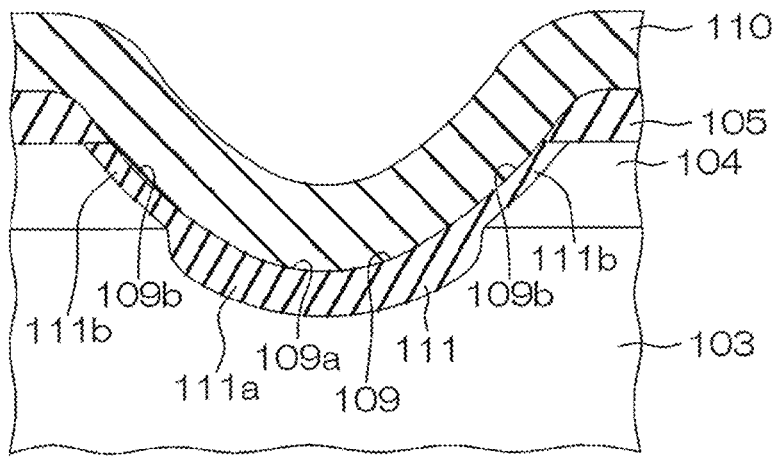

First, as shown in FIG. 4A, on the substrate 101, the buffer layer 102 and the electron transit layer 103 are sequentially epitaxially grown, and furthermore, on the electron transit layer 103, the electron supply layer 104 is epitaxially grown. Then, furthermore, the passivation film 105 is formed by, for example, a CVD method (chemical vapor deposition method) such that the entire surface on the electron supply layer 104 is coated. The passivation film 105 may be formed of silicon nitride (SiN), and it is appropriate that its film thickness is about a few hundred nanometers.

Figure 4B:
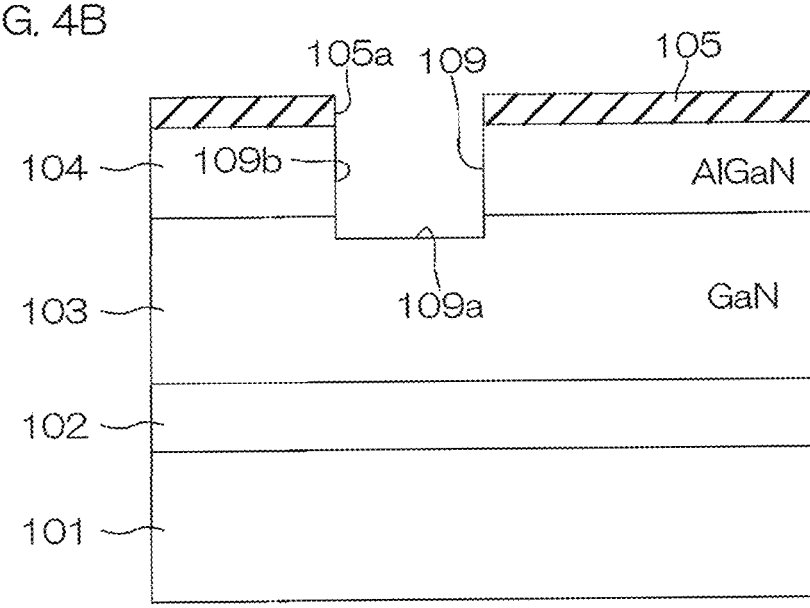
FIG. 4B is a schematic cross-sectional view showing the step subsequent to FIG. 4A.

Next, as shown in FIGS. 4B and 5A, the recess 109 is formed in the electron supply layer 104 so as to correspond to a position where the gate electrode 108 is formed. Specifically, a mask having an opening is formed in a position where the recess 109 is to be formed, the passivation film 105 is opened by dry etching via the mask and etching is further performed until the electron supply layer 104 reaches the electron transit layer 103, with the result that the recessed recess 109 is formed from the surface of the electron supply layer 104 toward the electron transit layer 103. Here, the electron transit layer 103 is exposed to the bottom portion 109a of the recess 109, and the electron supply layer 104 is exposed to the side wall portion 109b. The surface of the bottom portion 109a of the recess 109 is located on the side of the electron transit layer 103 with respect to the interface between the electron transit layer 103 and the electron supply layer 104. The dry etching may be plasma etching using a $BCl_3$ gas or a $SiCl_4$ gas as an etching gas.

Figure 4C:
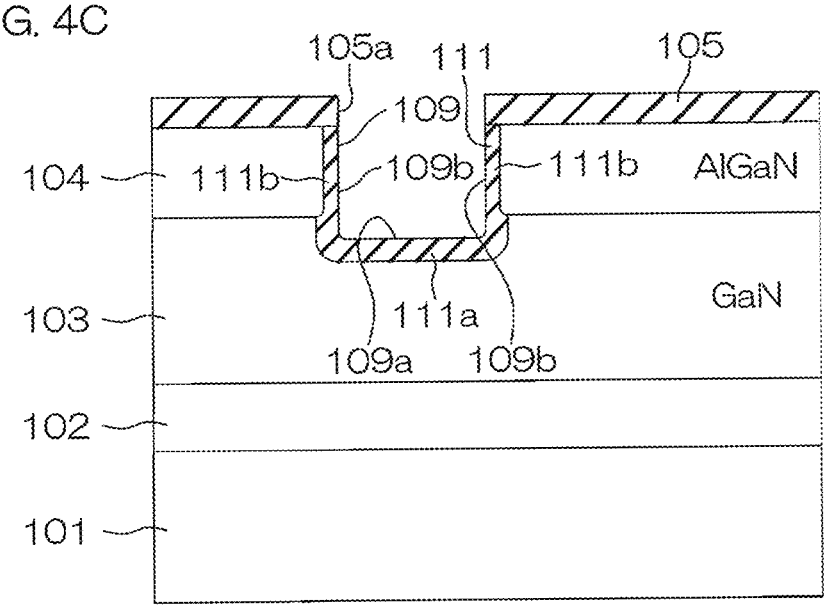
FIG. 4C is a schematic cross-sectional view showing the step subsequent to FIG. 4B.

Next, as shown in FIGS. 4C and 5B, the thermal oxide film 111 is formed by thermal oxidization processing (selective thermal oxidizing processing) that is performed while an oxygen gas is passed within a thermal oxidation furnace. More specifically, in an atmosphere containing a nitrogen gas and an oxygen gas, thermal processing is performed at 900° for 3 minutes, and thus the inner wall surface of the recess 109 is selectively thermally oxidized, with the result that the thermal oxide film 111 is formed on the inner wall surface of the recess 109. In this way, the thermal oxide film 111 having the bottom portion covering portion 111a on the exposed surface of the electron transit layer 103 within the recess 109 and the side wall covering portion 111b on the exposed surface of the electron supply layer 104 within the recess 109 is formed. The thermal oxide film 111 is formed by oxidizing, from the surfaces of the electron transit layer 103 and the electron supply layer 104 toward the inside, the nitride semiconductor materials thereof. Here, since the position of the inner wall surface of the recess 109 is hardly changed, the surfaces of the bottom portion covering portion 111a and the side wall covering portion 111b on the side of the recess 109 are continuous. On the other hand, since the compositions of the electron transit layer 103 and the electron supply layer 104 are different, their oxidization rates are different accordingly. Hence, the bottom portion covering portion 111a and the side wall covering portion 111b differ from each other in thickness, and the bottom portion covering portion 111a is thicker than the side wall covering portion 111b. Thus, in a boundary portion between the bottom portion covering portion 111a and the side wall covering portion 111b, a step is produced on the surface on the opposite side to the recess 109.

Figure 4D:
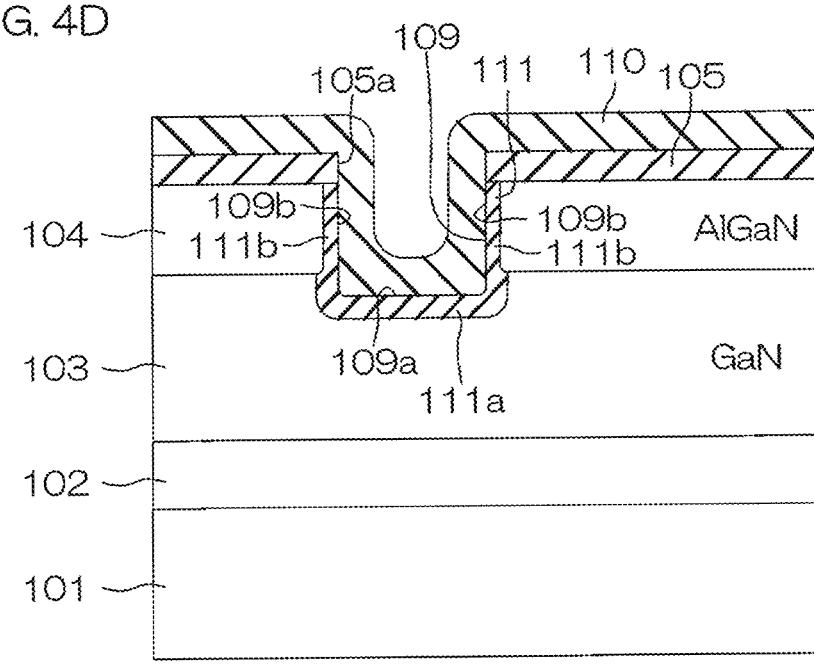
FIG. 4D is a schematic cross-sectional view showing the step subsequent to FIG. 4C.

Next, as shown in FIGS. 4D and 5C, the gate insulating film 110 is formed so as to cover the entire exposed surface. Hence, the gate insulating film 110 is formed to make contact with the thermal oxide film 111 within the recess 109 and to extend to a region outside the recess 109. In this preferred embodiment, the gate insulating film 110 is formed of alumina ($Al_2O_3$), and is formed by, for example, an ALD method.

Figure 4E:
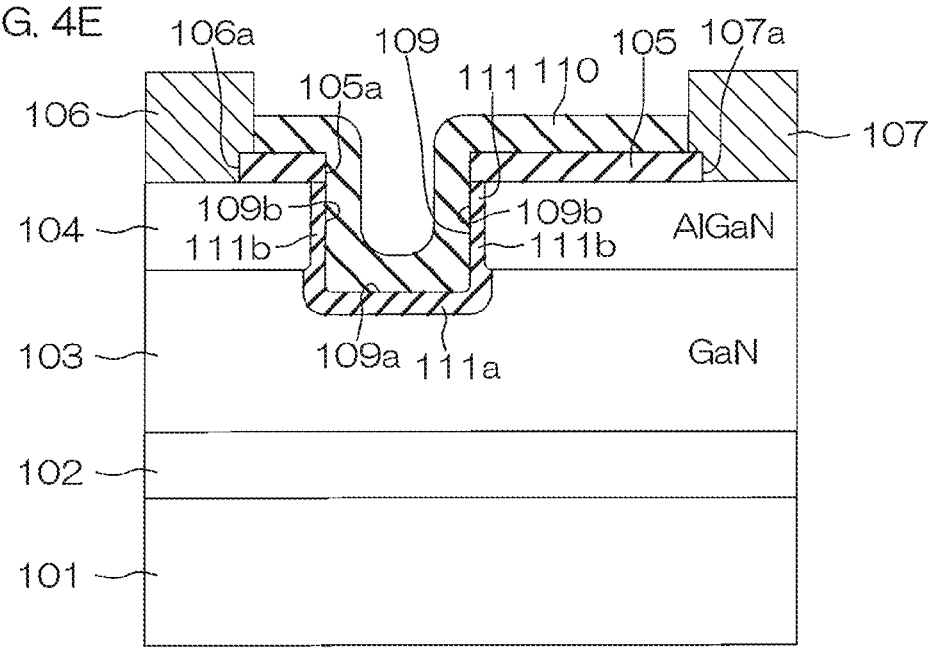
FIG. 4E is a schematic cross-sectional view showing the step subsequent to FIG. 4D.

Next, as shown in FIG. 4E, the source electrode 106 and the drain electrode 107 are formed. Specifically, the contact holes 106a and 107a passing through the gate insulating film 110 and the passivation film 105 are formed so as to correspond to the positions where the electrodes 106 and 107 are to be formed, and then the source electrode 106 and the drain electrode 107 are formed. The source electrode 106 and the drain electrode 107 are ohmic electrodes that are in ohmic contact with the two-dimensional electron gas 115 (see FIG. 1).

The step of forming the ohmic electrode includes the step of forming the multilayer metal film by sequentially depositing, for example, on the electron supply layer 104, the Ti layer (for example, 200 angstroms in thickness), the first Si layer (for example, 200 angstroms in thickness), the Al layer (for example, 2000 angstroms in thickness), the second Si layer (for example, 200 angstroms in thickness) and the Mo layer (for example, 2000 angstroms in thickness). The multilayer metal film is formed by sequentially evaporating or sputtering the constituent layers. Thereafter, a multilayer electrode film is patterned on the pattern of the source electrode 106 and the drain electrode 107. The patterning of the multilayer electrode film may be performed by lifting off or may be performed by etching. After the patterning, furthermore, sintering processing is performed, and thus the source electrode 106 and the drain electrode 107 in ohmic contact with the two-dimensional electron gas 115 are formed. The sintering processing is preferably performed such that the Al layer is melted, and is performed at a temperature (for example, 850° C.) higher than the melting point (565° C.) of Al. Specifically, the sintering processing is preferably performed at 850° C. for about 35 minutes.

Figure 4F:
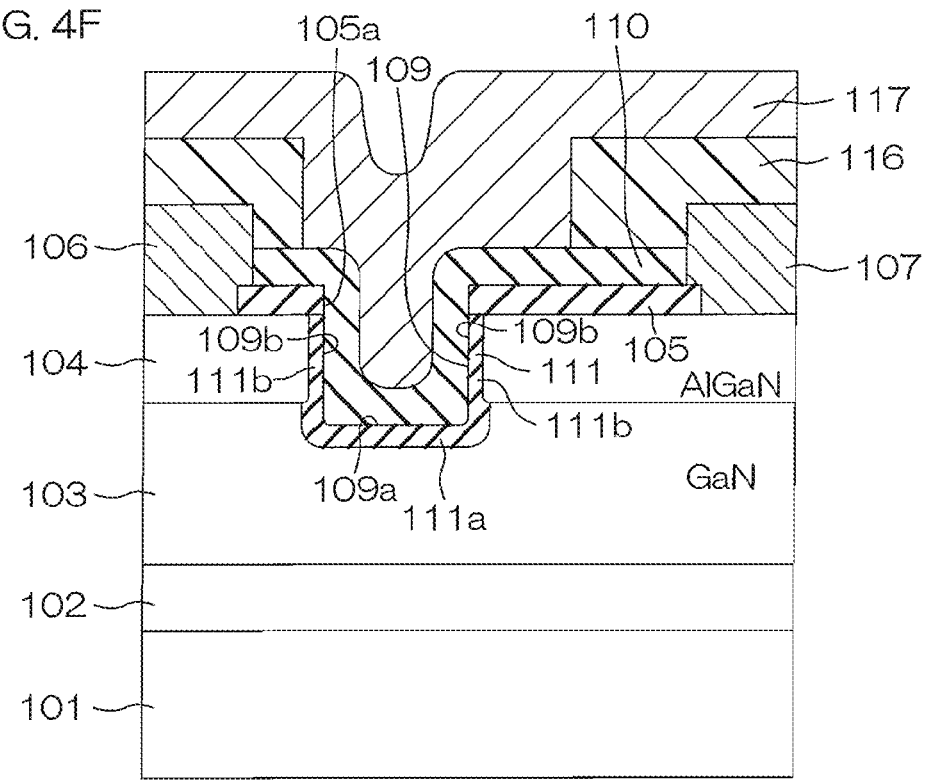
FIG. 4F is a schematic cross-sectional view showing the step subsequent to FIG. 4E.

Next, as shown in FIG. 4F, a resist film 116 having an opening in a position where the gate electrode 108 is to be formed is formed, and in this state, an electrode film 117 is formed so as to cover the entire surface. The opening of the resist film 116 includes a region of the opening 105a formed in the passivation film 105, and is formed in a region wider than the region of the opening 105a. The edge portion of the opening of the resist film 116 on the side of the drain electrode 107 is placed backward by the field plate length Lfp from the drain side end of the opening 105a of the passivation film 105 (more exactly, the position where the surface of the recess 109 crosses, on the drain side, the interface between the electron transit layer 103 and the electron supply layer 104) toward the drain electrode 107. The electrode film 117 is, for example, formed with a multilayer metal film obtained by depositing a lower layer made of Ni or Pt and an upper layer made of Au or Al, and is formed by sequentially evaporating the layers.

Next, together with the resist film 116, the electrode film 117 (an unnecessary part of the electrode film 117) on the resist film 116 is lifted off, and thus the electrode film 117 is patterned, with the result that the gate electrode 108 is obtained. In this way, the nitride semiconductor device having the structure shown in FIG. 1 can be obtained. Thereafter, the entire surface is covered with an interlayer insulating film, and contact holes for exposing the source electrode 106 and the drain electrode 107 are formed in the interlayer insulating film. Then, on the interlayer insulating film, a source wiring and a drain wiring are formed such that they are respectively connected with the source electrode 106 and the drain electrode 107 through the contact holes.

As described above, in this preferred embodiment, the thermal oxide film 111 is formed in the surface of the electron transit layer 103 exposed within the recess 109, and the gate insulating film 110 is in contact with the thermal oxide film 111. When etching for forming the recess 109 is performed, damage is given to the surface of the electron transit layer 103 at the bottom portion of the recess 109. This damage is removed in the thermal oxidization process for forming the thermal oxide film 111. More specifically, the thermal oxide film 111 is formed from the damaged surface toward the inside of the electron transit layer 103, with the result that the interface between the thermal oxide film 111 and the electron transit layer 103 is located in a region which is not damaged. Then, since a channel is formed in the interface that is not damaged, the electron mobility of the channel becomes an original or inherent value of the nitride semiconductor forming the electron transit layer 103. In this way, the recess 109 forming the electron supply layer 104 is made to reach the electron transit layer 103, and thus it is possible to reliably achieve a normally off-type and it is also possible to realize a HEMT structure in which the electron mobility in the channel is high.

In the configuration of this preferred embodiment, the exposed surface of the electron transit layer 103 within the recess 109 is selectively thermally oxidized, and thus it is possible to prevent the surface from being converted into an n-type, with the result that the threshold value can be increased. Hence, while the thickness (for example, 50 to 200 nm) of the electron transit layer 103 is relatively increased to acquire a high electron mobility, it is possible to provide the device having a high threshold value.

Figure 6A:
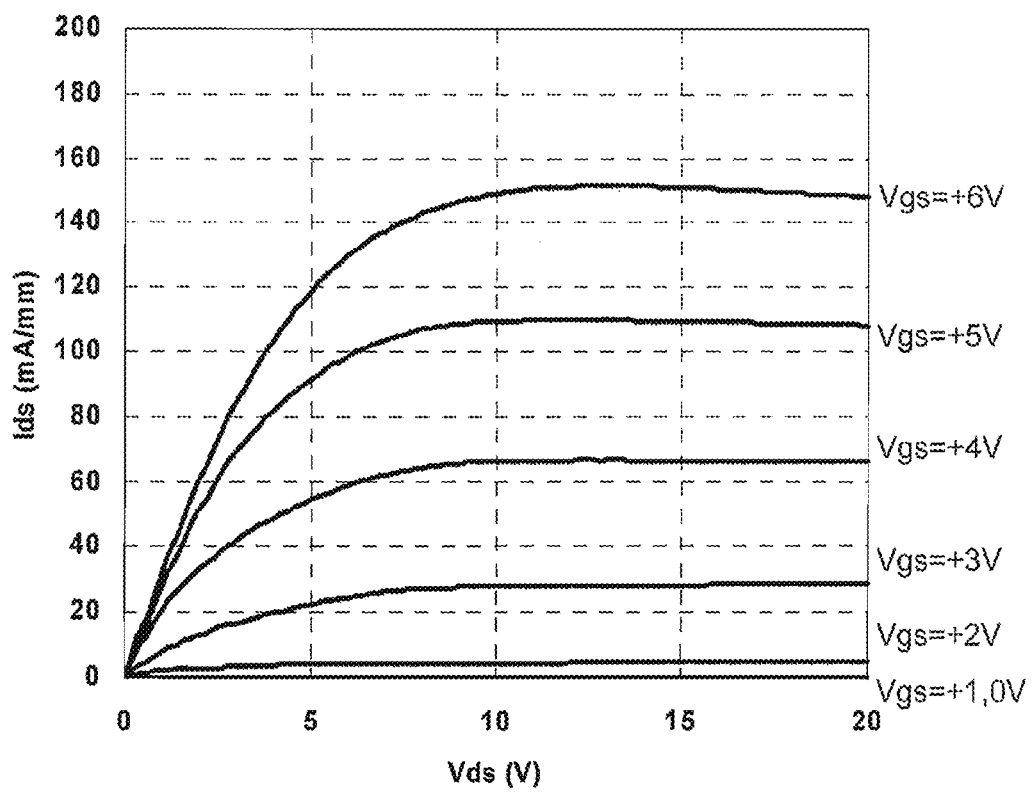
FIG. 6A is a characteristic diagram obtained by examining a relationship (Ids-Vds characteristics) between a drain current Ids and a drain voltage Vds for various gate voltages Vgs.
Figure 6B:
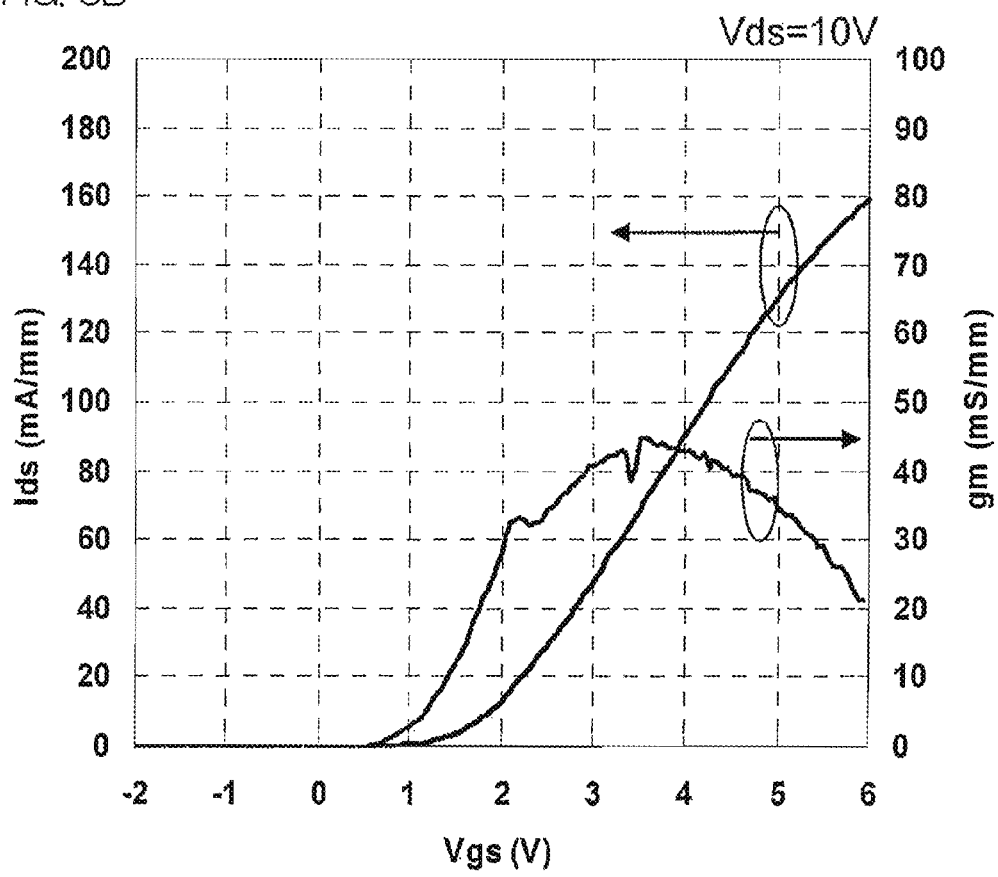
FIG. 6B shows transfer characteristics.
Figure 6C:
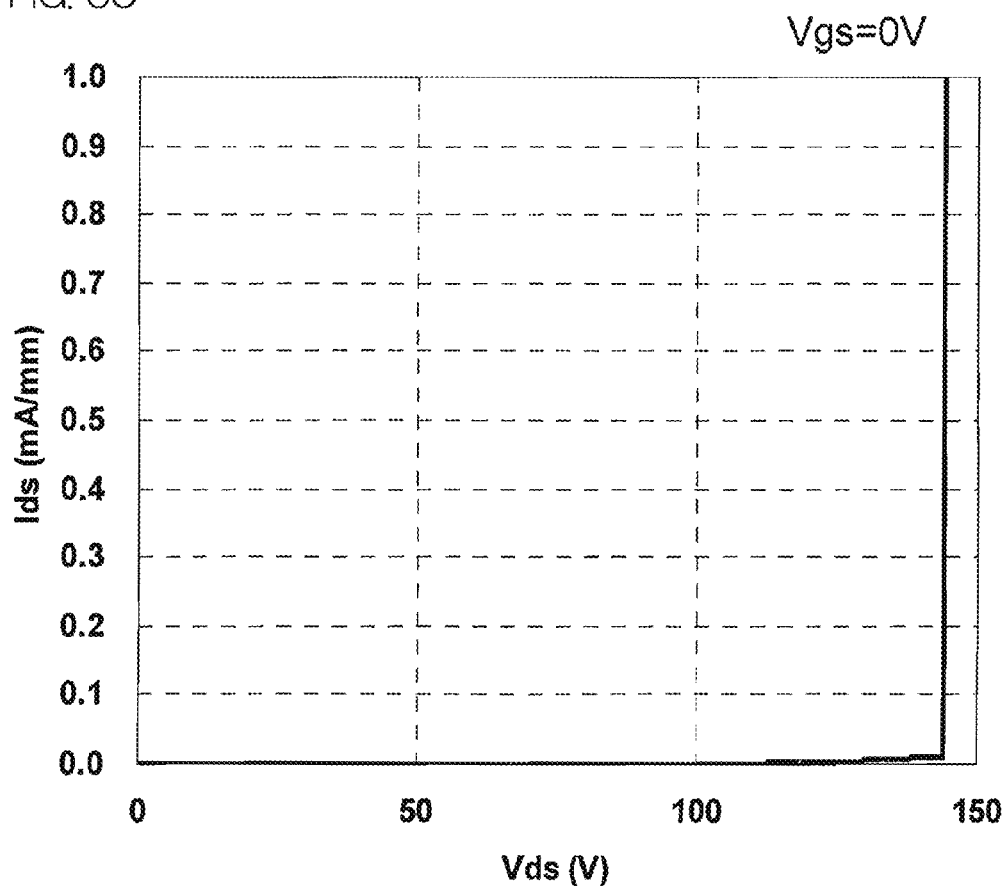
FIG. 6C shows voltage resistance characteristics (3-terminal off-state characteristics) in an off-state.

FIG. 6A is a characteristic diagram obtained by examining a relationship (Ids-Vds characteristics) between a drain current Ids and a drain voltage Vds for various gate voltages Vgs in the nitride semiconductor device having the structure described above. FIG. 6B shows transfer characteristics, and FIG. 6C shows voltage resistance characteristics (3-terminal off-state characteristics) in an off-state. A threshold voltage Vth is about 1.5 V and is a sufficiently high voltage value. The maximum value of the drain current Ids is 150 mA/mm, the maximum value of a mutual conductance gm is 45 mS/mm, the on-resistance Ron is 33 Ω·mm, and a voltage resistance $V_{BR}$ (breakdown voltage between the source and the drain in an off-state) is higher than 100 V.

Figure 7:
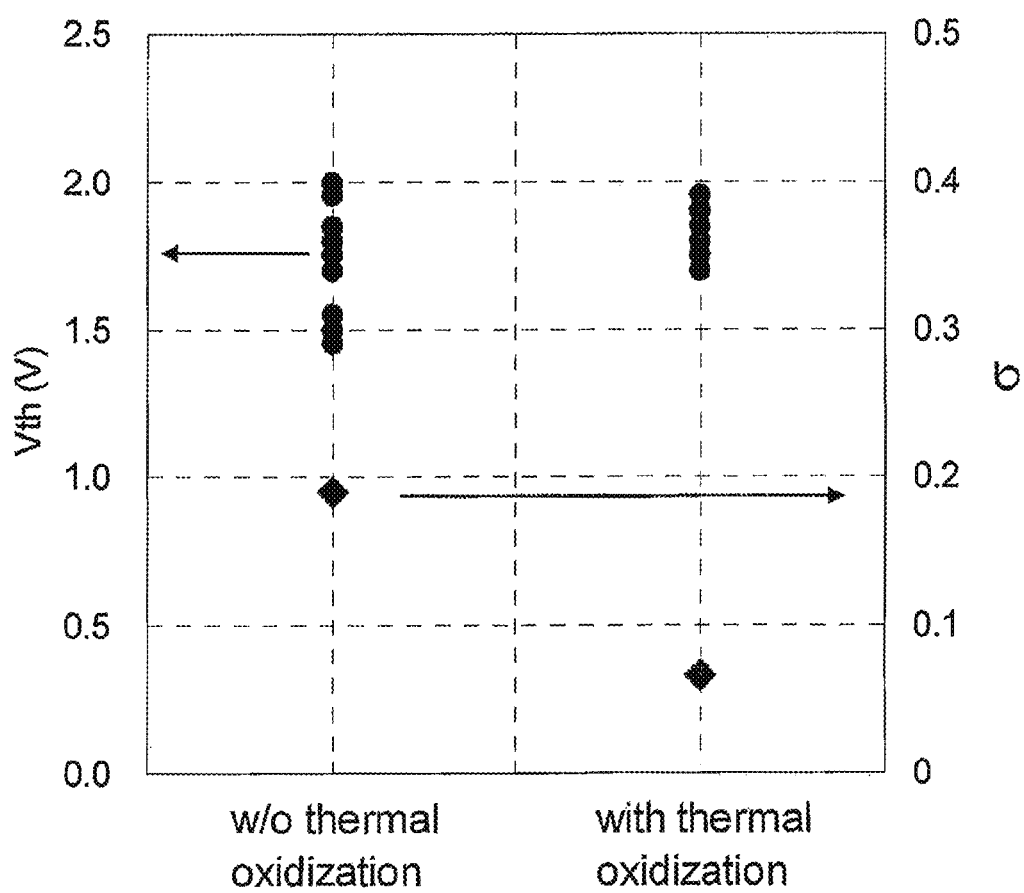
FIG. 7 shows variations in threshold value Vth for a plurality of samples (example and a comparative example) of the nitride semiconductor device.

FIG. 7 shows variations in the threshold value Vth for a plurality of samples of the nitride semiconductor device. In the samples (with thermal oxidization) of the nitride semiconductor device in the configuration of the present preferred embodiment, the threshold value Vth is 1.5 V or more, and the standard deviation σ indicating variations in the threshold value Vth is 0.06 V. By contrast, in a plurality of samples in a comparative example (w/o thermal oxidization)

whose configuration is the same as in the preferred embodiment described above except that the thermal oxidization processing (the formation of the thermal oxide film 111) after the recess was not performed, the threshold value Vth is often less than 1.5 V, significant variations in the threshold value Vth are produced and the standard deviation σ of the threshold value Vth is about 0.2 V. Hence, it is found that in the configuration of this preferred embodiment, it is possible to realize and stabilize a high threshold value Vth.

Variations of this preferred embodiment are possible as follows. For example, although in the preferred embodiment described above, the example where the electron transit layer 103 is formed with the GaN layer and the electron supply layer 104 is formed of AlGaN has been described, any other combination can be performed as long as the compositions (in particular, Al composition) of the electron transit layer 103 and the electron supply layer 104 are different. For example, examples of the combination of the electron transit layer 103/the electron supply layer 104 can include GaN/AlGaN, $Al_mGa_{1-m}N/Al_nGa_{1-n}N$ (where m≠n), AlGaN/AlInN, GaN/AlInN, GaN/AlN and AlGaN/AlN.

Although in the preferred embodiment described above, the gate insulating film 110 is formed with one insulating film made of $Al_2O_3$, the gate insulating film 110 may be formed by depositing two or more insulating films to further enhance breakdown voltage resistance.

Although in the preferred embodiment described above, as an example of the material of the substrate 1, silicon is indicated, any substrate material such as a sapphire substrate or a GaN substrate can be applied.

The features of a semiconductor device according to a second preferred embodiment of the present invention are as follows.

B1. According to this preferred embodiment, there is provided a nitride semiconductor device including: a substrate; an electron transit layer that is formed on the substrate, and that is formed of a nitride semiconductor; an electron supply layer that is formed on the electron transit layer, and that is formed of a nitride semiconductor whose composition is different from the electron transit layer; an AlGaN buffer layer that intervenes between the substrate and the electron transit layer, and that includes a high aluminum composition region whose aluminum composition is relatively high and a low aluminum composition region whose aluminum composition is lower than the high aluminum composition region and which is arranged in a region close to the electron transit layer as compared with the high aluminum composition region; and an element separation layer that is formed with a region whose resistance is increased by causing a crystal defect through ion implantation, and that passes through the electron supply layer and the electron transit layer to reach the AlGaN buffer layer.

In this configuration, the electron transit layer and the electron supply layer formed on the substrate are formed of nitride semiconductors having different compositions. Hence, a heterojunction is formed therebetween. In this way, in the vicinity of the interface between the electron transit layer and the electron supply layer, the two-dimensional electron gas is formed, and thus it is possible to form a device that utilizes the two-dimensional electron gas and that has a high mobility.

On the other hand, between the substrate and the electron transit layer, the AlGaN buffer layer is formed. Furthermore, the element separation layer passing through the electron supply layer and the electron transit layer reaches the AlGaN buffer layer. The element separation layer is formed with a region whose resistance is increased by causing a crystal defect in the nitride semiconductor by ion implantation. With the element separation layer, it is possible to perform element separation in the direction along the direction of the major surface of the substrate.

The AlGaN buffer layer includes a high aluminum composition region and a low aluminum composition region, and the low aluminum composition region is arranged in a region closer to the electron transit layer than the high aluminum composition region. Between the low aluminum composition region and the substrate, the high aluminum composition region intervenes, and thus variations in energy level in the direction of the thickness of the AlGaN buffer layer are reduced. Hence, since the thickness of the potential barrier is increased, it is possible to reduce the leak caused by a quantum tunneling effect. In this way, it is possible to interrupt the leak path via the buffer layer. In the configuration of Patent Document 1, the leak current of the element formed in a semiconductor operation region cannot be sufficiently reduced.

B2. The AlGaN buffer layer may be an AlGaN layer whose aluminum composition is adjusted such that as the AlGaN buffer layer approaches the electron transit layer in the direction of a layer thickness from the substrate toward the electron transit layer, the aluminum composition is decreased. The aluminum composition in the direction of the layer thickness may be stepwise changed or continuously changed.

B3. The AlGaN buffer layer may include a first aluminum composition AlGaN layer that has a first aluminum composition and a second aluminum composition AlGaN layer that is deposited on a side of the electron transit layer with respect to the first aluminum composition AlGaN layer and that has a second aluminum composition lower than the first aluminum composition, and in this case, the high aluminum composition region may include the first aluminum composition AlGaN layer, and the low aluminum composition region may include the second aluminum composition AlGaN layer.

B4. The nitride semiconductor device may further include an AlN buffer layer that intervenes between the AlGaN buffer layer and the substrate. The AlN buffer layer intervenes, and thus it is possible to prevent Ga in the AlGaN buffer layer from damaging the substrate (for example, silicon substrate). When the feature of item B4 is combined with the feature of item B3, a buffer layer is formed that has a structure where the AlN buffer layer, the first aluminum composition AlGaN layer and the second aluminum composition AlGaN layer are arranged sequentially from the substrate toward the electron transit layer. In this structure, between the AlN buffer layer and the second aluminum composition AlGaN layer of a relatively small aluminum composition, the first aluminum composition AlGaN layer of a relatively large aluminum composition intervenes. In this way, in the buffer layer, a trapezoidal potential barrier is formed in the direction of the thickness. Thus, it is possible to effectively reduce the leak current.

As described in B5, the element separation layer is preferably formed so as to surround an element region. In this way, since the element region is surrounded by the element separation layer, it is possible to reduce or prevent the leak between the inside and the outside of the element region.

B6. The nitride semiconductor device may further include a wiring that is arranged on the element separation layer. In this configuration, since the space of the element separation layer can be utilized to arrange the wiring, the configuration is advantageous in high integration. Moreover, since the element separation layer below the wiring is a high resistance layer thick enough to reach the AlGaN buffer layer, it is possible to reduce the parasitic capacitance, with the result that it is possible to perform a high-speed operation accordingly. Hence, while the leak in each of the element regions is being reduced, it is possible to provide the nitride semiconductor device capable of performing a high-speed operation.

B7. The element separation layer may be formed so as to separate a plurality of element regions, and an element-to-element wiring that connects between a plurality of elements formed in the element regions may be provided. In this configuration, while the leak in each of the element regions is being reduced, a plurality of elements respectively formed in a plurality of element regions are coupled, with the result that it is possible to form a large element which realizes a desired function.

B8. The elements respectively formed in the element regions may include two or more elements having different functions. In this way, while the leak in each of the element regions is being reduced, the elements of different functions are connected to each other, with the result that it is possible to form a large element which realizes a desired function.

B9. The elements respectively formed in the element regions may include two or more elements having a common function. In this way, while the leak in each of the element regions is being reduced, the elements of a common function are connected to each other, with the result that it is possible to form a large element which realizes a desired function (for example, the desired current capacity).

A plurality of elements that are respectively formed in the element regions may include a first element, a second element having the common function to the first element and a third element having a different function from the first element. In this way, by combining the element of the common function and the element of the different function, it is possible to form a large element having a desired function.

B10. The element separation layer may be formed so as to surround the element regions of the elements connected with the element-to-element wiring. In other words, the element separation layer may separate the individual element regions and surround the element regions of a plurality of elements connected with the element-to-element wiring. In this way, it is possible to separate, from the surrounding area, a large element in which the elements are connected with the element-to-element wiring. Thus, it is possible to further reduce the leak current.

B11. The element separation layer is preferably a high resistance layer that is formed by ion implantation using, as a material, an element whose mass number is less than 10 but more than 2. The crystal structure of the nitride semiconductor is broken by ion implantation to have a high resistance, and with the high resistance layer formed in this way, it is possible to form the element separation layer. It is difficult for an ion species using an element of a large mass number as a material to reach the deep position of the nitride semiconductor layer. Hence, in order to make an ion reach the AlGaN buffer layer, it is preferable to use an ion using, as a material, an element whose mass number is less than 10. On the other hand, an ion species using an element of a small mass number as a material cannot produce a sufficient crystal defect in the crystal structure of the nitride semiconductor, and for example, in the thermal processing step performed in a stage following the ion implantation, the crystal defect may be removed, with the result that it is likely that it is impossible to form a sufficiently large high resistance layer. Hence, in order to reliably increase the resistance of the nitride semiconductor layer, it is preferable to perform ion implantation using an ion species using, as a material, an element whose mass number is more than 2. Consequently, the element separation layer is formed by ion implantation using an ion using, as a material, an element whose mass number is more than 2 but less than 10, and thus it is possible to reduce the leak current.

B12. The element separation layer may be a high resistance layer that is formed by implantation of a helium ion. Since the helium ion is used, and thus it is possible to implant the ion into a deep position of the nitride semiconductor layer. For example, even when the electron transit layer is thick, it is possible to form the element separation layer which reaches the buffer layer. In this way, it is possible to reduce the leak current.

B13. The element separation layer may be a high resistance layer that is formed by ion implantation using a plurality of acceleration energies. By the ion implantation (multistage ion implantation) using a plurality of acceleration energy settings, it is possible to damage the nitride semiconductor crystal from a shallow region to a deep region in the surface on which the ion implantation is performed, with the result that it is possible to form the element separation layer having a high resistance value regardless of the position of depth. In this way, it is possible to provide the nitride semiconductor device in which the leak current is reduced.

B14. The element separation layer may be a high resistance layer that is formed by ion implantation from a direction inclined with respect to a direction of thickness of the electron transit layer. Since ions are made to easily collide with the atoms of the nitride semiconductor crystal by the ion implantation from an inclined direction, it is possible to accurately control the depth of the ion implantation. In this way, since the high resistance element separation layer is reliably formed, it is possible to provide the nitride semiconductor device in which the leak current is reduced.

B15. An inclination angle of the ion implantation direction with respect to the direction of the thickness of the electron transit layer is preferably 5 to 10 degrees. In this way, the depth of the ion implantation is accurately controlled, and thus it is possible to realize a high resistance element separation layer, with the result that it is possible to reduce the leak current.

B16. The electron transit layer is preferably formed of GaN, and the electron supply layer is formed of AlGaN. In this way, the electron transit layer and the electron supply layer have a heterojunction, and the two-dimensional electron gas is formed on the side of the electron transit layer in the vicinity of the interface therebetween. Thus, it is possible to form a device utilizing the high mobility of the electrons of the two-dimensional electron gas.

Examples of the combination of the electron supply layer/electron transit layer can include, in addition to AlGaN layer/GaN layer, AlGaN layer/AlGaN layer (where Al composition is different), AlInN layer/AlGaN layer, AlInN layer/GaN layer, AlN layer/GaN layer and AlN layer/AlGaN layer. More generally, the electron supply layer may include Al and N in its composition. The electron transit layer may include Ga and N in its composition, and the Al composition may be different from the electron supply layer. The electron supply layer and the electron transit layer are different in Al composition, and thus a lattice mismatch occurs therebetween, with the result that a carrier caused by polarization contributes to the formation of the two-dimensional electron gas.

B17. The electron transit layer is preferably a GaN layer having a thickness of 400 nm or more. Since the electron transit layer formed of GaN has a smooth and satisfactory surface state, it is possible to enhance the electron mobility. When the electron transit layer is a thin GaN layer, its surface state is not necessarily satisfactory, and it is likely that the mobility of the electrons of the two-dimensional electron gas formed in the vicinity of the GaN layer is affected by its surface state and is thereby lowered.

B18. Preferably, the nitride semiconductor device further includes a source electrode and a drain electrode that are arranged at an interval on the electron supply layer, and a gate electrode that is arranged opposite to the electron transit layer between the source electrode and the drain electrode. In this configuration, it is possible to control the two-dimensional electron gas immediately below the gate electrode by applying a control voltage to the gate electrode, with the result that it is possible to turn on and off between the source electrode and the drain electrode and to control the current value therebetween. In this way, it is possible to realize the HEMT (high-electron-mobility transistor) utilizing the high mobility of the electrons forming the two-dimensional electron gas.

B19. The gate electrode is preferably formed so as to surround the source electrode together with the element separation layer. In this way, an appropriate voltage is applied to the gate electrode, and thus it is possible to separate the two-dimensional electron gas between the side of the source electrode and the side of the drain electrode, with the result that an interruption can be made between the source and the drain.

B20. The nitride semiconductor device may further include an interlayer insulating film that covers the source electrode, the drain electrode and the gate electrode, a source wiring film that is connected to the source electrode via a source contact hole passing through the interlayer insulating film and that is arranged on the interlayer insulating film, and a drain wiring film that is connected to the drain electrode via a drain contact hole passing through the interlayer insulating film and that is arranged on the interlayer insulating film. The source wiring film and the drain wiring film may be formed in such a pattern that on the interlayer insulating film, the source wiring film and the drain wiring film mesh with each other in a comb tooth shape.

In this configuration, a plurality of source electrodes and a plurality of drain electrodes are alternately arranged in the shape of a stripe, and they can be respectively connected to the source wiring film and the drain wiring film. Then, the gate electrode can be arranged between a pair of the source electrode and the drain electrode adjacent to each other. In this way, since the source electrode and the drain electrode are opposite to each other via the gate electrode over a long range, the gate width (channel width) is increased, and thus it is possible to increase the current.

B21. The gate wiring connected to the gate electrode may be arranged on the element separation layer. In this way, since the gate electrode can be arranged on a thick insulating layer including the element separation layer, it is possible to reduce the capacity parasitic on the gate wiring. Thus, it is possible to provide the nitride semiconductor device of the HEMT structure where the leak current is reduced and a high-speed operation can be performed.

The wiring arranged on the element separation layer is not limited to the gate wiring connected to the gate electrode, and the source wiring connected to the source electrode and the drain wiring connected to the drain electrode may also be arranged on the element separation layer.

B22. There is provided a method of manufacturing a nitride semiconductor device, the method including a step of forming an AlGaN buffer layer by epitaxially growing an AlGaN crystal on a substrate such that an aluminum composition is relatively high in a region close to the substrate and is relatively low in a region away from the substrate, a step of forming an electron transit layer by epitaxially growing a nitride semiconductor on the AlGaN buffer layer, a step of forming an electron supply layer on the electron transit layer by epitaxially growing a nitride semiconductor layer whose composition is different from the electron transit layer and a step of forming a high resistance element separation layer that passes through the electron supply layer and the electron transit layer to reach the AlGaN buffer layer by breaking a crystal structure through ion implantation on the electron supply layer, the electron transit layer and the AlGaN buffer layer. By this method, it is possible to manufacture the nitride semiconductor device of the structure described in item B1.

B23. The step of forming the AlGaN buffer layer may include a step of forming a first aluminum composition AlGaN layer of a first aluminum composition, and a step of forming, in a higher position than a position of the first aluminum composition AlGaN layer, a second aluminum composition AlGaN layer of a second aluminum composition lower than the first aluminum composition. By this method, it is possible to manufacture the nitride semiconductor device of the structure described in item B3.

B24. The method may include a step of forming an AlN buffer layer on the substrate before the step of forming the AlGaN buffer layer such that the AlGaN buffer layer is formed on the AlN buffer layer. In this way, it is possible to manufacture the nitride semiconductor device of the structure described in item B4.

B25. The element separation layer may be formed so as to surround an element region. In this way, it is possible to manufacture the nitride semiconductor device of the structure described in item B5.

B26. The element separation layer may be formed so as to separate a plurality of element regions, and the method of manufacturing a nitride semiconductor device may further include a step of forming an element-to-element wiring that connects between elements respectively formed in the element regions. In this way, it is possible to manufacture the nitride semiconductor device of the structure described in item B7.

B27. The ion implantation is preferably performed using, as a material, an element whose mass number is less than 10 but more than 2. In this way, it is possible to manufacture the nitride semiconductor device of the structure described in item B11.

B28. The ion implantation is preferably performed using helium ions. In this way, it is possible to manufacture the nitride semiconductor device of the structure described in item B12.

B29. The ion implantation is preferably performed using a plurality of acceleration energies. In this way, it is possible to manufacture the nitride semiconductor device of the structure described in item B13.

B30. The ion implantation is preferably performed from a direction inclined with respect to a major surface of the substrate. In this way, it is possible to manufacture the nitride semiconductor device of the structure described in item B14.

B31. The ion implantation is preferably performed from a direction inclined at an angle of 5 to 10 degrees with respect to a normal direction to the major surface of the substrate. In this way, it is possible to manufacture the nitride semiconductor device of the structure described in item B15.

B32. The step of forming the electron transit layer preferably includes a step of epitaxially growing a GaN layer having a thickness of 400 nm or more. In this way, it is possible to manufacture the nitride semiconductor device of the structure described in item B17.

At least one of items B1 to B32 may be combined with at least one of items A1 to A25. In other words, it is possible to form a nitride semiconductor device obtained by arbitrarily combining the features of items B1 to B32 with the features of items A1 to A25.

This preferred embodiment will be described in detail below with reference to the accompanying drawings.

Figure 8:
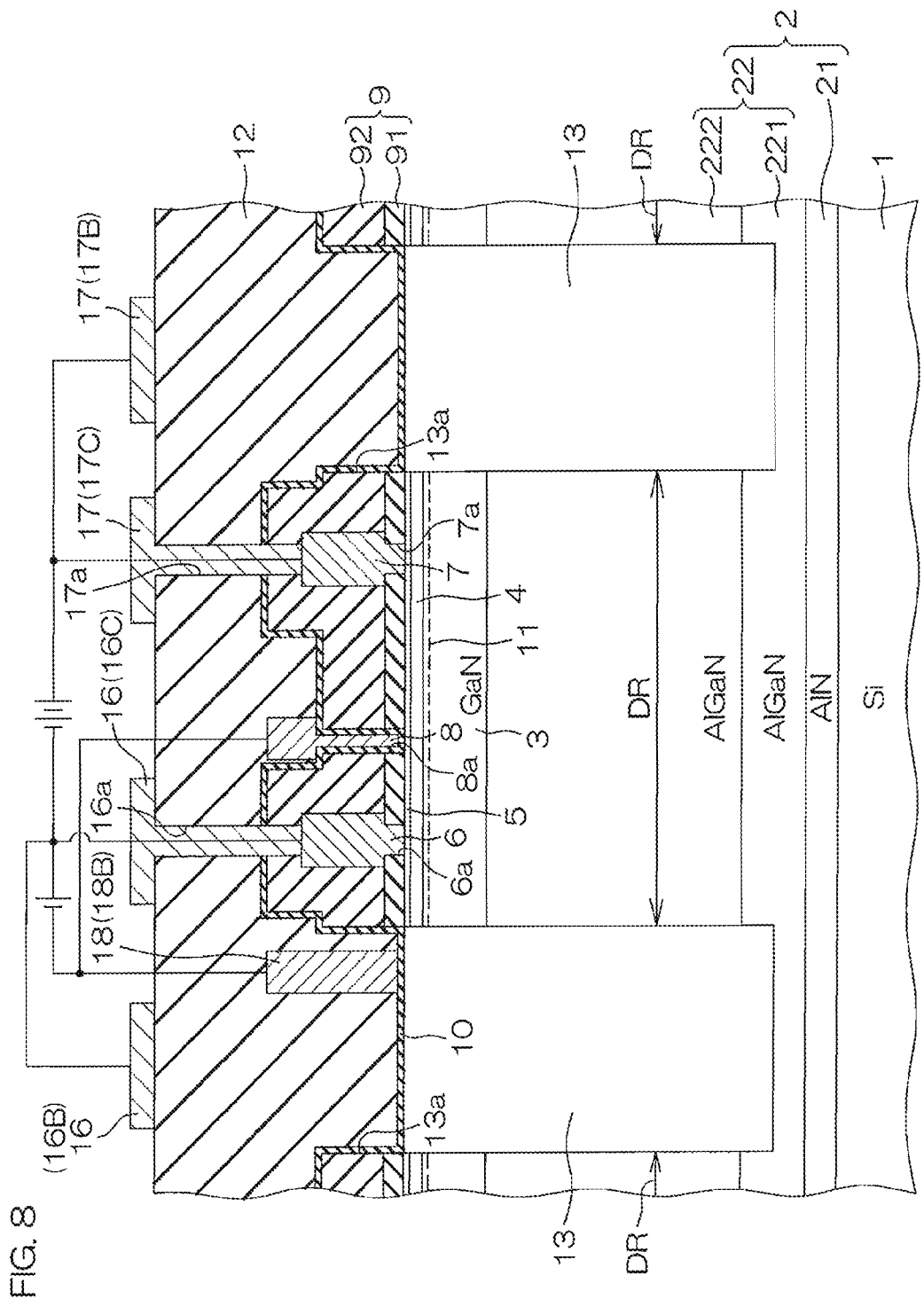
FIG. 8 is a schematic cross-sectional view (cross-sectional view taken along line VIII-VIII in FIG. 13) for illustrating the configuration of a nitride semiconductor device according to a preferred embodiment of the present invention.

FIG. 8 is a schematic cross-sectional view for illustrating the configuration of a nitride semiconductor device according to a preferred embodiment of the present invention.

This nitride semiconductor device includes a substrate 1 (for example, a silicon substrate), a buffer layer 2 that is formed on the surface of the substrate 1, an electron transit layer 3 that is epitaxially grown on the buffer layer 2, an electron supply layer 4 that is epitaxially grown on the electron transit layer 3 and a cap layer 5 that is epitaxially grown on the electron supply layer 4. This nitride semiconductor device further includes a source electrode 6 and a drain electrode 7 that are in ohmic contact with the electron supply layer 4 via the cap layer 5. The source electrode 6 and the drain electrode 7 are arranged at an interval in a direction parallel to a major surface of the electron supply layer 4, and the gate electrode 8 is arranged therebetween. The cap layer 5 is covered with the passivation film 9.

The passivation film 9 may be formed of silicon nitride (SiN), and it is appropriate that its film thickness is about a few hundred nanometers. In this preferred embodiment, the passivation film 9 has a two-layer structure in which a lower layer 91 and an upper layer 92 are present. In the lower layer 91, contact holes 6a and 7a are formed, and the source electrode 6 and the drain electrode 7 are respectively in contact with the cap layer 5 via the contact holes 6a and 7a. Furthermore, in the passivation film 9, an opening 8a in which the gate electrode 8 is embedded is formed to pass therethrough. The cap layer 5 that is exposed to the bottom surface of the opening 8a is covered with a gate insulating film 10. In this preferred embodiment, the gate insulating film 10 is continuously formed so as to cover not only the bottom surface of the opening 8a but also its side surface, and furthermore, the surface of the passivation film 9 outside the opening 8a. The gate electrode 8 is opposite to the cap layer 5 across the gate insulating film 10.

The gate insulating film 10 is an insulating film whose relative permittivity is higher than those of the electron supply layer 4 and the cap layer 5. The gate insulating film 10 may be an insulating film that is formed by an ALD (Atomic Layer Deposition) method. More specifically, the gate insulating film 10 is formed of, for example, $Al_2O_3$ (aluminum oxide, alumina), and its film thickness is preferably 5 to 50 nm (for example, 20 nm). In this way, it is possible to obtain a necessary breakdown voltage (for example, 20 V or more) and to reduce an on-resistance.

The surfaces of the gate electrode 8 and the passivation film 9 are covered with an interlayer insulating film 12. The interlayer insulating film 12 is formed with, for example, a $SiO_2$ film whose film thickness is about 1 μm. On the surface of the interlayer insulating film 12, a source wiring film 16 and a drain wiring film 17 are formed. The source wiring film 16 is connected to the source electrode 6 via a source contact hole 16a that is formed to pass through the interlayer insulating film 12, the gate insulating film 10 and the upper layer 92 of the passivation film 9. Likewise, the drain wiring film 17 is connected to the drain electrode 7 via a drain contact hole 17a that is formed to pass through the interlayer insulating film 12, the gate insulating film 10 and the upper layer 92 of the passivation film 9.

The electron transit layer 3 and the electron supply layer 4 are formed of a group-III nitride semiconductor (hereinafter simply referred to as a "nitride semiconductor") having a different composition. For example, the electron transit layer 3 may be formed with a GaN layer, and its thickness may be about 400 nm to 1 μm. In this preferred embodiment, the electron supply layer 4 is formed with an $Al_xGa_{1-x}N$ layer ($0<x<1$), and its thickness may be, for example, about 25 nm.

As described above, the electron transit layer 3 and the electron supply layer 4 are formed of a nitride semiconductor having a different composition to form a heterojunction, and a lattice mismatch occurs therebetween. Due to polarization caused by the heterojunction and the lattice mismatch, in a position (for example, a position of a distance of about a few angstroms from the interface) within the electron transit layer 3 near the interface between the electron transit layer 3 and the electron supply layer 4, a two-dimensional electron gas 11 caused by the polarization is spread.

The cap layer 5 is formed of GaN, which is a nitride semiconductor of the same composition as the electron transit layer 3, and its thickness is 16 nm or less (more preferably 8 nm or less, and for example, about 3 nm). The cap layer 5 contributes to the improvement of the surface morphology of the nitride semiconductor layer. In other words, since on the surface of the electron transit layer 3 formed of GaN, the electron supply layer 4 formed of AlGaN whose lattice constant is different is formed, and moreover, AlGaN is a ternary crystal, its crystallinity is not necessarily satisfactory. Hence, when the electron supply layer 4 is the uppermost surface of the nitride semiconductor layer, the surface morphology is not necessarily satisfactory, and the properties of the device are not stable accordingly. Hence, the cap layer 5 of the same composition as the electron transit layer 3 is deposited on the electron supply layer 4, and thus the surface morphology of the nitride semiconductor layer can be improved, with the result that the properties of the device can be enhanced. However, when the thickness of the cap layer 5 is excessively increased, since the effect of improving the surface morphology is reduced, and the ohmic contacts of the source electrode 6 and the drain electrode 7 are adversely affected, its thickness is preferably 16 nm or less (more preferably 8 nm or less). It may be assumed that the cap layer 5 is part of the electron supply layer, and therefore, it can be said that the cap layer 5 together with the electron supply layer 4 form an electron supply layer.

In this preferred embodiment, the buffer layer 2 includes an AlN buffer layer 21 in contact with the substrate 1 and an AlGaN buffer layer 22 deposited on the AlN buffer layer 21. The thickness of the AlN buffer layer 21 is, for example, about 0.1 μm. The AlGaN buffer layer 22 includes a first AlGaN layer 221 deposited on the AlN buffer layer 21 and a second AlGaN layer 222 deposited on the first AlGaN layer 221. On the second AlGaN layer 222, the electron transit layer 3 is formed. The first AlGaN layer 221 and the second AlGaN layer 222 have different compositions. More specifically, the first AlGaN layer 221 and the second AlGaN layer 222 have different aluminum compositions. In other words, the aluminum composition x1 (0<x1<1) of $Al_{x1}Ga_{1-x1}N$ forming the first AlGaN layer 221 is larger than the aluminum composition x2 (0<x2<x1<1) of $Al_{x2}Ga_{1-x2}N$ forming the second AlGaN layer 222. In other words, the AlGaN buffer layer 22 includes the first AlGaN layer 221 and the second AlGaN layer 222 which are laminated in such an order that as they approach the electron transit layer 3, the aluminum compositions are decreased. The total thickness of the first AlGaN layer 221 and the second AlGaN layer 222 may be, for example, about 1 μm. More specifically, the thickness of the first AlGaN layer 221 may be about 0.2 μm, and the thickness of the second AlGaN layer 222 may be about 0.8 μm.

The first AlGaN layer 221 is a first aluminum composition AlGaN layer (high aluminum composition region) of a first aluminum composition, and the second AlGaN layer 222 is a second aluminum composition AlGaN layer (low aluminum composition region) of a second aluminum composition smaller than the first aluminum composition. The AlGaN buffer layer 22 can be said to be an AlGaN layer whose aluminum composition is adjusted such that as the AlGaN buffer layer 22 approaches the electron transit layer 3 in the direction of the thickness of the layer from the substrate 1 toward the electron transit layer 3, the aluminum composition is decreased.

The nitride semiconductor layer formed on the substrate 1 is divided into a plurality of element regions DR. Each of the element regions DR is electrically separated from the other element regions DR with an element separation layer 13. In this preferred embodiment, the element separation layer 13 passes through the cap layer 5, the electron supply layer 4 and the electron transit layer 3 to reach the buffer layer 2. More specifically, the element separation layer 13 extends in the direction of the thickness of the electron transit layer 3, and is formed to reach a position of a predetermined depth (for example, about 1.1 μm) from the surface of the cap layer 5. In this preferred embodiment, the element separation layer 13 reaches a depth exceeding the interface between the first AlGaN layer 221 and the second AlGaN layer 222, and its bottom portion is located within the first AlGaN layer 221. In this preferred embodiment, the element separation layer 13 is a high resistance layer whose resistance is increased by breaking the crystal structure of the nitride semiconductor through ion implantation and thereby causing a crystal defect.

The element separation layer 13 is formed so as to surround the individual element regions DR. Within the element regions DR, the HEMT (high-electron-mobility transistor) structure is formed. In other words, within each of the element regions DR, the gate electrode 8 is located between the source electrode 6 and the drain electrode 7, and the gate electrode 8 is opposite to the electron transit layer 3 (more specifically, the two-dimensional electron gas 11) across the gate insulating film 10.

On the element separation layer 13, an opening 13a is formed. The bottom surface and the side surface of the opening 13a are also covered with the gate insulating film 10. On the element separation layer 13, via the gate insulating film 10, a gate wiring film 18 is arranged. The gate wiring film 18 is connected to the gate electrode 8. In this preferred embodiment, the gate electrodes 8 arranged in a plurality of the element regions DR are connected in common to the gate wiring film 18.

Figure 9:
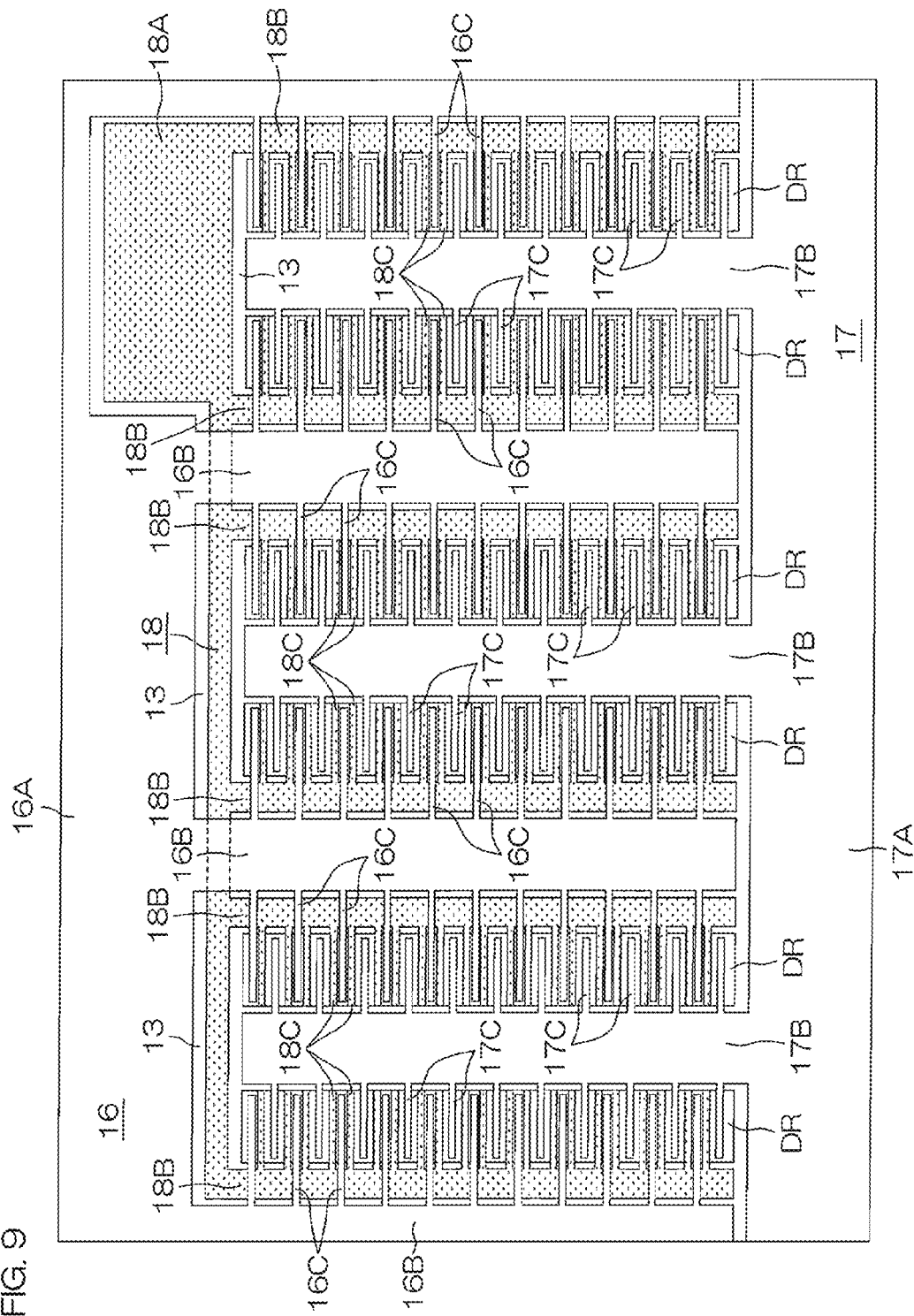
FIG. 9 is a schematic plan view for illustrating the overall configuration of a chip of the nitride semiconductor device according to the preferred embodiment, and shows the configuration by seeing through an interlayer insulating film.
Figure 10:
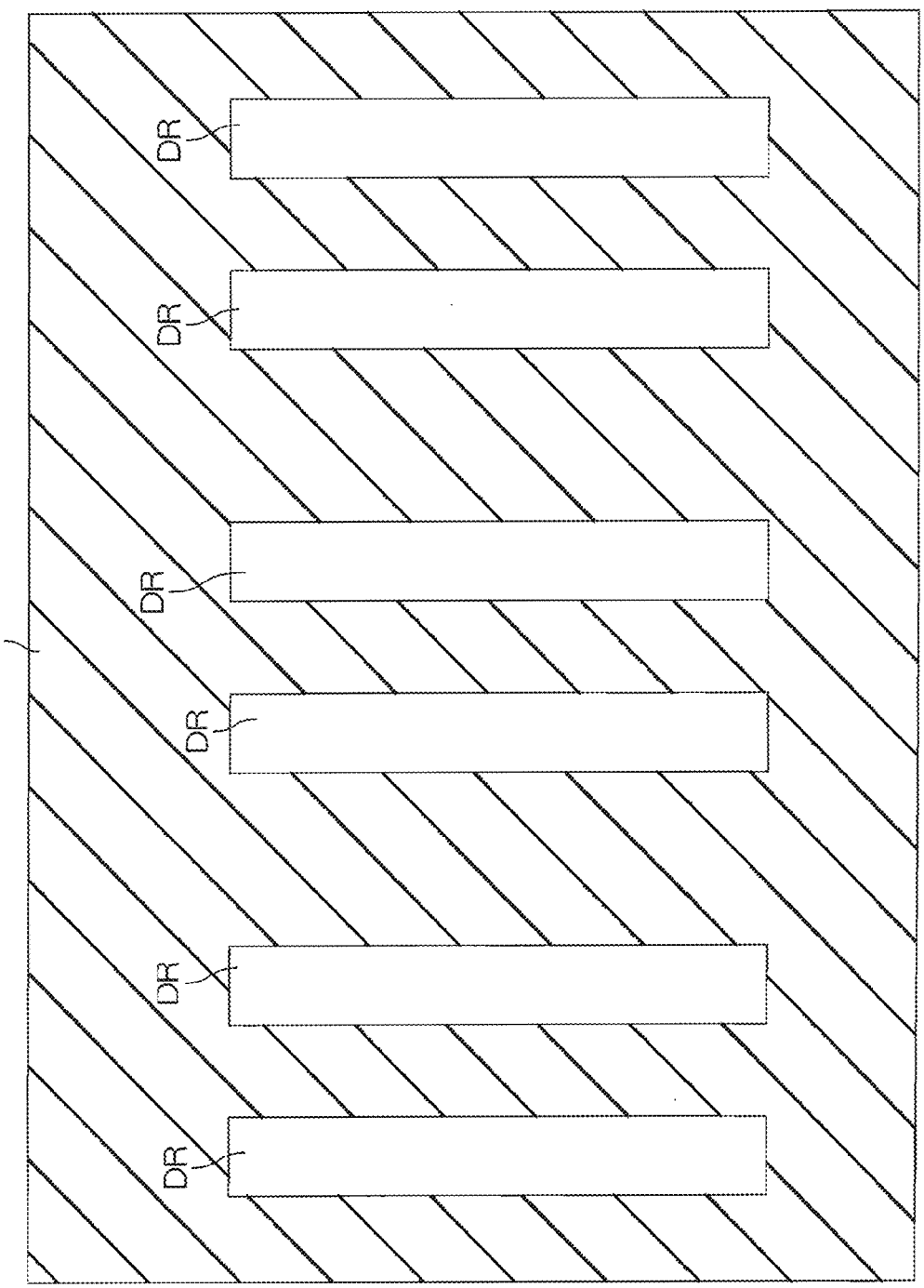
FIG. 10 is a schematic plan view for illustrating the arrangement of an element separation layer and element regions.
Figure 11:
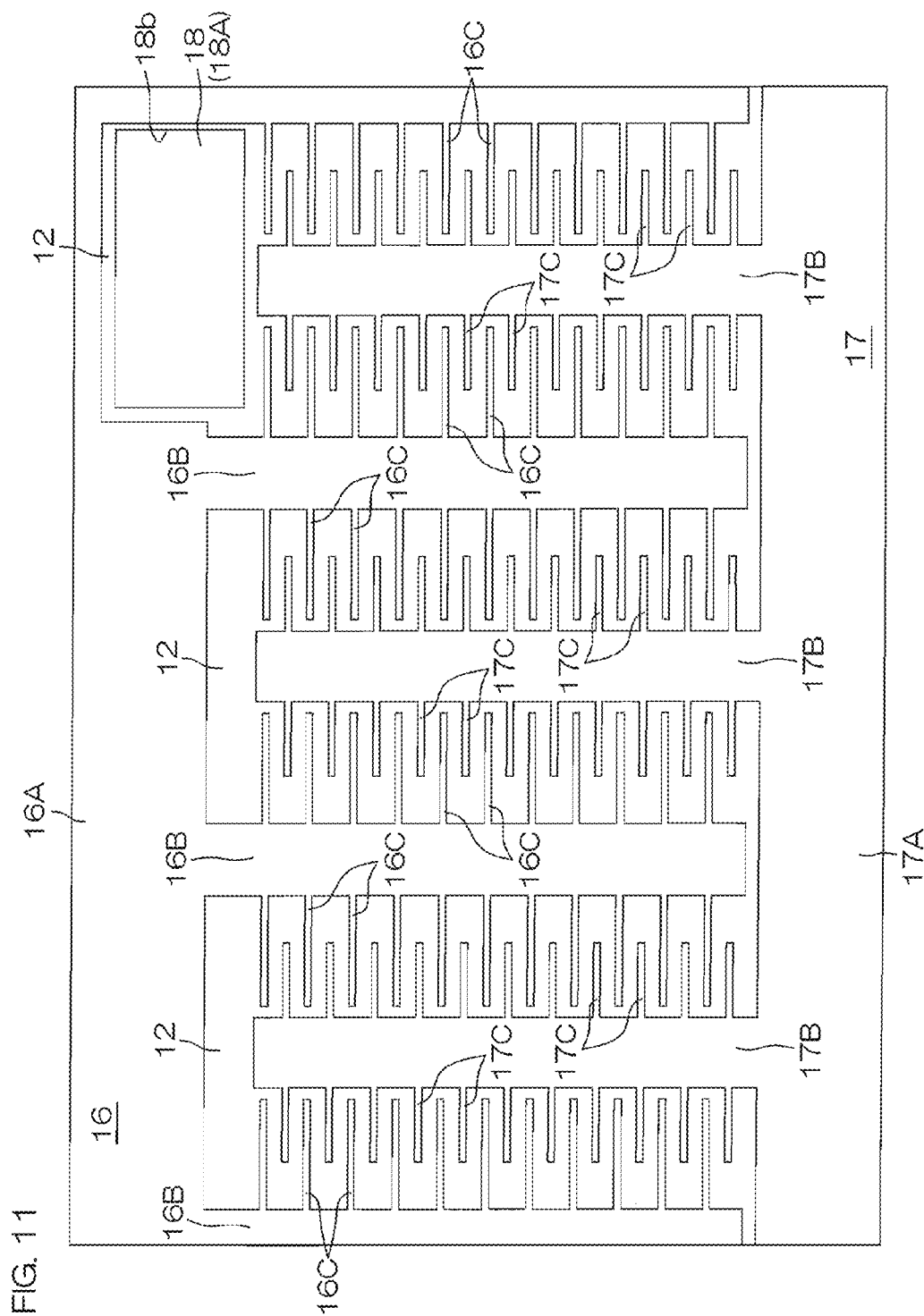
FIG. 11 is a schematic plan view for illustrating the arrangement of a source wiring film and a drain wiring film.
Figure 12:
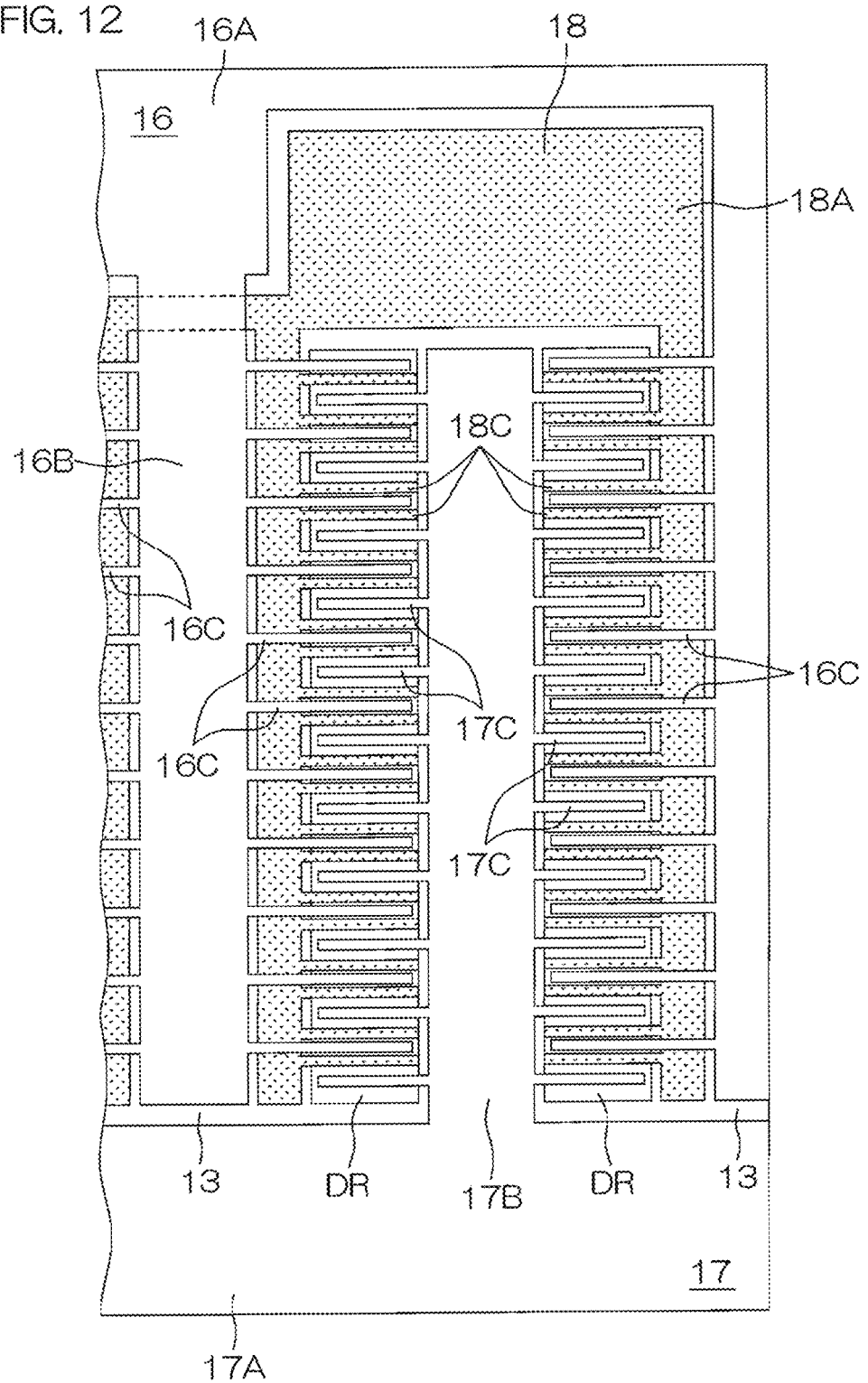
FIG. 12 is an enlarged plan view of a part of FIG. 9, and shows the configuration by seeing through the interlayer insulating film as in FIG. 9.

FIG. 9 is a schematic plan view for illustrating the overall configuration of a chip of the nitride semiconductor device according to this preferred embodiment, and shows the configuration by seeing through the interlayer insulating film 12. FIG. 10 is a schematic plan view for illustrating the arrangement of the element separation layer 13 and the element regions DR. Furthermore, FIG. 11 is a schematic plan view for illustrating the arrangement of the source wiring film 16 and the drain wiring film 17. FIG. 12 is an enlarged plan view of a part of FIG. 9, and shows the configuration by seeing through the interlayer insulating film 12 as in FIG. 9.

As shown most clearly in FIG. 10, the element region DR is a long rectangular (belt-shaped) region that extends in a predetermined direction. The belt-shaped element regions DR extend parallel to each other, and are formed in the shape of a stripe. The element separation layer 13 (in FIG. 10, indicated by oblique lines for clarity) is arranged in the region other than the element regions DR so as to edge the element regions DR. In other words, the element separation layer 13 is arranged so as to surround each of the element regions DR and to surround the element regions DR as a whole. The element region DR is an active region that contributes to the operation of the device by movement of electrons. By contrast, the region of the element separation layer 13 is a high-resistance region that inhibits the movement of electrons, and a non-active region that does not contribute to the operation of the device.

As shown most clearly in FIG. 11, on the interlayer insulating film 12, the source wiring film 16 and the drain wiring film 17 are formed so as to mesh with each other in a comb tooth shape. More specifically, the source wiring film 16 includes a source pad portion 16A for external connection, a plurality of source bus connection portions 16B that extend from the source pad portion 16A parallel to each other and a plurality of source branch-shaped portions 16C that protrude from the source bus connection portions 16B. In a plan view, the source pad portion 16A is formed in the shape of a long rectangle that is formed along one side of the rectangular nitride semiconductor device. The source bus connection portions 16B are formed in the shape of long rectangles extending parallel to the element regions DR, and are formed on the element separation layer 13 between the adjacent element regions DR. From a pair of sides of the source bus connection portion 16B along its longitudinal direction, in a vertical direction with respect to the sides, the source branch-shaped portions 16C extend to both sides of the element regions DR over the substantially entire width of the element regions DR. Likewise, the drain wiring film 17 includes a drain pad portion 17A for external connection, a plurality of drain bus connection portions 17B that extend from the drain pad portion 17A parallel to each other and a plurality of drain branch-shaped portions 17C that protrude from the drain bus connection portions 17B. The drain pad portion 17A is formed in the shape of a long rectangle that is formed along one side on the opposite side to the source pad portion 16A of the nitride semiconductor device. The drain bus connection portions 17B are formed in the shape of long rectangles extending parallel to the element regions DR, and are formed on the element separation layer 13 between the adjacent element regions DR. From a pair of sides of the drain bus connection portions 17B along its longitudinal direction, in a vertical direction with respect to the sides, the drain branch-shaped portions 17C extend to both sides of the element regions DR over the substantially entire width of the element regions DR.

In the region on the element separation layer 13 located between the element regions DR, the source bus connection portions 16B and the drain bus connection portions 17B are alternately arranged, and thus the source bus connection portions 16B and the drain bus connection portions 17B mesh with each other in a comb tooth shape. Furthermore, within each of the element regions DR, the source branch-shaped portions 16C and the drain branch-shaped portions 17C are alternately arranged in the longitudinal direction of the element region DR, and they mesh in a comb tooth shape.

On the other hand, the gate wiring film 18 includes a gate pad portion 18A and a gate bus connection portion 18B. In the vicinity of one end portion of the source pad portion 16A, a substantially rectangular cutout is formed, and the gate pad portion 18A is arranged so as to correspond to the cutout. In the interlayer insulating film 12, an opening 18b (see FIG. 11) for exposing the gate pad portion 18A is formed. The gate bus connection portion 18B is routed and arranged on the element separation layer 13 so as to be located between the source wiring film 16 and the element region DR in a plan view. The gate bus connection portion 18B extends along one side of the element region DR along its longitudinal direction. A plurality of gate electrodes 8 extend in the shape of branches parallel to each other, from the gate bus connection portion 18B toward the element region DR, along a direction perpendicular to the longitudinal direction of the element region DR, and are spread over the entire width of the element region DR.

The source wiring film 16 is formed on the interlayer insulating film 12 whereas the gate wiring film 18 is formed below the interlayer insulating film 12. Hence, although they may be arranged to overlap each other, in this preferred embodiment, in a plan view, the source pad portion 16A, the source bus connection portions 16B and the drain wiring film 17 are arranged so as not to overlap the gate wiring film 18. However, the source branch-shaped portions 16C are arranged to pass through an upper portion of the gate wiring film 18 and reach the element regions DR.

The source electrodes 6 respectively formed in a plurality of the element regions DR are connected in common to the source wiring film 16. The drain electrodes 7 respectively formed in a plurality of the element regions DR are connected in common to the drain wiring film 17. Furthermore, as described above, the gate electrodes 8 respectively formed in a plurality of the element regions DR are connected in common to the gate wiring film 18. In this way, the HEMT elements formed in the element regions DR are connected to each other with the source wiring film 16, the drain wiring film 17 and the gate wiring film 18. Hence, the source wiring film 16, the drain wiring film 17 and the gate wiring film 18 are an example of an element-to-element wiring that connects a plurality of elements. In this preferred embodiment, the HEMT elements having the common function are formed in a plurality of the element regions DR, and they are connected to each other with the element-to-element wiring.

The element separation layer 13 surrounds the individual element regions DR, and surrounds, as a whole, a plurality of element regions DR which include a plurality of elements, respectively, connected to each other through the element-to-element wiring formed by the source wiring film 16, the drain wiring film 17 and the gate wiring film 18.

Figure 13:
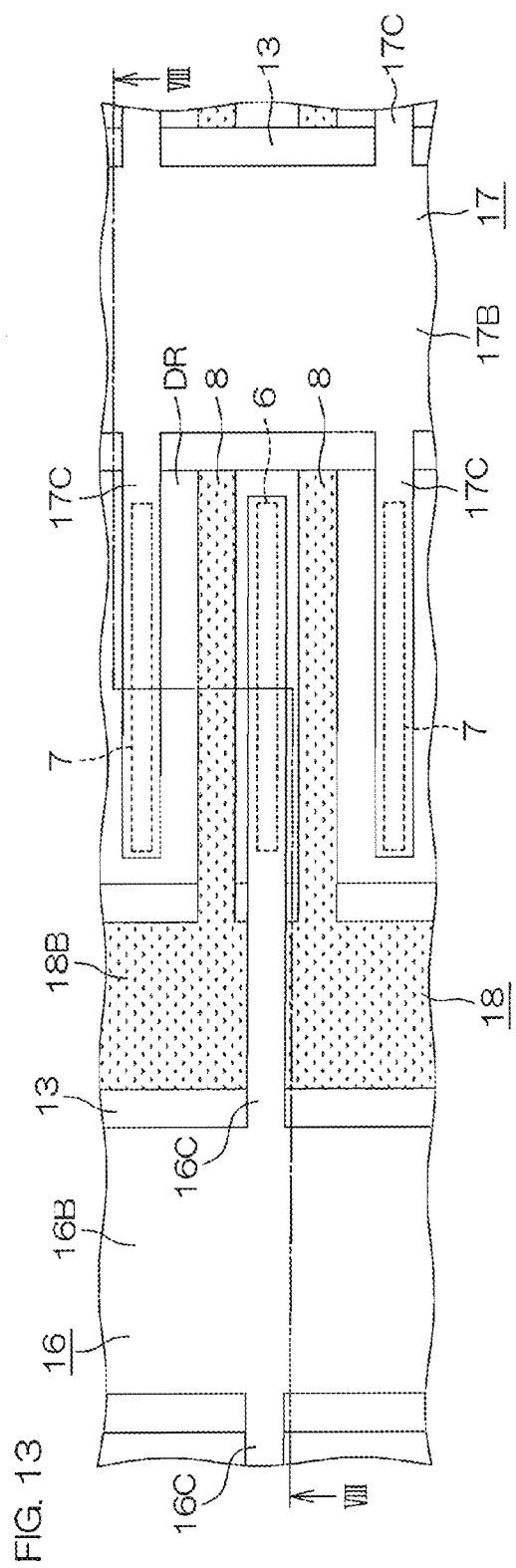
FIG. 13 is a partially enlarged plan view for illustrating a configuration within the element region.

FIG. 13 is a partially enlarged plan view for illustrating the configuration within the element region DR. FIG. 8 shows a cross section taken along cut surface line VIII-VIII in FIG. 13.

Within the element region DR, the source branch-shaped portion 16C is connected via the source contact hole 16a (see FIG. 8) to the source electrode 6, and the drain branch-shaped portion 17C is connected via the drain contact hole 17a (see FIG. 8) to the drain electrode 7.

The source electrode 6 and the drain electrode 7 are formed in the shape of a belt extending in a width direction perpendicular to the longitudinal direction of the element region DR. A plurality of source electrodes 6 and a plurality of drain electrodes 7 are alternately aligned, with a predetermined distance, one by one in the longitudinal direction of the element region DR. Furthermore, each of the gate electrodes 8 is arranged between the source electrode 6 and the drain electrode 7. The gate electrode 8 extends in the direction of the width of the element region DR over the entire width of the element region DR. More specifically, the opening 8a (see FIG. 8) in which the gate electrode 8 is embedded is spread over the entire width of the element region DR. In this way, the gate electrode 8 surrounds the source electrode 6 together with the element separation layer 13. In this way, when a predetermined interruption voltage is applied to the gate electrode 8, the two-dimensional electron gas 11 can be separated into the side of the source electrode 6 and the side of the drain electrode 7 immediately below the gate electrode 8. The source electrode 6 and the drain electrode 7 do not need to extend over the entire width of the element region DR.

The distance between the gate electrode 8 and the source electrode 6 is shorter than the distance between the gate electrode 8 and the drain electrode 7. In other words, in the vicinity of the source electrode 6, the gate electrode 8 is formed along the source electrode 6. In this way, the electric field between the gate electrode 8 and the drain electrode 7 is alleviated, and the voltage resistance is enhanced.

As shown in FIG. 8, a positive bias is applied to the drain electrode 7 with the potential of the source electrode 6 being a reference (zero potential). When in this state, a negative control voltage is applied to the gate electrode 8, the two-dimensional electron gas 11 disappears immediately below the gate electrode 8, with the result that an interruption occurs between the source and the drain. When the negative control voltage is removed from the gate electrode 8, the two-dimensional electron gas 11 appears immediately below the gate electrode 8, and this serves as a channel to make a connection between the source and the drain.

Figure 14C:
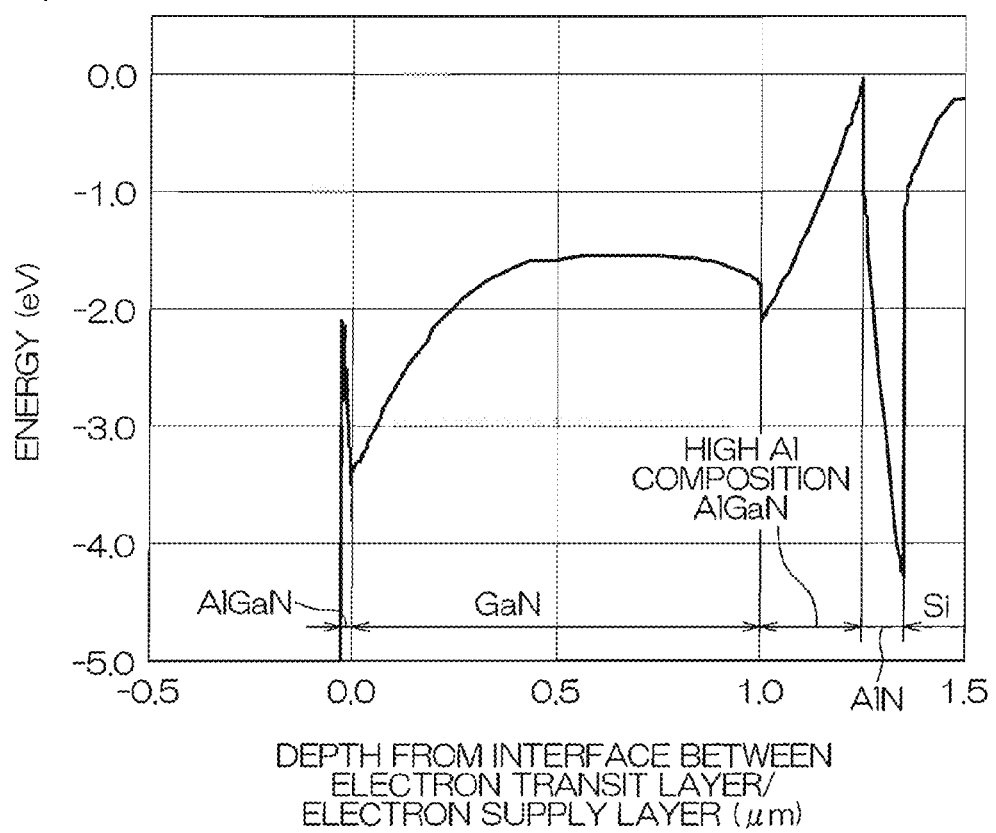
FIG. 14C is a similar band diagram when in the comparative example, the thickness of the AlGaN buffer layer formed with a single layer of the AlGaN layer is decreased and the thickness of an electron transit layer is increased.

FIG. 14A is a band diagram showing energy levels at a plurality of parts in the direction (normal direction to the major surface of the substrate 1) of the thickness of the nitride semiconductor device. More specifically, FIG. 14A is a band diagram on the example where the AlGaN buffer layer 22 is formed with the first AlGaN layer 221 (for example, $Al_{0.25}Ga_{0.75}N$) of high aluminum composition and the second AlGaN layer 222 (for example, $Al_{0.08}Ga_{0.92}N$) of low aluminum composition. FIG. 14B is a similar band diagram on the structure of the comparative example where the AlGaN buffer layer 22 is formed with only the AlGaN layer (for example, $Al_{0.25}Ga_{0.75}N$) of high aluminum composition. Furthermore, FIG. 14C is a similar band diagram when in the comparative example described above, the thickness of the AlGaN buffer layer 22 formed with a single layer of the AlGaN layer (for example, $Al_{0.25}Ga_{0.75}N$) is decreased and the thickness of the electron transit layer 3 is increased (for example, about 1 μm).

As shown in FIGS. 14A, 14B and 14C, the energy level within the AlN buffer layer 21 is rapidly increased as approaching from the substrate 1 (for example, silicon substrate) toward the AlGaN buffer layer 22. On the other hand, in the comparative example shown in FIG. 14B, the energy level in the AlGaN buffer layer 22 formed with the AlGaN single layer of high aluminum composition draws a large downwardly convex parabola to connect between the AlN buffer layer 21 and the electron transit layer 3. Hence, in the vicinity of the interface between the AlN buffer layer 21 and the AlGaN buffer layer 22, a sharp triangular potential barrier is formed. Electrons pass through the triangular potential barrier by the quantum tunneling effect, and thus a leak current is produced.

In the comparative example shown in FIG. 14C, since the electron transit layer 3 formed of GaN is increased in thickness, although the lowest energy level of the AlGaN buffer layer 22 is high, as in the comparative example shown in FIG. 14B, in the vicinity of the interface between the AlN buffer layer 21 and the AlGaN buffer layer 22, a sharp triangular potential barrier appears. Hence, as in the case of the comparative example shown in FIG. 14B, a leak current is produced by the quantum tunneling effect.

In the inventive example shown in FIG. 14A, in addition to the first AlGaN layer 221 of high aluminum composition, the second AlGaN layer 222 of low aluminum composition is provided, and thus the energy level in the part of the first AlGaN layer 221 (high aluminum composition region) is increased. Consequently, between the AlN buffer layer 21 and the second AlGaN layer 222 (low aluminum composition region), a trapezoidal potential barrier is formed. Since the trapezoidal potential barrier prevents the passage of electrons caused by the quantum tunneling effect, a depletion layer in the vicinity of the interface between the AlN buffer layer 21 and the AlGaN buffer layer 22 is widened, and thus it is possible to increase the resistance. In this way, it is possible to reduce or prevent the leak current.

FIGS. 15A, 15B and 15C are diagrams for illustrating features on the thickness of the electron transit layer 3 formed with the GaN layer, and are optical micrographs of the surface of the GaN layer epitaxially grown to various thicknesses. FIG. 15A shows a state of the surface when the GaN layer is epitaxially grown until its thickness reaches 0.1 µm, FIG. 15B shows a state of the surface when the GaN layer is epitaxially grown until its thickness reaches 0.4 µm, and FIG. 15C shows a state of the surface when the GaN layer is epitaxially grown until its thickness reaches 1.0 µm.

In the GaN layer (FIG. 15A) having a thickness of 0.1 µm, hexagonal projections and recesses appear in the surface, and thus sufficient smoothness cannot be obtained. In the GaN layers (FIGS. 15B and 15C) having a thickness of 0.4 µm and a thickness of 1.0 µm, the surface is smooth, smoothness necessary for obtaining high electron mobility is obtained and the GaN layer (FIG. 15C) having a thickness of 1.0 µm provides a more smooth surface.

The two-dimensional electron gas 11 is formed near the surface of the electron transit layer 3, and electrons forming the two-dimensional electron gas 11 contribute to the operation of the device. Thus, the smoothness of the surface of the electron transit layer 3 affects the mobility of electrons. Hence, the electron transit layer 3 is formed with a GaN layer whose thickness is 0.4 µm (400 nm) or more, and thus it is possible to make the surface of the electron transit layer 3 sufficiently smooth, and it is possible to provide a device capable of performing a high-speed operation accordingly.

FIGS. 16A to 16I are cross-sectional views showing a method of manufacturing the nitride semiconductor device in order of steps.

First, as shown in FIG. 16A, on the substrate 1, the buffer layer 2, the electron transit layer 3, the electron supply layer 4 and the cap layer 5 are sequentially epitaxially grown. These may be, for example, nitride semiconductor crystal layers having a c-plane as the main surface. In the epitaxial growth of the buffer layer 2, first, the AlN buffer layer 21 is grown, then the first AlGaN layer 221 formed of AlGaN of high aluminum composition is grown and then the second AlGaN layer 222 formed of AlGaN of aluminum composition lower than it is grown. In other words, the AlGaN crystal is epitaxially grown on the substrate 1 such that the aluminum composition is relatively high in a region close to the substrate 1 and is relatively low in a region away from the substrate 1, with the result that the AlGaN buffer layer 22 is formed. The flow rate of raw gas at the time of epitaxial growth is controlled, and thus it is possible to control the composition of each layer. After the step of epitaxially growing the nitride semiconductor described above, within the same crystal growth equipment, the lower layer 91 of the passivation film 9 formed of SiN is formed over the entire surface. The passivation film 91 may be formed by another film formation method, for example, a plasm CVD method (plasma chemical vapor deposition method).

Figure 16B:
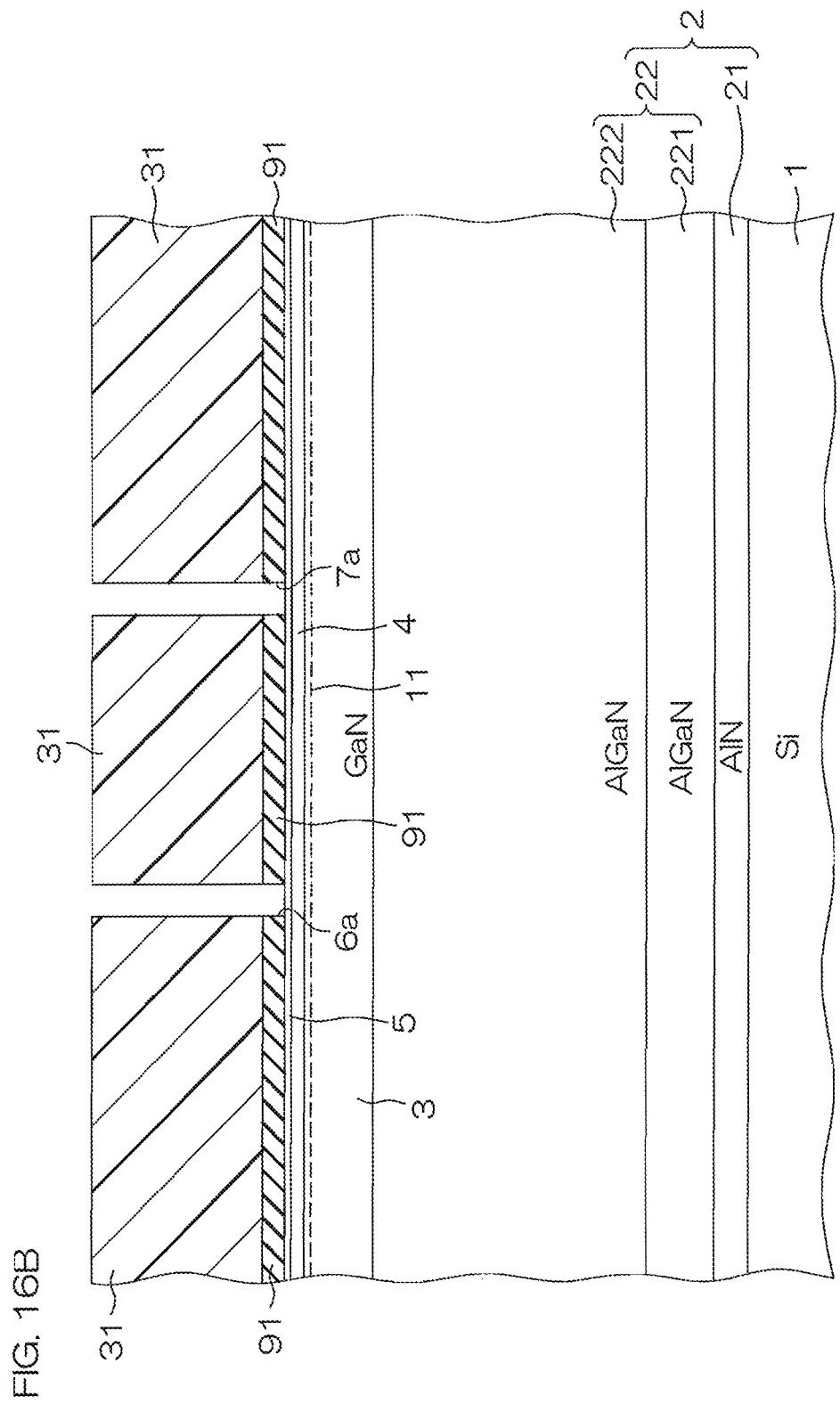
FIG. 16B is a cross-sectional view showing a step subsequent to FIG. 16A.

Next, as shown in FIG. 16B, on the lower layer 91, a resist mask 31 is formed that has an opening in a position corresponding to the contact holes 6a and 7a for the source electrode 6 and the drain electrode 7. The contact holes 6a and 7a are formed in the lower layer 91 by etching via the resist mask 31.

Figure 16C:
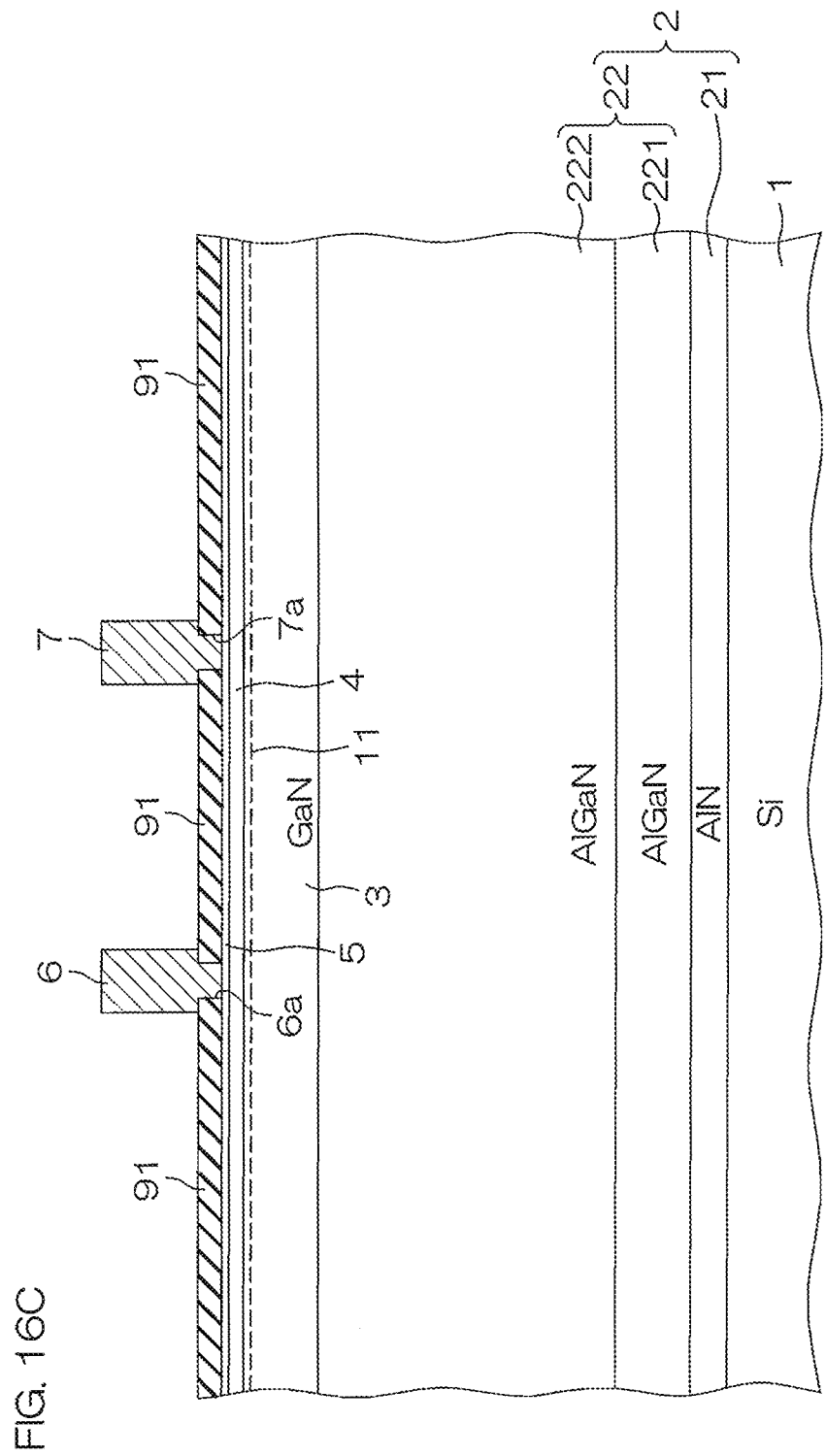
FIG. 16C is a cross-sectional view showing a step subsequent to FIG. 16B.

Then, as shown in FIG. 16C, after the removal of the resist mask 31, the source electrode 6 and the drain electrode 7 which are respectively embedded in the contact holes 6a and 7a are formed. The source electrode 6 and the drain electrode 7 are formed of a material that can be in ohmic junction to the two-dimensional electron gas 11 via the cap layer 5 and the electron supply layer 4. More specifically, a multi-layer electrode film in which a Ti layer in contact with the cap layer 5 and an Al layer formed on the Ti layer are laminated may be used. For example, a resist having an opening in a position corresponding to the source electrode 6 and the drain electrode 7 is formed, an electrode film is formed (for example, formed by a sputtering method) therefrom and an unnecessary part is lifted off together with the resist, with the result that the source electrode 6 and the drain electrode 7 of a predetermined pattern may be formed. Furthermore, thermal processing is performed, and thus the source electrode 6 and the drain electrode 7 can be brought into ohmic contact with the two-dimensional electron gas 11.

Figure 16D:
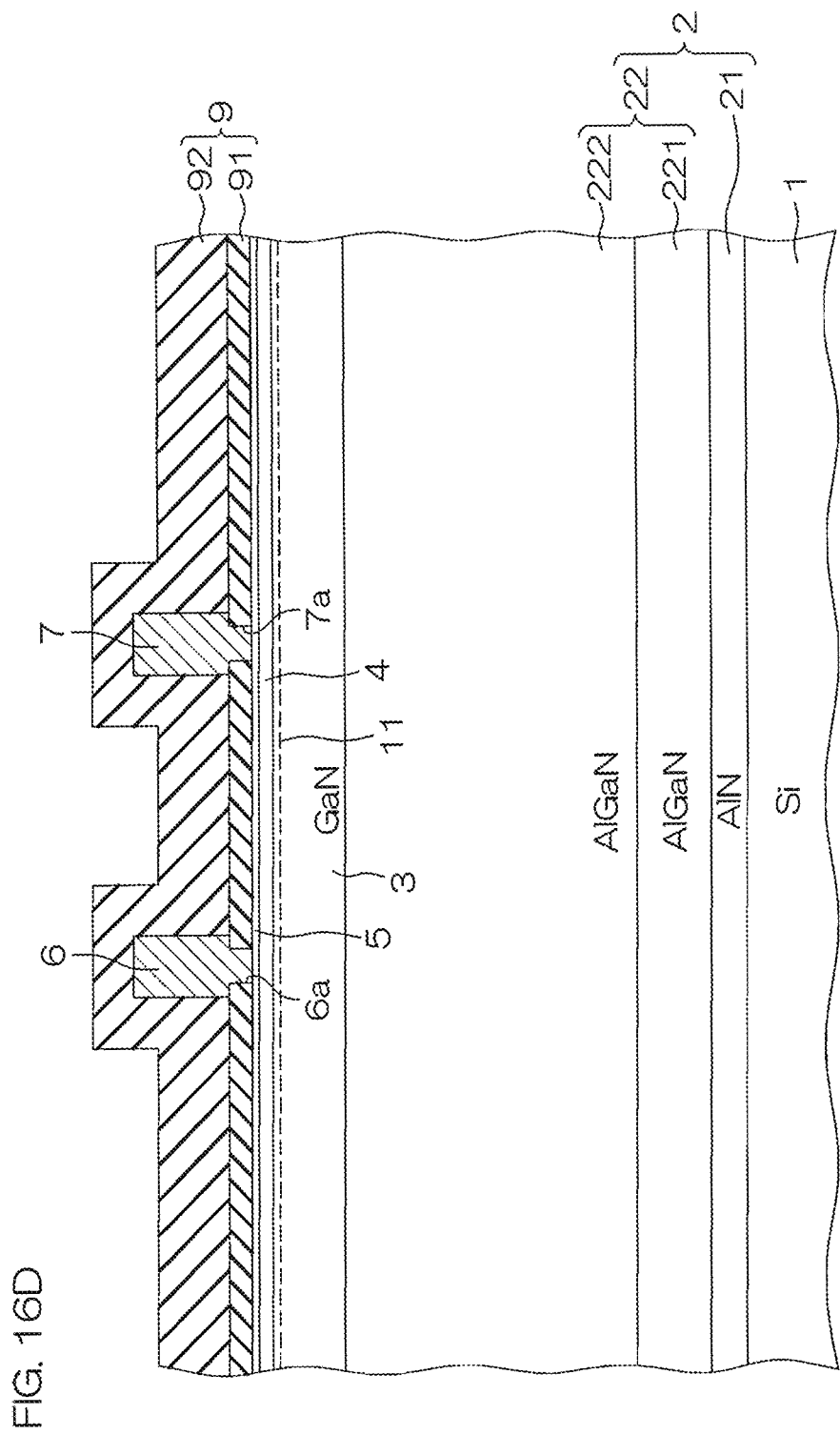
FIG. 16D is a cross-sectional view showing a step subsequent to FIG. 16C.
Figure 16E:
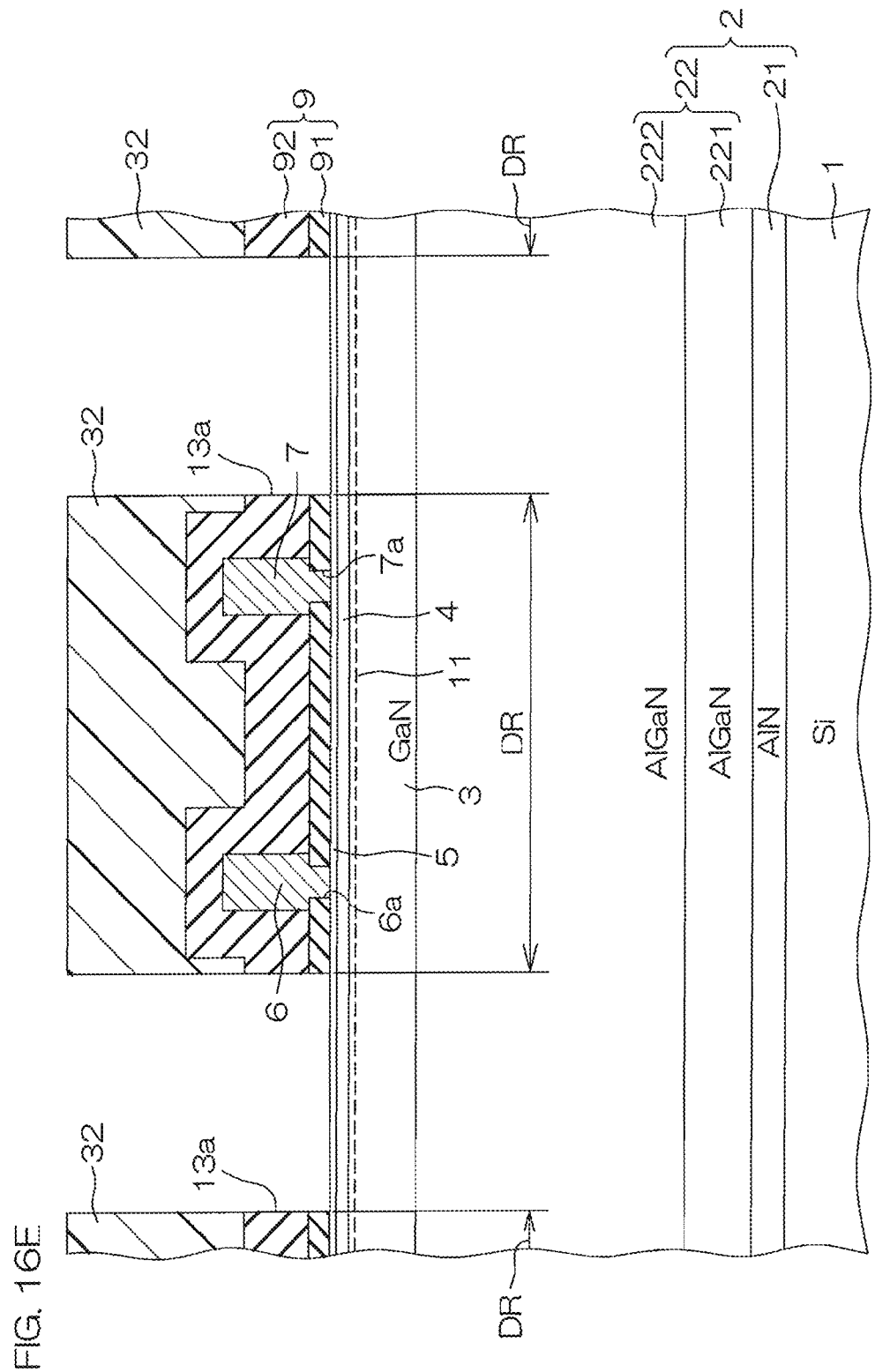
FIG. 16E is a cross-sectional view showing a step subsequent to FIG. 16D.

Next, as shown in FIG. 16D, the upper layer 92 (for example, a SiN layer) of the passivation film 9 is formed over the entire surface by the plasma CVD method. Next, as shown in FIG. 16E, a resist mask 32 of a pattern corresponding to the element regions DR is formed. In other words, the resist mask 32 is formed into a pattern having an opening in a region where the element separation layer 13 is to be formed. The resist mask 32 is used as an etching mask, and thus the passivation film 9 is etched. In this way, in the passivation film 9, the opening 13a is formed to expose the region where the element separation layer 13 is to be formed.

Furthermore, as shown in FIG. 16F, the resist mask 32 is used as a mask, and ion implantation for forming the element separation layer 13 is performed. In the ion implantation, an ion species is used in which its material is an element whose mass number is less than 10 but more than 2. As such an ion species, a helium ion can be illustrated. The helium ion can be made to deeply reach the nitride semiconductor crystal, and can cause sufficient crystal defects in the crystal structure. The passivation film 9 covers the element regions DR, prevents the ion from reaching the element regions DR and thereby protects the element regions DR.

The ion implantation is preferably performed by oblique implantation from a direction which is inclined with respect to the normal direction (that is, the direction of the thickness of the electron transit layer 3) to the major surface of the substrate 1. When the major surface of the electron transit layer 3 etc. is the c-plane, the ion implantation is performed from a direction which is inclined with respect to a c-axis direction. The inclination angle of the ion implantation direction with respect to the normal direction (the direction of the thickness of the electron transit layer 3, for example, the c-axis direction) to the major surface of the substrate 1 is preferably 5 to 10 degrees. By the ion implantation from the inclination direction described above, it is possible to efficiently make the ions collide with the constituent elements of the nitride semiconductor having a crystal structure of hexagonal crystal, and thus defects are formed in the crystal structure, with the result that it is possible to increase the resistance.

The ion implantation is performed by multistage implantation using a plurality of acceleration energy settings. In this way, the crystal structure of the nitride semiconductor layer can be broken over the wide range of depth from the cap layer 5 to the buffer layer 2, and thus it is possible to form the element separation layer 13 formed with a high resistance layer over the range of depth.

Figure 16G:
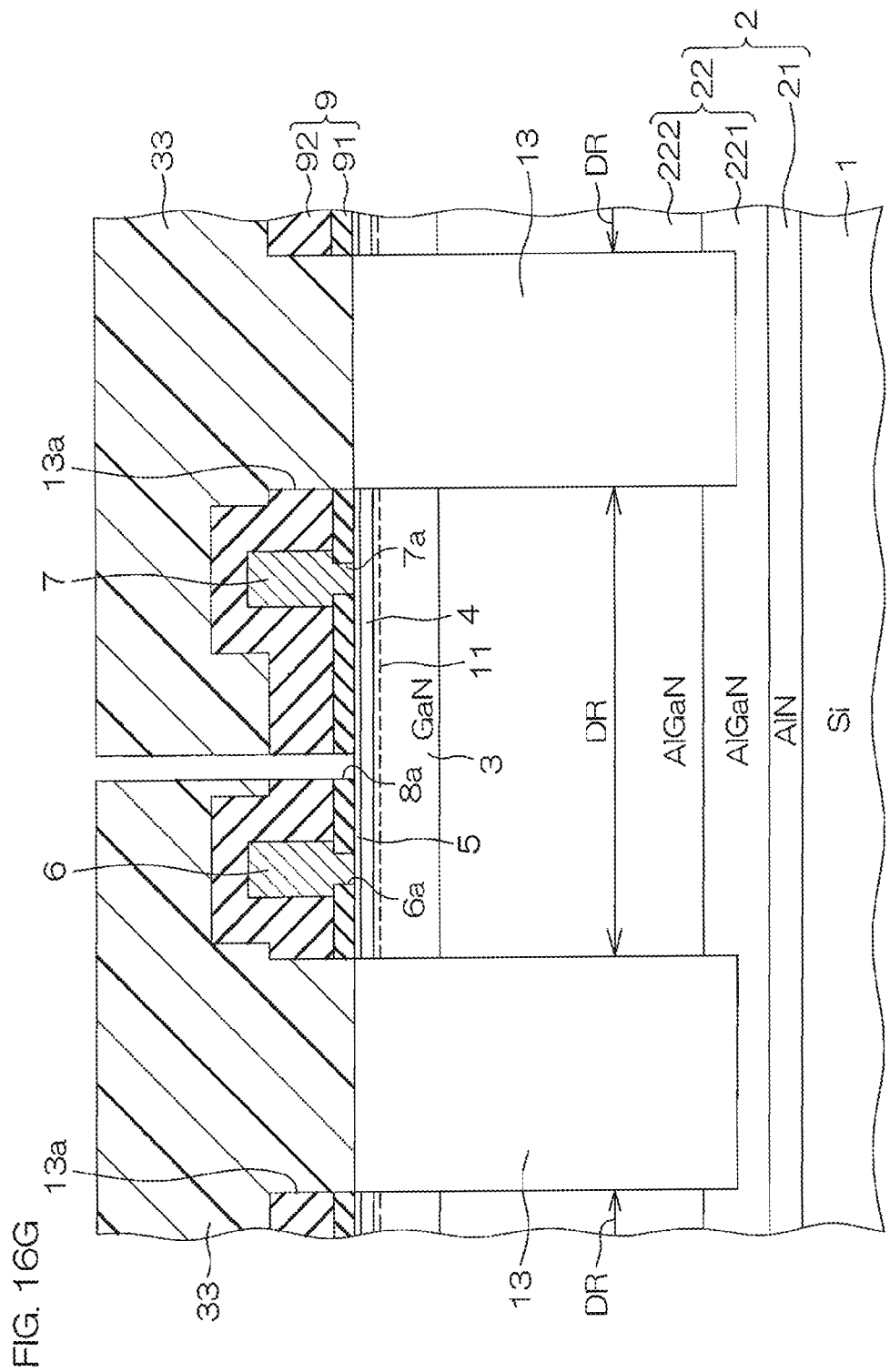
FIG. 16G is a cross-sectional view showing a step subsequent to FIG. 16F.

After the ion implantation, the resist mask 32 is separated. Next, as shown in FIG. 16G, a resist mask 33 is formed such that the resist mask 33 has an opening corresponding to the position where the gate electrode 8 is formed. By etching via the resist mask 33, the opening 8a that reaches the cap layer 5 is formed in the passivation film 9.

Figure 16H:
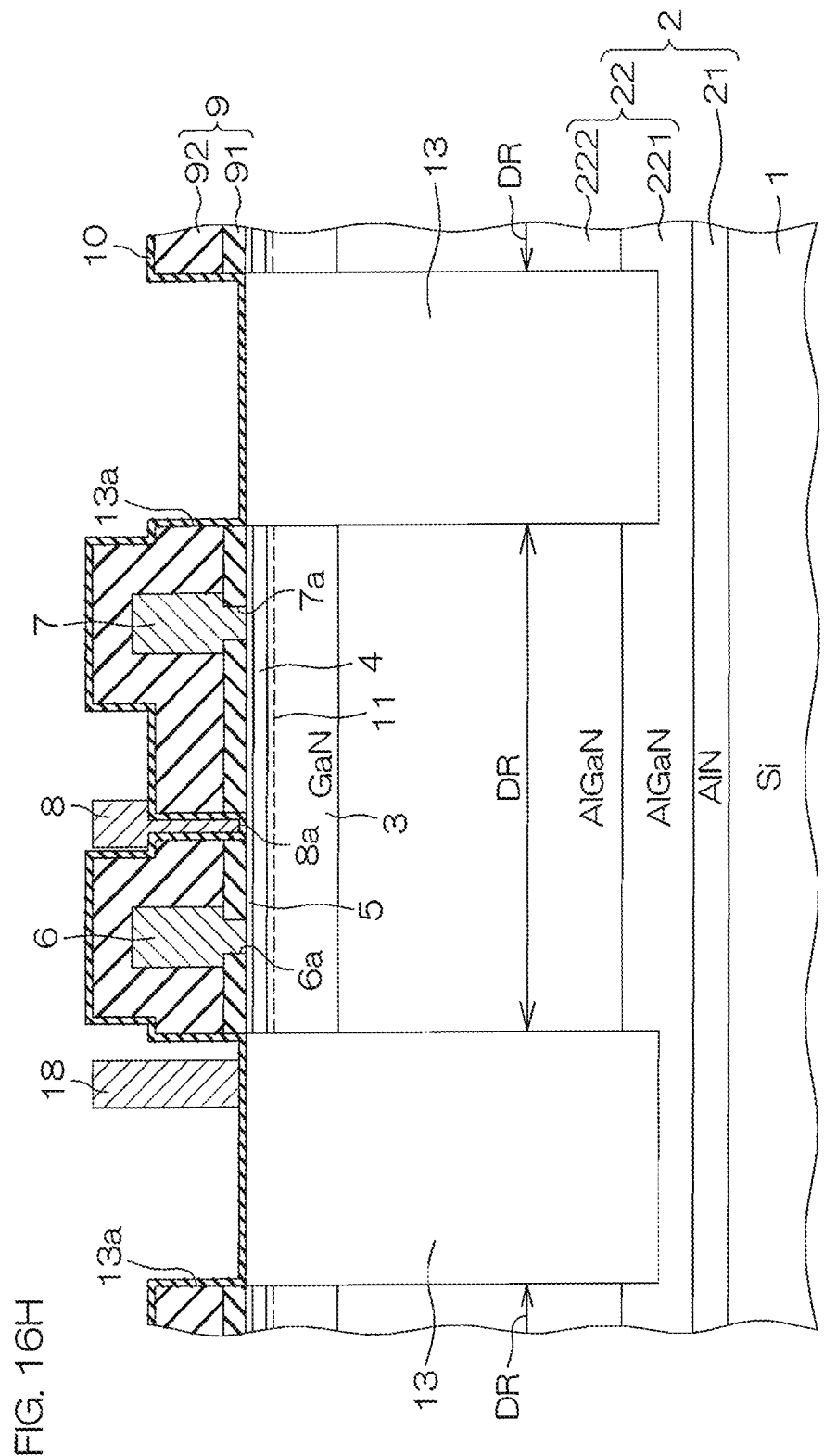
FIG. 16H is a cross-sectional view showing a step subsequent to FIG. 16G.

Thereafter, as shown in FIG. 16H, the resist mask 33 is removed, and then the gate insulating film 10 made of, for example, alumina is formed by, for example, the ALD method. Hence, the gate insulating film 10 is continuous so as to be in contact with the cap layer 5 on the bottom surface of the opening 8a and the upper surface of the element separation layer 13, to further cover the side surface of the openings 8a and 13a, and to cover the surface of the passivation film 9 outside the openings 8a and 13a. In this state, furthermore, the gate electrode 8 and the gate wiring film 18 are formed with the same electrode film. The electrode film may be a multilayer electrode film having a lower layer that is made of Ni or Pt and an upper layer that is laminated on the lower layer and that is made of Au or Al. Preferably, when the gate electrode 8 and the gate wiring film 18 are formed, for example, the formation of the resist pattern and the formation (for example, formation by the sputtering method) of the electrode film covering the upper part thereof are sequentially performed, and thereafter an unnecessary part of the electrode film is lifted off together with the resist pattern.

Figure 16I:
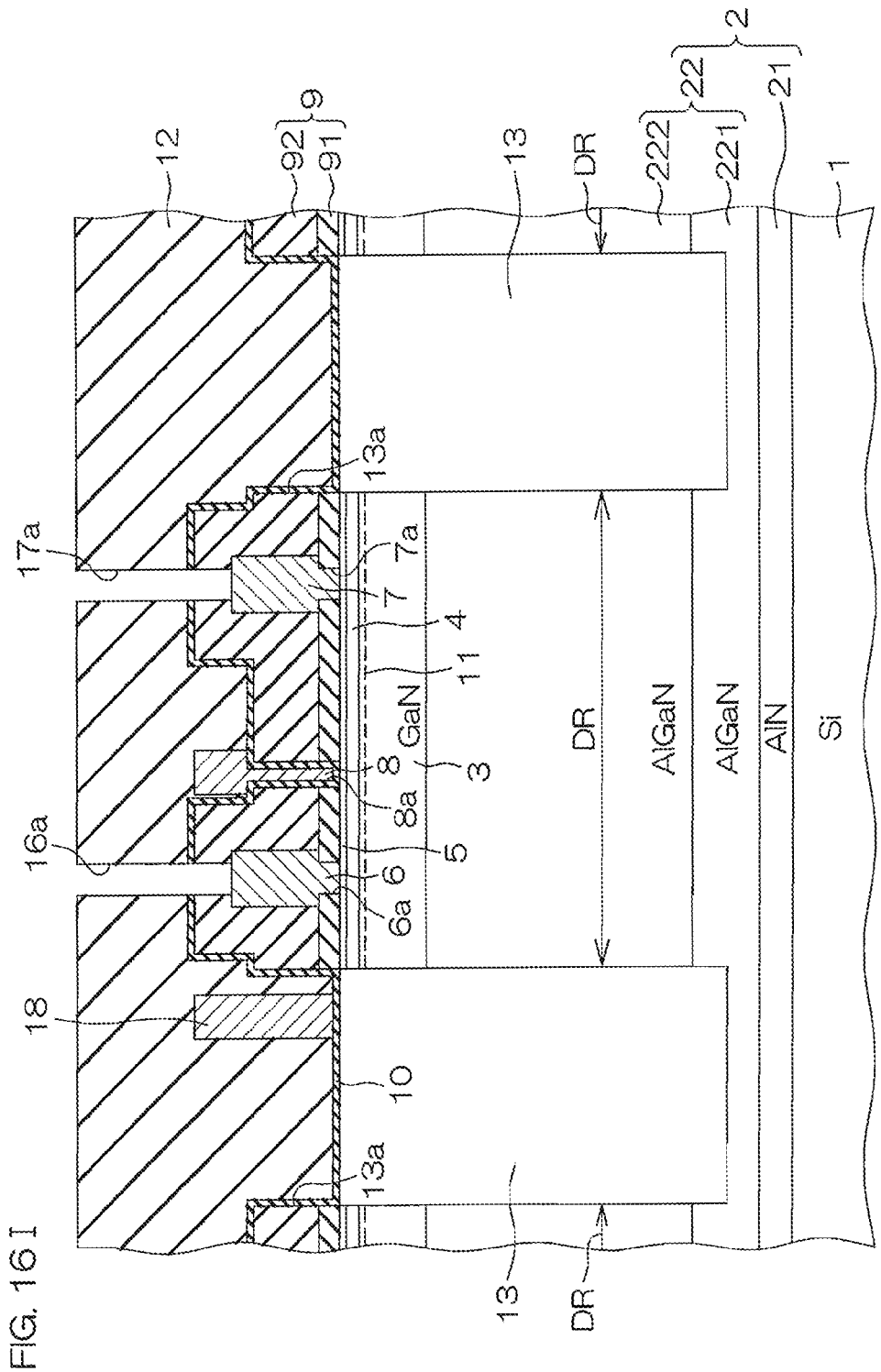
FIG. 16I is a cross-sectional view showing a step subsequent to FIG. 16H.

Next, as shown in FIG. 16I, for example, the interlayer insulating film 12 made of $SiO_2$ is formed by the plasma CVD method. Then, in the interlayer insulating film 12, in positions immediately above the source electrode 6 and the drain electrode 7, the source contact hole 16a and the drain contact hole 17a passing through the interlayer insulating film 12 and the upper layer 92 of the passivation film 9 are formed by etching.

Thereafter, the wiring film embedded in the source contact hole 16a and the drain contact hole 17a are formed, and the wiring film is patterned on the source wiring film 16 and the drain wiring film 17 by etching, and thus it is possible to obtain the nitride semiconductor device of the structure shown in FIG. 8.

Furthermore, thermal processing is performed, and thus it is possible to reduce the contact resistance between the source electrode 6 and the source wiring film 16 and the contact resistance between the drain electrode 7 and the drain wiring film 17.

Figure 17:
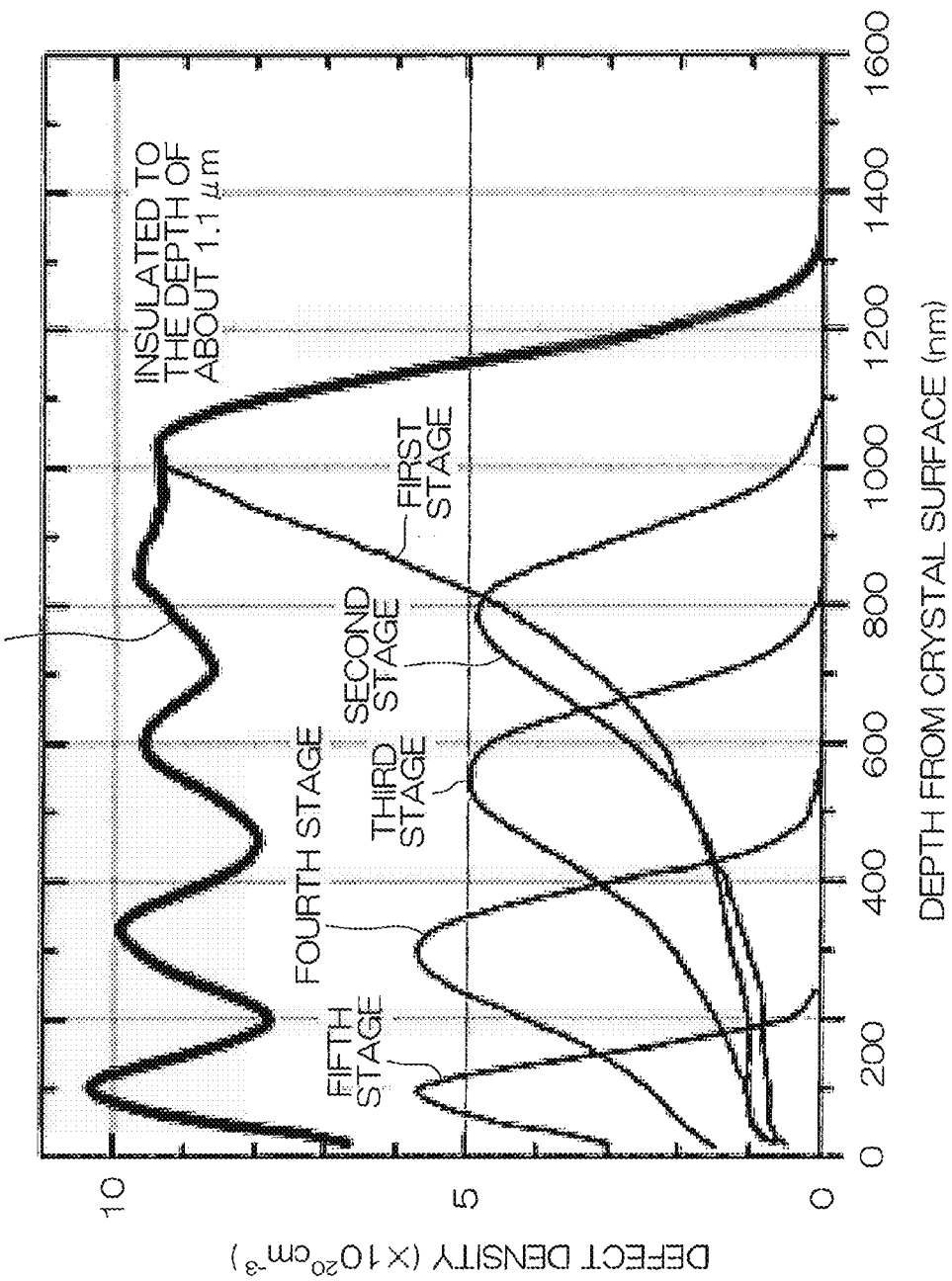
FIG. 17 is a diagram for illustrating the details of a multistage ion implantation for forming an element separation layer.

FIG. 17 is a diagram for illustrating the details of the multistage ion implantation for forming the element separation layer 13. Specifically, FIG. 17 shows the dependence of the depth of crystal defects caused by the impact of ions implanted when the ions are implanted from a direction inclined by 5 to 10 degrees with respect to the normal direction (for example, the c-axis direction) to the major surface (for example, the c-plane) for the nitride semiconductor crystal.

Helium ions are implanted into the nitride semiconductor crystal in five stages from the first to fifth stages under the conditions of table 1 below, and thus by the ion implantation in each stage, helium ions reach the depth different depending on acceleration energy. In this way, the distribution of the crystal defects, in the direction of depth, formed in the nitride semiconductor crystal shows a profile having peaks at different depths from the surface. A combination profile obtained by combining the profiles of the distributions of crystal defects caused by the ion implantation in the first to fifth stages has a crystal defect density of a predetermined value or more until a depth of about 1.1 μm. Hence, it is found that it is possible to increase the resistance until such a depth.

TABLE 1

| | Acceleration energy (keV) | Dose amount (1/cm$^2$) |
|---|---|---|
| First stage | 350 | $2.6 \times 10^{14}$ |
| Second stage | 240 | $1.3 \times 10^{14}$ |
| Third stage | 150 | $1.3 \times 10^{14}$ |
| Fourth stage | 70 | $1.3 \times 10^{14}$ |
| Fifth stage | 20 | $9.6 \times 10^{13}$ |

Since the ions are easily made to collide with the atoms of the nitride semiconductor crystal by the ion implantation from the inclined direction, it is possible to accurately control the depth of the ion implantation. In this way, since the element separation layer 13 of high resistance is reliably formed, it is possible to provide the nitride semiconductor device in which the leak current is reduced. In particular, by setting the inclination angle at 5 to 10 degrees, the depth of the ion implantation is accurately controlled, with the result that it is possible to realize the element separation layer 13 of high resistance.

Figure 18:
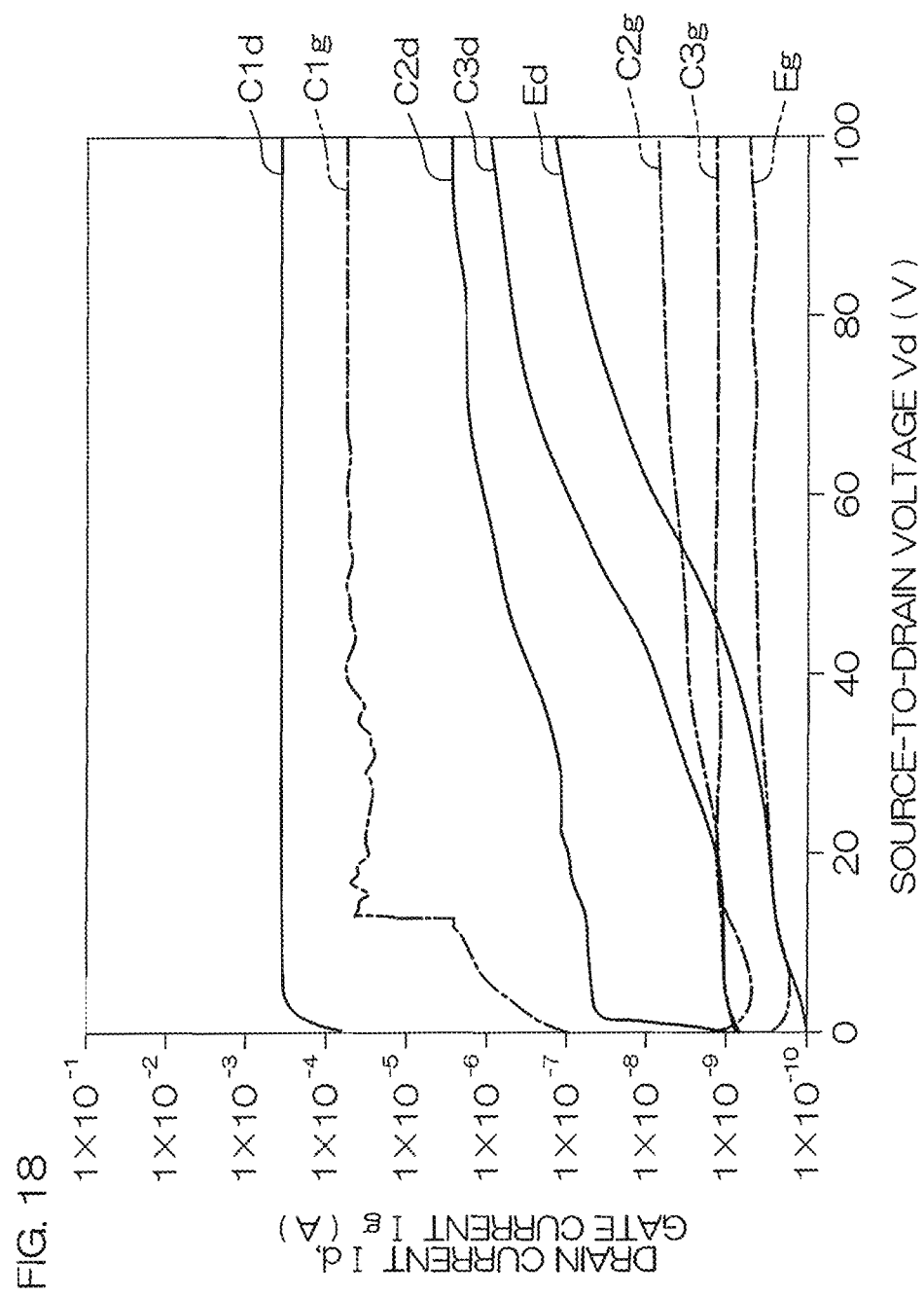
FIG. 18 is a diagram showing leak characteristics in an off-state.

FIG. 18 shows leak characteristics in an off-state. More specifically, FIG. 18 shows results obtained by measuring the drain current Id (source-to-drain current) and the gate current Ig (source-to-gate current) in a state where an off voltage is applied to the gate electrode 8 to cause an interruption between the source and the drain. The horizontal axis represents a bias between the source electrode 6 and the drain electrode 7.

Curves C1d and C1g represent the results of experiments on a structure (Comparative Example 1) in which the element separation layer 13 is omitted from the configuration of FIG. 8 and in which the second AlGaN layer 222 is omitted. Curves C2d and C2g represent the results of experiments on a structure (Comparative Example 2) in which the second AlGaN layer 222 is omitted from the configuration of FIG. 8. Curves C3d and C3g represent the results of experiments on a structure (Comparative Example 3) in which the element separation layer 13 is omitted from the configuration of FIG. 8. Furthermore, curves Ed and Eg represent the results of experiments on a structure (Inventive Example) according to the preferred embodiment shown in FIG. 8.

It is found from the comparison of Comparative Examples 1 and 2 that the provision of the element separation layer 13 makes it possible to reduce the drain leak current by about two significant digits and to reduce the gate leak current by about four significant digits. Furthermore, it is found from the comparison of Comparative Example 2 and Inventive Example and the comparison of Comparative Examples 1 and 3 that the provision of the second AlGaN layer 222 formed with the AlGaN layer of low aluminum composition between the first AlGaN layer 221 formed with the AlGaN layer of high aluminum composition and the electron transit layer 3 makes it possible to reduce the drain leak current and the gate leak current. It is found from the comparison of Comparative Example 3 and Inventive Example that the provision of the second AlGaN layer 222 formed with the AlGaN layer of low aluminum composition between the first AlGaN layer 221 formed with the AlGaN layer of high aluminum composition and the electron transit layer 3 and the structure where the element separation layer 13 is provided make it possible to minimize the drain leak current and the gate leak current.

As described above, in the configuration of this preferred embodiment, the AlGaN buffer layer 22 is formed between the substrate 1 and the electron transit layer 3, and furthermore, the element separation layer 13 passing through the electron supply layer 4 and the electron transit layer 3 reaches the AlGaN buffer layer 22. The element separation layer 13 is formed with a region whose resistance is increased by causing crystal defects in the nitride semiconductor through the ion implantation. With the element separation layer 13, it is possible to separate the elements in the direction along the direction of the main surface of the substrate 1.

The AlGaN buffer layer 22 includes the first AlGaN layer 221 of high aluminum composition and the second AlGaN layer 222 of low aluminum composition, and the second AlGaN layer 222 is arranged in a region close to the electron transit layer 3 as compared with the first AlGaN layer 221. Between the second AlGaN layer 222 of low aluminum composition and the substrate 1, the first AlGaN layer 221 of high aluminum composition intervenes, and thus variations in energy level in the direction of the thickness of the AlGaN buffer layer 22 are reduced. Hence, the thickness of the potential barrier is increased, and thus it is possible to reduce the leak caused by the quantum tunneling effect. In this way, it is possible to interrupt the leak path via the buffer layer 2.

Consequently, with the element separation layer formed to reach the buffer layer 2 by the ion implantation and the AlGaN buffer layer 22 obtained by combining the high aluminum composition region and the low aluminum composition region, it is possible to provide the nitride semiconductor device in which the leak current is reduced.

Since the element separation layer 13 is formed so as to surround the individual element regions DR, it is possible to reduce or prevent the leak inside and outside the element regions DR. Furthermore, since the element separation layer 13 totally surrounds a plurality of element regions DR connected in common with the wiring films 16, 17 and 18 forming the element-to-element wiring, while the leak in each of the element regions is being reduced, a plurality of elements formed in a plurality of element regions are coupled, with the result that it is possible to form a large element which realizes the desired function and it is possible to reduce the leak current in the large element as a whole.

In this preferred embodiment, since the space on the element separation layer 13 is utilized to route the wiring films 16, 17 and 18, the configuration is advantageous in high integration. Moreover, since the element separation layer 13 below the wiring films 16, 17 and 18 is a high resistance layer thick enough to reach the buffer layer 2, it is possible to reduce the parasitic capacitance, with the result that it is possible to perform a high-speed operation accordingly. Hence, while the leak in each of the element regions is being reduced, it is possible to provide the nitride semiconductor device capable of performing a high-speed operation.

The element separation layer 13 is a high resistance layer in which an element whose mass number is less than 10 but more than 2 is used as its material and which is formed by the ion multistage implantation through oblique implantation. Hence, even when the thickness of the electron transit layer 3 formed with the GaN layer is increased to enhance the electron mobility, and the thickness of the AlGaN buffer layer 22 is increased to reduce the leak current, it is possible to form the element separation layer 13 having a high resistance in a position which is deep to reach the buffer layer 2. Since the ion species using, as the material, the element whose mass number is sufficient to produce sufficient crystal defects for the crystal structure of the nitride semiconductor is used, for example, when the thermal processing that brings the source electrode 6 and the drain electrode 7 into ohmic contact with the nitride semiconductor layer is performed, the crystal defects are prevented from being cured. Hence, since the element separation layer 13 has a sufficiently high resistance value in any depth position, it is possible to effectively reduce the leak current.

Variations of this preferred embodiment are possible as follows.

For example, although in the preferred embodiment described above, on the first AlGaN layer 221 of high aluminum composition, the second AlGaN layer 222 of low aluminum composition is deposited, a third AlGaN layer of aluminum composition further lower than that of the second AlGaN layer 222 may be made to intervene between the second AlGaN layer 222 and the electron transit layer 3. In other words, between the AlN buffer layer 21 and the electron transit layer 3, two or more AlGaN layers may be made to intervene, and its aluminum composition may be monotonically lowered from the AlN buffer layer 21 toward the electron transit layer 3. Furthermore, between the AlN buffer layer 21 and the electron transit layer 3, an $Al_xGa_{1-x}N$ layer ($0<x\leq1$) in which the aluminum composition x is continuously and monotonically reduced toward the electron transit layer 3 may be made to intervene.

The AlN buffer layer 21 may be omitted. However, in such a case, the Ga composition of the AlGaN layer in the interface with the substrate 1 is preferably zero.

Although in the preferred embodiment described above, the cap layer 5 is provided on the surface of the electron supply layer 4, the cap layer 5 may be omitted.

In the preferred embodiment described above, the elements having the common function are formed in a plurality of element regions DR, and they are connected with the element-to-element wiring (the wiring films 16, 17 and 18), with the result that the large element is formed. However, elements having different functions are formed in a plurality of element regions, and they are connected with the element-to-element wiring, with the result that the large element may be formed. Furthermore, a plurality of elements that are formed in the element regions according to the necessary function may include a first element, a second element having the common function to the first element and a third element having a different function from the first element. In this way, by combining the element of the common function and the element of the different function, it is possible to form a large element having a desired function.

Furthermore, the features of the first preferred embodiment (FIGS. 1 to 7) may be incorporated into the second preferred embodiment.

Although the preferred embodiments of the present invention have been described in detail, these are simply specific examples used for clarifying the technical details of the present invention, the present invention should not be interpreted to be limited to these specific examples and the scope of the present invention is limited only by the scope of claims attached.

This application corresponds to Japanese Patent Application No. 2012-226256 and Japanese Patent Application No. 2012-272725 respectively filed in Japan Patent Office on Oct. 11, 2012 and Dec. 13, 2012, all disclosures of which are incorporated herein by reference.

DESCRIPTION OF THE SYMBOLS

102 Buffer layer
103 Electron transit layer
104 Electron supply layer
105 Passivation film
106 Source electrode
107 Drain electrode
108 Gate electrode
109 Recess
109a Bottom portion
109b Side wall portion
110 Gate insulating film
111 Thermal oxide film
111a Bottom portion covering portion
111b Side wall covering portion
115 Two-dimensional electron gas
DR Element region
1 Substrate
2 Buffer layer
3 Electron transit layer
4 Electron supply layer
5 Cap layer
6 Source electrode
7 Drain electrode
8 Gate electrode
9 Passivation film
10 Gate insulating film
11 Two-dimensional electron gas
12 Interlayer insulating film
13 Element separation layer
16 Source wiring film
17 Drain wiring film
18 Gate wiring film
21 AlN buffer layer
22 AlGaN buffer layer
221 First AlGaN layer (high aluminum composition)
222 Second AlGaN layer (low aluminum composition)

What is claimed is:

1. A nitride semiconductor device, comprising:
an electron transit layer that is formed of a nitride semiconductor;
an electron supply layer that is formed on the electron transit layer, that is formed of a nitride semiconductor whose composition is different from the electron transit layer, and that has a recess which reaches the electron transit layer from a surface;
a thermal oxide film that is formed by selectively oxidizing a surface of the electron transit layer exposed within the recess;
a gate insulating film that is embedded within the recess so as to be in contact with the thermal oxide film;
a gate electrode that is formed on the gate insulating film, and that is opposite to the electron transit layer across the thermal oxide film and the gate insulating film;
a source electrode and a drain electrode that are provided on the electron supply layer at an interval such that the gate electrode intervenes therebetween; and
a passivation film formed on a surface of the electron supply layer outside the recess, the passivation film having a thickness that is smaller than a thickness of the electron supply layer, the recess penetrating the passivation layer.

2. The nitride semiconductor device according to claim 1, wherein the thermal oxide film contains Ga and O.

3. The nitride semiconductor device according to claim 1, wherein the thermal oxide film has an oxygen concentration in the film with a gradient with respect to a direction of thickness of the film.

4. The nitride semiconductor device according to claim 1, wherein an oxygen concentration in the thermal oxide film is maximum in an interface with the gate insulating film, and is decreased toward the electron transit layer.

5. The nitride semiconductor device according to claim 1, wherein the maximum oxygen concentration in the thermal oxide film is $10^{20}$ cm$^{-3}$ or less.

6. The nitride semiconductor device according to claim 1, wherein a film thickness of the thermal oxide film is less than a film thickness of the gate insulating film.

7. The nitride semiconductor device according to claim 1, wherein a film thickness of the gate insulating film is approximately twice as much as a film thickness of the thermal oxide film.

8. The nitride semiconductor device according to claim 1, wherein a film thickness of the thermal oxide film is 1 to 100 nm.

9. The nitride semiconductor device according to claim 1, wherein the thermal oxide film includes a first part that is formed on the surface of the electron transit layer exposed within the recess and a second part formed on a surface of the electron supply layer exposed within the recess, and the first part is different from the second part in film thickness.

10. The nitride semiconductor device according to claim 1, wherein a concentration of each of B, Cl and Si in a surface of the gate insulating film on an opposite side to the gate electrode is $10^{20}$ cm$^{-3}$ or less.

11. The nitride semiconductor device according to claim 1,
wherein a relative permittivity of the gate insulating film is higher than a relative permittivity of the electron supply layer.

12. The nitride semiconductor device according to claim 1,
wherein the gate insulating film is an insulating film that is formed by an ALD method.

13. The nitride semiconductor device according to claim 1,
wherein the gate insulating film is formed of $Al_2O_3$.

14. The nitride semiconductor device according to claim 1,
wherein at a lowermost part of the recess, approximately half of a film thickness of the gate insulating film is located on a side of the electron transit layer with respect to an interface between the electron transit layer and the electron supply layer.

15. The nitride semiconductor device according to claim 1,
wherein a film thickness of the gate insulating film is 5 to 50 nm.

16. The nitride semiconductor device according to claim 1,
wherein the film thickness of the electron transit layer is 50 to 2000 nm.

17. The nitride semiconductor device according to claim 1,
wherein the electron transit layer is formed of GaN, and the electron supply layer is formed of AlGaN.

18. The nitride semiconductor device according to claim 1, further comprising:
a substrate;
an AlGaN buffer layer that intervenes between the substrate and the electron transit layer, and that includes a high aluminum composition region whose aluminum composition is relatively high and a low aluminum composition region whose aluminum composition is lower than the high aluminum composition region and which is arranged in a region close to the electron transit layer as compared with the high aluminum composition region; and
an element separation layer that is formed with a region whose resistance is increased by causing a crystal defect through ion implantation, and that passes through the electron supply layer and the electron transit layer to reach the AlGaN buffer layer.

19. The nitride semiconductor device according to claim 18,
wherein the AlGaN buffer layer is an AlGaN layer whose aluminum composition is adjusted such that as the AlGaN buffer layer approaches the electron transit layer in a direction of a layer thickness from the substrate toward the electron transit layer, the aluminum composition is decreased.

20. The nitride semiconductor device according to claim 18,
wherein the AlGaN buffer layer includes a first aluminum composition AlGaN layer that has a first aluminum composition and a second aluminum composition AlGaN layer that is deposited on a side of the electron transit layer with respect to the first aluminum composition AlGaN layer and that has a second aluminum composition lower than the first aluminum composition, and the high aluminum composition region includes the first aluminum composition AlGaN layer, and the low aluminum composition region includes the second aluminum composition AlGaN layer.

21. The nitride semiconductor device according to claim 18, further comprising:
an AlN buffer layer that intervenes between the AlGaN buffer layer and the substrate.

22. The nitride semiconductor device according to claim 18,
wherein the element separation layer is formed so as to surround an element region.

23. The nitride semiconductor device according to claim 18, further comprising:
a wiring that is arranged on the element separation layer.

24. The nitride semiconductor device according to claim 18,
wherein the element separation layer is formed so as to separate a plurality of element regions, and
the nitride semiconductor device further comprises an element-to-element wiring that connects between a plurality of elements respectively formed in the element regions.

25. The nitride semiconductor device according to claim 24,
wherein the elements respectively formed in the element regions include two or more elements having different functions.

26. The nitride semiconductor device according to claim 24,
wherein the elements respectively formed in the element regions include two or more elements having a common function.

27. The nitride semiconductor device according to claim 24,
wherein the element separation layer is formed so as to surround the element regions of the elements connected with the element-to-element wiring.

28. The nitride semiconductor device according to claim 18,
wherein the element separation layer is a high resistance layer that is formed by ion implantation using, as a material, an element whose mass number is less than 10 but more than 2.

29. The nitride semiconductor device according to claim 18,
wherein the element separation layer is a high resistance layer that is formed by implantation of a helium ion.

30. The nitride semiconductor device according to claim 18,
wherein the element separation layer is a high resistance layer that is formed by ion implantation using a plurality of acceleration energies.

31. The nitride semiconductor device according to claim 18,
wherein the element separation layer is a high resistance layer that is formed by ion implantation from a direction inclined with respect to a direction of thickness of the electron transit layer.

32. The nitride semiconductor device according to claim 31,
wherein an inclination angle of the ion implantation direction with respect to the direction of the thickness of the electron transit layer is 5 to 10 degrees.

33. The nitride semiconductor device according to claim 18, wherein the electron transit layer is formed of GaN, and the electron supply layer is formed of AlGaN.

34. The nitride semiconductor device according to claim 18, wherein the electron transit layer is a GaN layer having a thickness of 400 nm or more.

35. The nitride semiconductor device according to claim 18, wherein the gate electrode is formed so as to surround the source electrode together with the element separation layer.

36. The nitride semiconductor device according to claim 18, further comprising:
an interlayer insulating film that covers the source electrode, the drain electrode and the gate electrode;
a source wiring film that is connected to the source electrode via a source contact hole passing through the interlayer insulating film and that is arranged on the interlayer insulating film; and
a drain wiring film that is connected to the drain electrode via a drain contact hole passing through the interlayer insulating film and that is arranged on the interlayer insulating film,
wherein the source wiring film and the drain wiring film are formed in such a pattern that on the interlayer insulating film, the source wiring film and the drain wiring film mesh with each other in a comb tooth shape.

37. The nitride semiconductor device according to claim 18, which is the nitride semiconductor device further comprising a wiring that is arranged on the element separation layer,
wherein the wiring includes a gate wiring connected to the gate electrode.

38. The nitride semiconductor device according to claim 1, wherein the thermal oxide film has a portion that is formed on a surface of the electron transit layer exposed within the recess, and that is in contact with a lower surface of the passivation film, and
the gate insulating film extends over an upper surface of the passivation film outside the recess.

39. A nitride semiconductor device comprising:
an electron transit layer that is formed of a nitride semiconductor;
an electron supply layer that is formed on the electron transit layer, that is formed of a nitride semiconductor whose composition is different from the electron transit layer, and that has a recess which reaches the electron transit layer from a surface;
a thermal oxide film that is formed by selectively oxidizing a surface of the electron transit layer exposed within the recess;
a gate insulating film that is embedded within the recess so as to be in contact with the thermal oxide film;
a gate electrode that is formed on the gate insulating film, and that is opposite to the electron transit layer across the thermal oxide film and the gate insulating film;
a source electrode and a drain electrode that are provided on the electron supply layer at an interval such that the gate electrode intervenes therebetween; and
a passivation film formed on a surface of the electron supply layer outside the recess, the recess penetrating the passivation layer,
wherein the thermal oxide film has a portion that is formed on a surface of the electron transit layer exposed within the recess, and that is in contact with a lower surface of the passivation film, and
the gate insulating film extends over an upper surface of the passivation film outside the recess.

* * * * *